(12) United States Patent
Yang et al.

(10) Patent No.: US 12,218,134 B2
(45) Date of Patent: Feb. 4, 2025

(54) SEMICONDUCTOR DEVICE AND METHOD

(71) Applicant: Taiwan Semiconductor Manufacturing Co., Ltd., Hsinchu (TW)

(72) Inventors: Sung-Hsin Yang, Hsinchu (TW); Jung-Chi Jeng, Tainan (TW); Ru-Shang Hsiao, Jhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 514 days.

(21) Appl. No.: 17/230,117

(22) Filed: Apr. 14, 2021

(65) Prior Publication Data
US 2022/0238521 A1 Jul. 28, 2022

Related U.S. Application Data

(60) Provisional application No. 63/140,280, filed on Jan. 22, 2021.

(51) Int. Cl.
*H01L 27/092* (2006.01)
*H01L 21/8234* (2006.01)
*H01L 29/78* (2006.01)

(52) U.S. Cl.
CPC .. *H01L 27/0924* (2013.01); *H01L 21/823431* (2013.01); *H01L 21/823481* (2013.01); *H01L 29/7816* (2013.01); *H01L 29/7851* (2013.01)

(58) Field of Classification Search
CPC ......... H01L 27/0924; H01L 21/823431; H01L 21/823481; H01L 29/7816; H01L 29/7851; H01L 21/823807; H01L 21/823814; H01L 21/823821; H01L 29/165; H01L 29/7848; H01L 29/66545; H01L 21/823828; H01L 21/823871; H01L 21/823878; H01L 21/76224–76237; H01L 29/66795; H01L 29/785–7851; H01L 29/66681; H01L 29/66696; H01L 29/66689; H01L 29/7835; H01L 29/0649–0653; H01L 27/0886; H01L 27/1211

See application file for complete search history.

(56) References Cited

U.S. PATENT DOCUMENTS

| | | | |
|---|---|---|---|
| 9,882,002 B2 | 1/2018 | Tseng et al. | |
| 10,049,942 B2 | 8/2018 | Chou et al. | |
| 11,152,506 B1 * | 10/2021 | Chuang | H01L 29/66681 |
| 2005/0269629 A1 | 12/2005 | Lee et al. | |

(Continued)

FOREIGN PATENT DOCUMENTS

TW 201719728 A 6/2017

*Primary Examiner* — Su C Kim
(74) *Attorney, Agent, or Firm* — Slater Matsil, LLP

(57) ABSTRACT

In an embodiment, a device includes: an isolation region on a substrate; a fin structure protruding from between adjacent portions of the isolation region, the fin structure including a plurality of fins and a mesa, a channel region of the fin structure having a first portion in the fins and having a second portion in the mesa, the fins and the mesa being a continuous semiconductor material, the mesa having a greater width than the fins; and a first gate structure on the fin structure, the first gate structure extending along the first portion of the channel region in the fins and extending along the second portion of the channel region in the mesa.

20 Claims, 53 Drawing Sheets

(56) References Cited

U.S. PATENT DOCUMENTS

| | | | |
|---|---|---|---|
| 2012/0146157 A1 | 6/2012 | Baumgartner et al. | |
| 2013/0062692 A1* | 3/2013 | Chen | H01L 29/0653 257/E29.256 |
| 2013/0134506 A1* | 5/2013 | Yagishita | H01L 29/66545 438/270 |
| 2014/0327074 A1 | 11/2014 | Tsao | |
| 2015/0035053 A1* | 2/2015 | Singh | H01L 29/7835 438/282 |
| 2015/0357462 A1* | 12/2015 | Ponoth | H01L 29/66795 257/329 |
| 2016/0141413 A1* | 5/2016 | Noh | H01L 29/408 257/337 |
| 2017/0092756 A1* | 3/2017 | Lai | H01L 21/845 |
| 2020/0006336 A1* | 1/2020 | Lung | H01L 29/24 |
| 2021/0202321 A1* | 7/2021 | Yang | H01L 21/823431 |
| 2022/0173101 A1* | 6/2022 | Chuang | H01L 29/785 |

* cited by examiner

SEMICONDUCTOR DEVICE AND METHOD

PRIORITY CLAIM AND CROSS-REFERENCE

This application claims the benefit of U.S. Provisional Application No. 63/140,280, filed on Jan. 22, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
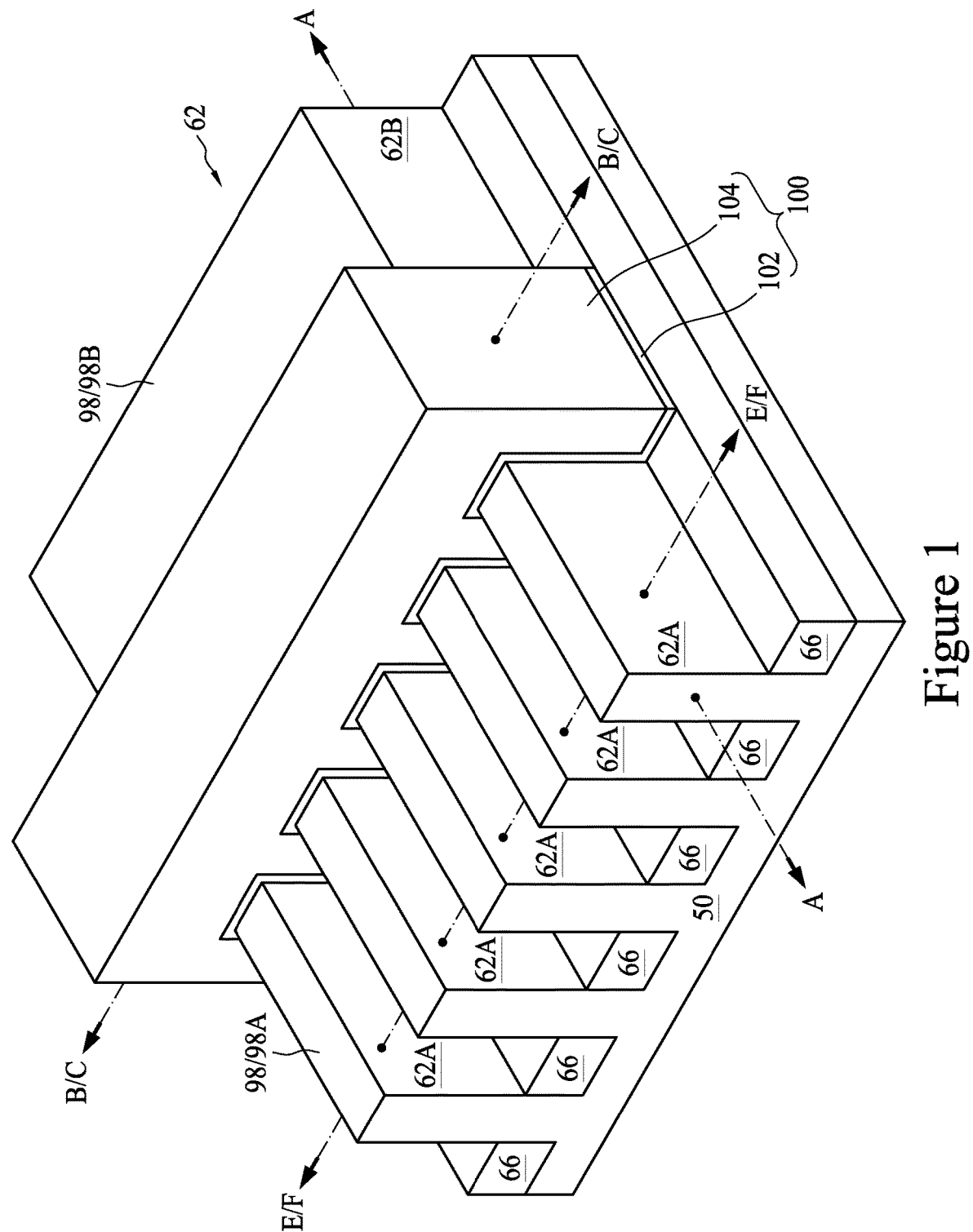
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, FinFETs are formed from fin structures that include large fins (sometimes referred to as "mesas") and small fins. The channel regions of the FinFETs have portions in the large fins and the small fins, such that the gate structures of the FinFETs extend over both a large fin and multiple small fins. Source regions are formed in the small fins and drain regions are formed in the large fins. The drain regions of the FinFETs may thus be formed to a larger size, allowing the FinFETs to accommodate more hot carrier injection (HCI) in the drain regions. The on/off current (e.g., $I_{ON}/I_{OFF}$) of the FinFETs may thus be improved. The FinFETs may thus be more suitable for high-power applications, such as appliances, vehicles, and the like.

FIG. 1 illustrates an example of FinFETs in a three-dimensional view, in accordance with some embodiments. Some features of the FinFETs (discussed below) are omitted for illustration clarity. The FinFETs may be electrically connected in a manner to operate as one transistor or multiple transistors. The FinFETs include fin structures 62 extending from a substrate 50. The fin structures 62 include channel regions for the FinFETs. Isolation regions 66, such as shallow trench isolation (STI) regions, are disposed over the substrate 50 and between adjacent fin structures 62, which protrude above and from between adjacent isolation regions 66. Although the isolation regions 66 are described/illustrated as being separate from the substrate 50, as used herein the term "substrate" may be used to refer to the substrate 50 alone or a combination of the substrate 50 and the isolation regions 66. Additionally, although bottom portions of the fin structures 62 are illustrated as being single, continuous materials with the substrate 50, the bottom portions of the fin structures 62 and/or the substrate 50 may include a single material or multiple materials. In this context, the fin structures 62 refer to the portions extending between the adjacent isolation regions 66.

Gate structures 100 are along sidewalls and over top surfaces of the fin structures 62. The gate structures 100 include gate dielectrics 112 on the sidewalls and the top surfaces of the fin structures 62, and gate electrodes 114 on the gate dielectrics 112. Source/drain regions 98 are disposed in opposite sides of the fin structures 62 with respect to the gate dielectrics 112 and the gate electrodes 114. In embodiments where multiple transistors are formed, the source/drain regions 98 may be shared between various transistors. In embodiments where one transistor is formed from multiple fin structures 62, adjacent source/drain regions 98 may be electrically connected, such as through merging the source/drain regions 98 by epitaxial growth, or through coupling the source/drain regions 98 with a same source/drain contact.

As will be subsequently described in greater detail, the fin structures 62 include fins 62A and fins 62B. The fins 62A have a lesser width than the fins 62B. The fins 62B may be referred to as "mesas." Some of the FinFETs are formed from multiple fins 62A and a fin 62B, with the fins 62A being joined to the fin 62B, and those FinFETs have a gate structure 100 that extends along the portion of that fin structure 62 where the fins 62A are joined to the fin 62B. Those FinFETs include a gate structure 100, source/drain regions 98A in the fins 62A (which may be coupled to function as a source region), and a source/drain region 98B in the fin 62B (which may be coupled to function as a drain region).

FIG. 1 further illustrates several reference cross-sections. Cross-section B/C-B/C is along a longitudinal axis of a gate electrode 114 and in a direction, for example, perpendicular to the direction of current flow between the source/drain regions 98 of the FinFETs. Cross-section D-D is perpendicular to cross-section B/C-B/C and is along a longitudinal axis of a fin structure 62 and in a direction of, for example, a current flow between the source/drain regions 98 of the FinFETs. Cross-section E/F-E/F is parallel to cross-section B/C-B/C and extends through the source/drain regions 98 of the FinFETs. Subsequent figures refer to these reference cross-sections for clarity.

Some embodiments described herein are described in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2A-15D are views of intermediate stages in the manufacturing of FinFETs, in accordance with some embodiments. FIGS. 2A, 3A, 4A, 5A, 6A, 7A, 8A, 9A, 10A, 11A, 12A, 13A, 14A, and 15A are top-down views. FIGS. 2B, 3B, 4B, 5B, 6B, 7B, 8B, 9B, 10B, 11B, 12B, 13B, 14B, and 15B are cross-sectional views illustrated along reference cross-section B-B in the corresponding "A" figure, which is similar to reference cross-section B/C-B/C in FIG. 1. FIGS. 2C, 3C, 4C, 5C, 6C, 7C, 8C, 9C, 10C, 11C, 12C, 13C, 14C, and 15C are cross-sectional views illustrated along reference cross-section C-C in the corresponding "A" figure, which is similar to reference cross-section B/C-B/C in FIG. 1. FIGS. 8D, 9D, 9G, 9H, 10D, 11D, 12D, 13D, 14D, and 15D are cross-sectional views illustrated along reference cross-section D-D in the corresponding "A" figure, which is similar to reference cross-section D-D in FIG. 1. FIGS. 9E and 9F are illustrated along reference cross-section E/F-E/F in FIG. 1.

The FinFETs can be several types of devices. FIGS. 2A-15D illustrate an embodiment where the FinFETs are devices for low-power applications, such as complementary metal-oxide-semiconductor (CMOS) devices, in which each FinFET has a single gate structure. In another embodiment (subsequently described in greater detail), the FinFETs are devices for high-power applications, such as double-diffused metal-oxide semiconductor (DMOS) devices or laterally-diffused metal-oxide semiconductor (LDMOS) devices, in which each FinFET can have multiple gate structures.

Figure 2A:
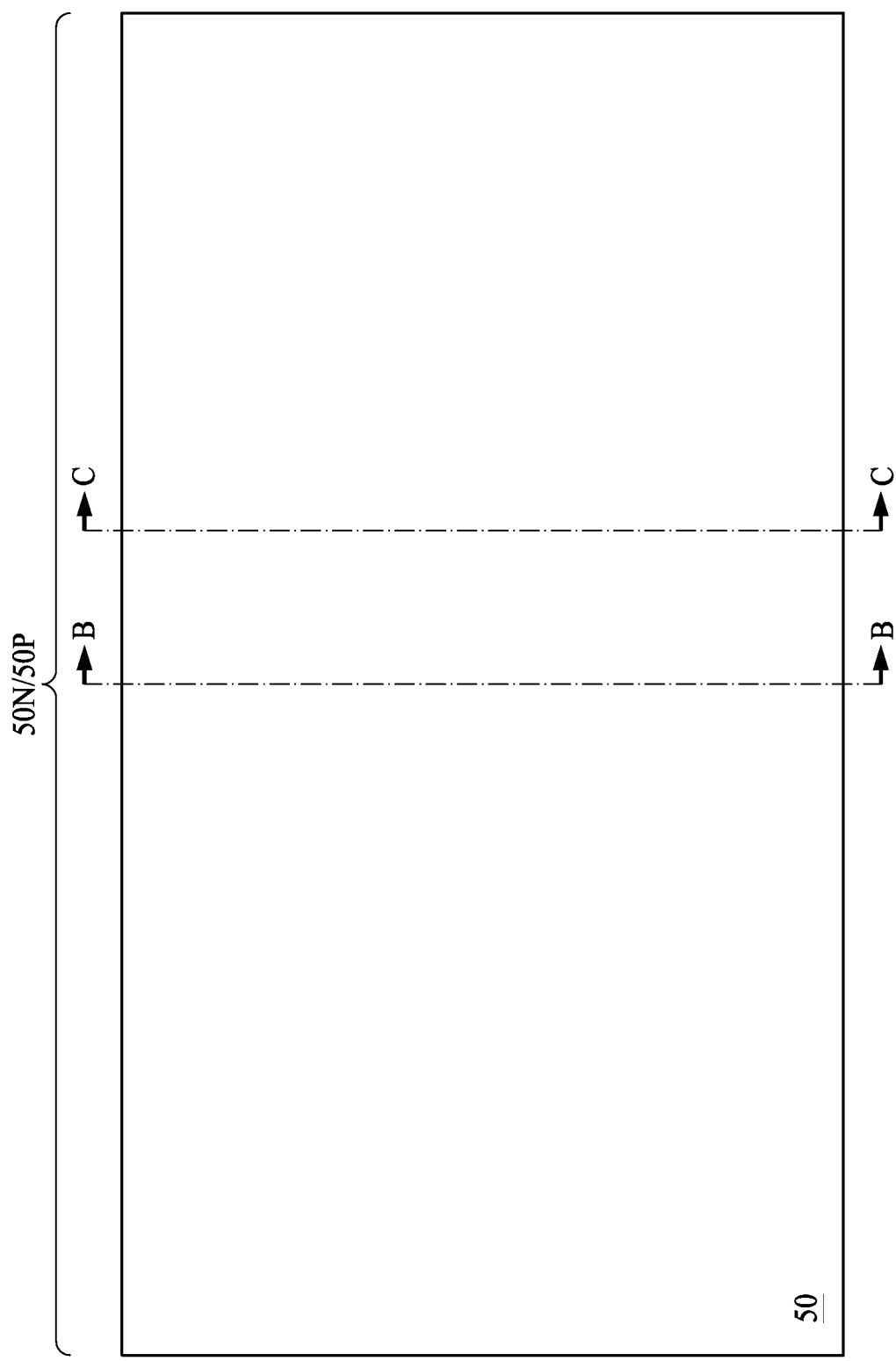
FIGS. 2A-15D are views of intermediate stages in the manufacturing of FinFETs, in accordance with some embodiments.
Figure 2C:
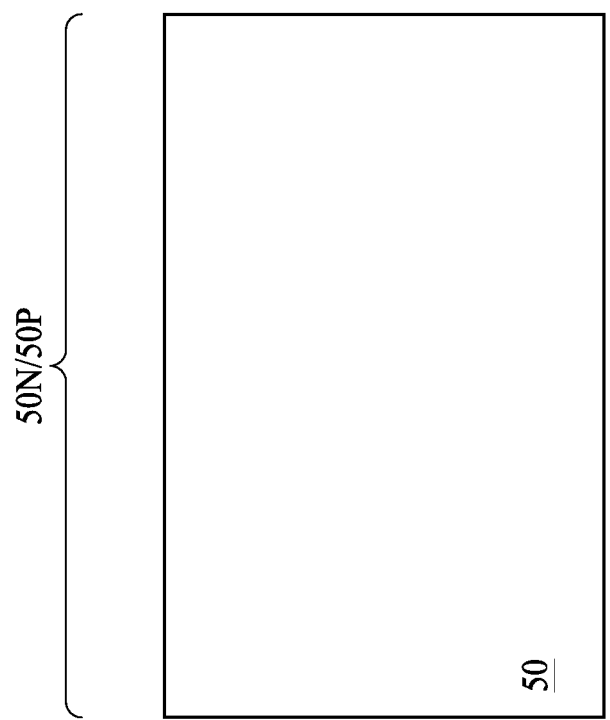
Figure 2B:
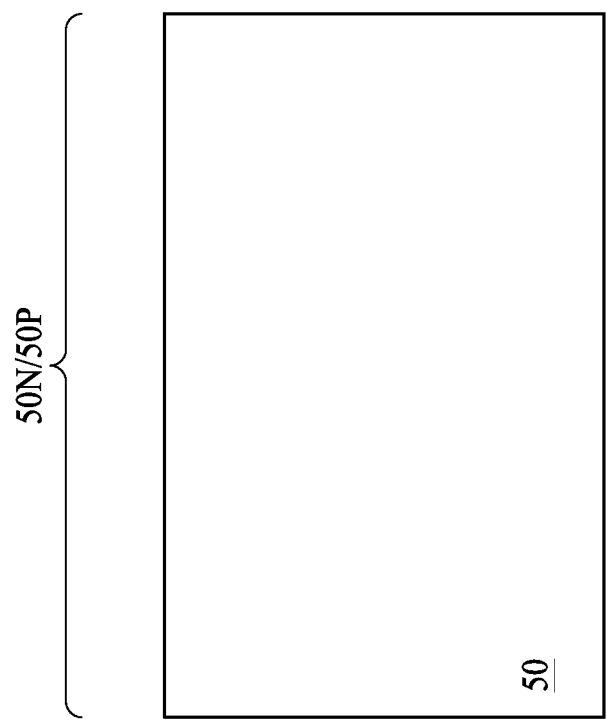

In FIGS. 2A-2C, a substrate 50 is provided. The substrate 50 may be a semiconductor substrate, such as a bulk semiconductor, a semiconductor-on-insulator (SOI) substrate, or the like, which may be doped (e.g., with a p-type or a n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. Although they are not separately illustrated, the n-type region 50N may be physically separated from the p-type region 50P, and any number of device features (e.g., other active devices, doped regions, isolation structures, etc.) may be disposed between the n-type region 50N and the p-type region 50P. The structures illustrated may be applicable to both the n-type region 50N and the p-type region 50P. Differences (if any) in the structures of the n-type region 50N and the p-type region 50P are described in the text accompanying each figure. Further, any number of n-type regions 50N and p-type regions 50P may be provided.

As will be subsequently described in greater detail, FIGS. 3A-5C illustrate a process for forming fin structures 62 in the substrate 50. Each fin structure 62 includes fins 62A and fins 62B, with the fins 62A being joined to a fin 62B. To form the fin structures 62, a first mask 52 (see FIGS. 3A-3C) is formed having a pattern of the fins 62A and a second mask 56 (see FIGS. 4A-4C) is formed having a pattern of the fins 62B. In the illustrated embodiment, the first mask 52 is formed with a multiple-patterning process and the second mask 56 is formed with a single-patterning process, so that the features of the second mask 56 are larger than the features of the first mask 52. The fin structures 62 are then patterned (see FIGS. 5A-5C) in the substrate 50 using both masks 52, 56 as a combined etching mask to simultaneously form the fins 62A, 62B.

Although a single fin structure 62 having a single fin 62B is illustrated, it should be appreciated that multiple fin structures 62 are formed, and that the fin structures 62 can have multiple fins 62B. The fin structures 62 may be formed simultaneously with other structures. For example, the fin structures 62 may be patterned with a same etching step that is used for patterning other structures (e.g., semiconductor strips) in the substrate 50.

Figure 3A:
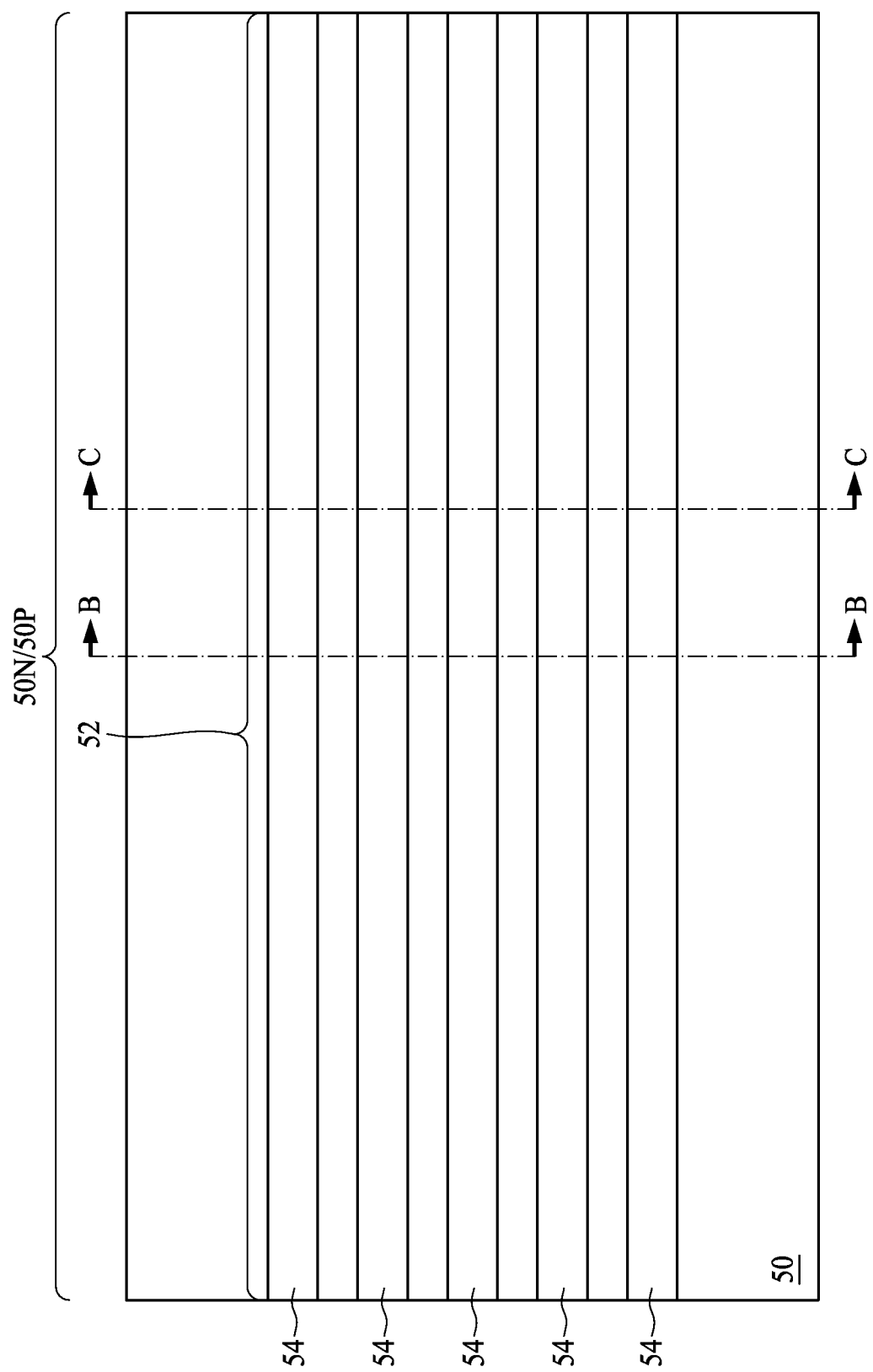
Figure 3C:
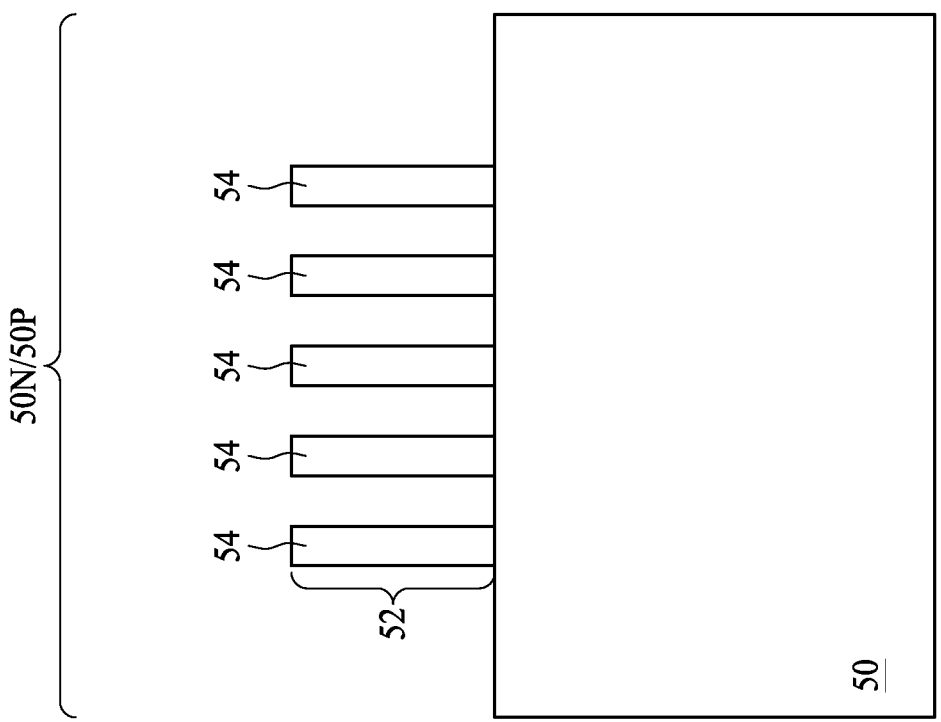
Figure 3B:
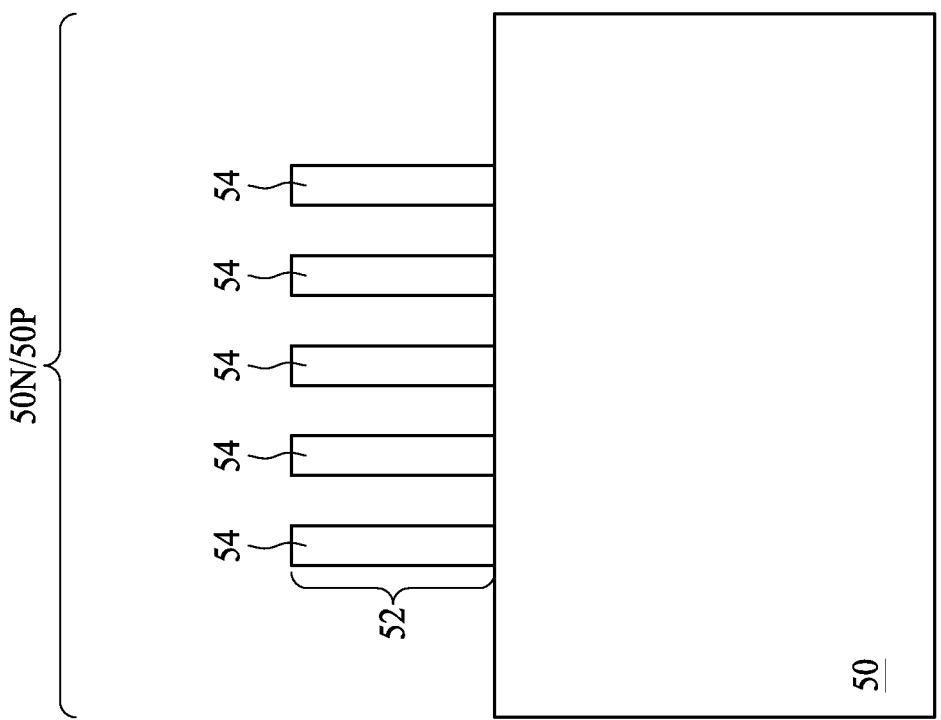

In FIGS. 3A-3C, a first mask 52 is formed on the substrate 50. The first mask 52 may be formed of spacers, a photoresist, or the like, having a high etching selectivity from the etching of the substrate 50. Acceptable spacer materials include dielectric materials such as silicon nitride, aluminum oxide, aluminum nitride, tantalum nitride, titanium nitride, titanium oxide, the like, combinations thereof, or the like, which may be formed using a deposition process such as atomic layer deposition (ALD), chemical vapor deposition (CVD), or the like. Acceptable photoresists include single-layer photoresists, bilayer photoresists, trilayer photoresists, or the like, which may be formed by a spin-on technique or the like.

In the illustrated embodiment, the first mask 52 includes spacers 54 formed using multiple photolithography processes, including a multiple-patterning process, such as a double-patterning process. Generally, multiple-patterning processes combine photolithography and self-aligned processes, allowing patterns to be created that have, for example, pitches smaller than what is otherwise obtainable using a single, direct photolithography process. For example, in an embodiment, a sacrificial layer is formed over the substrate 50 and patterned using a photolithography process to form mandrels (not separately illustrated). The sacrificial layer may be formed of a material that has a high etching selectivity from the etching of the substrate 50, such as amorphous silicon, polysilicon, silicon nitride, silicon oxide, the like, or combinations thereof, which may be formed using a process such as a CVD, plasma enhanced chemical vapor deposition (PECVD), or the like. The sacrificial layer may be patterned by an acceptable etch process to form the mandrels. The etch may be anisotropic. In some embodiment, the etch is selective to the sacrificial layer, e.g., selectively etches the material of the sacrificial layer at a faster rate than the material(s) of the substrate 50. The spacers 54 are then formed alongside the mandrels using a self-aligned process. For example, in an embodiment, a spacer layer is formed over the mandrels. The spacer layer may be formed of any of the spacer materials previously discussed. The spacer layer may be patterned by an acceptable etch process to form the spacers 54 alongside the mandrels. The etch may be anisotropic. In some embodiment, the etch is selective to the spacer layer, e.g., selectively etches the material of the spacer layer at a faster rate than the materials of the mandrels and the substrate 50. The mandrels ate then removed so that the spacers 54 remain over the substrate 50.

Figure 4A:
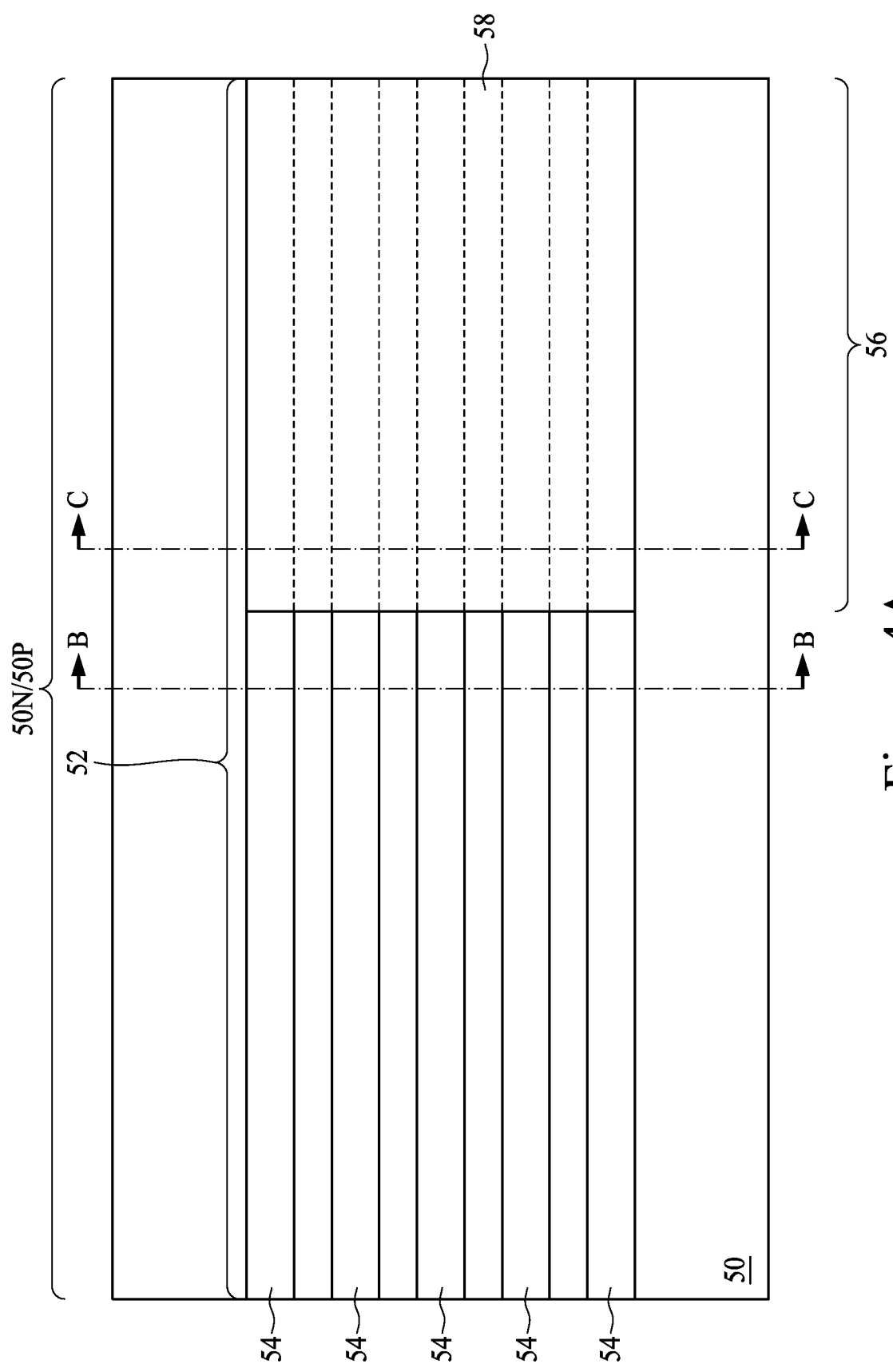
Figure 4C:
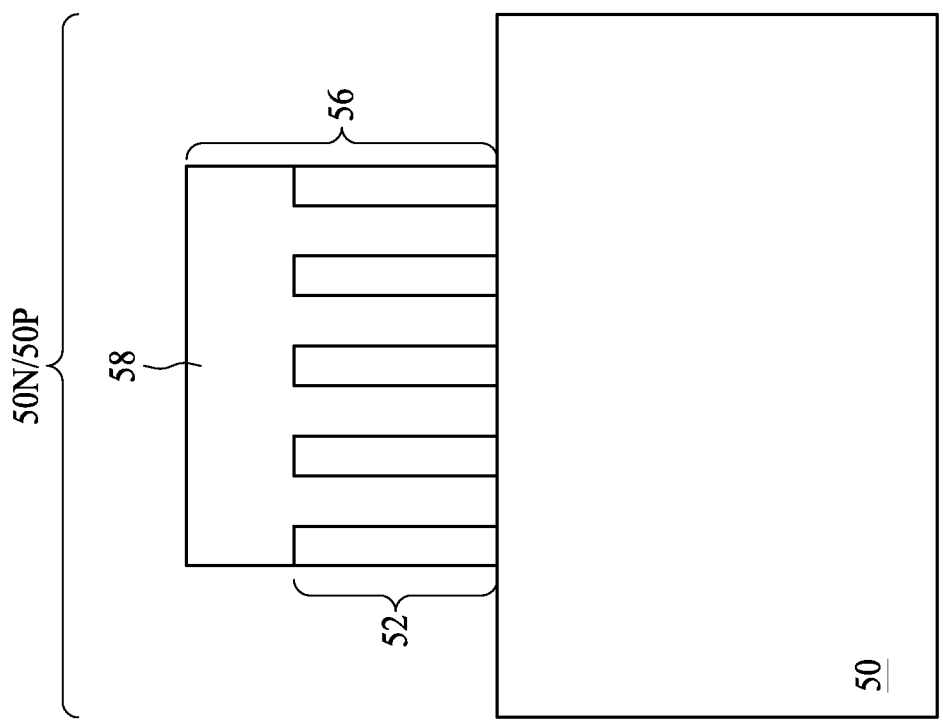
Figure 4B:
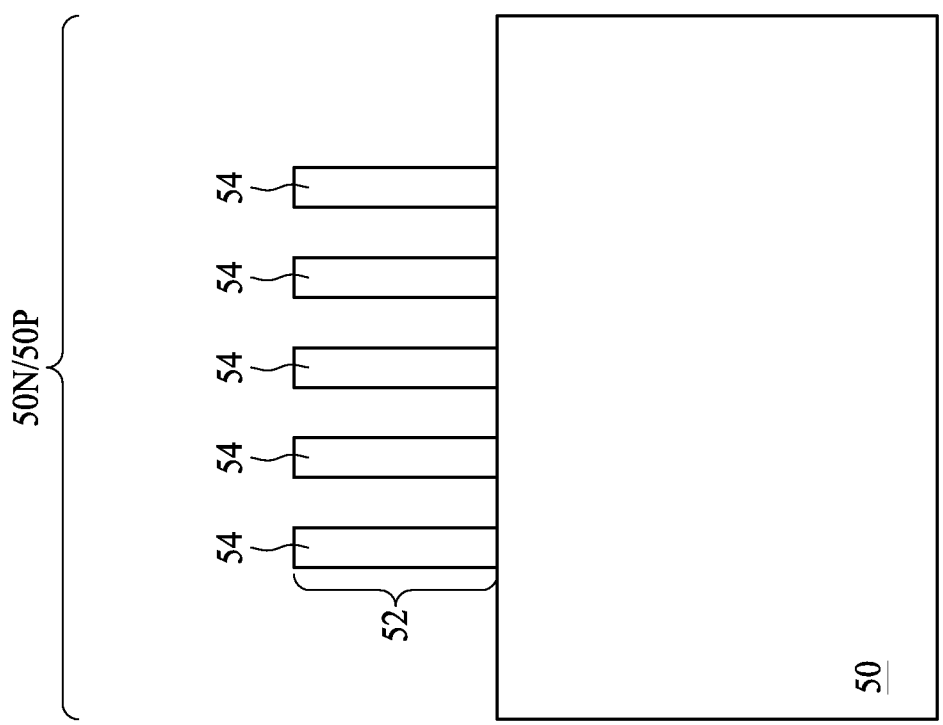

In FIGS. 4A-4C, a second mask 56 is formed on the substrate 50. The second mask 56 may be formed of a photoresist, spacers, or the like, having a high etching selectivity from the etching of the substrate 50. Acceptable photoresists include single-layer photoresists, bilayer photoresists, trilayer photoresists, or the like, which may be formed by a spin-on technique or the like. Acceptable spacer materials include dielectric materials such as silicon nitride, aluminum oxide, aluminum nitride, tantalum nitride, titanium nitride, titanium oxide, the like, combinations thereof, or the like, which may be formed using a deposition process such as ALD, CVD, or the like.

In the illustrated embodiment, the second mask 56 includes a photoresist 58 formed using a photolithography process, including a single-patterning process. Generally, a single-patterning process uses photolithography without combining it with self-aligned processes, allowing patterns to be created with less processing steps. The photoresist 58 can be formed of any of the photoresists previously discussed, and can be patterned using acceptable photolithography techniques. The features of the second mask 56 are larger than the features of the first mask 52.

The second mask 56 is formed over the first mask 52 so that portions of the first mask 52 and the second mask 56 overlap. Thus, the features patterned in the substrate 50 with the masks 52, 56 will be a continuous semiconductor material. Further, the features of the first mask 52 and the features of the second mask 56 extend along the same direction, e.g., the features have parallel longitudinal axes.

Figure 5A:
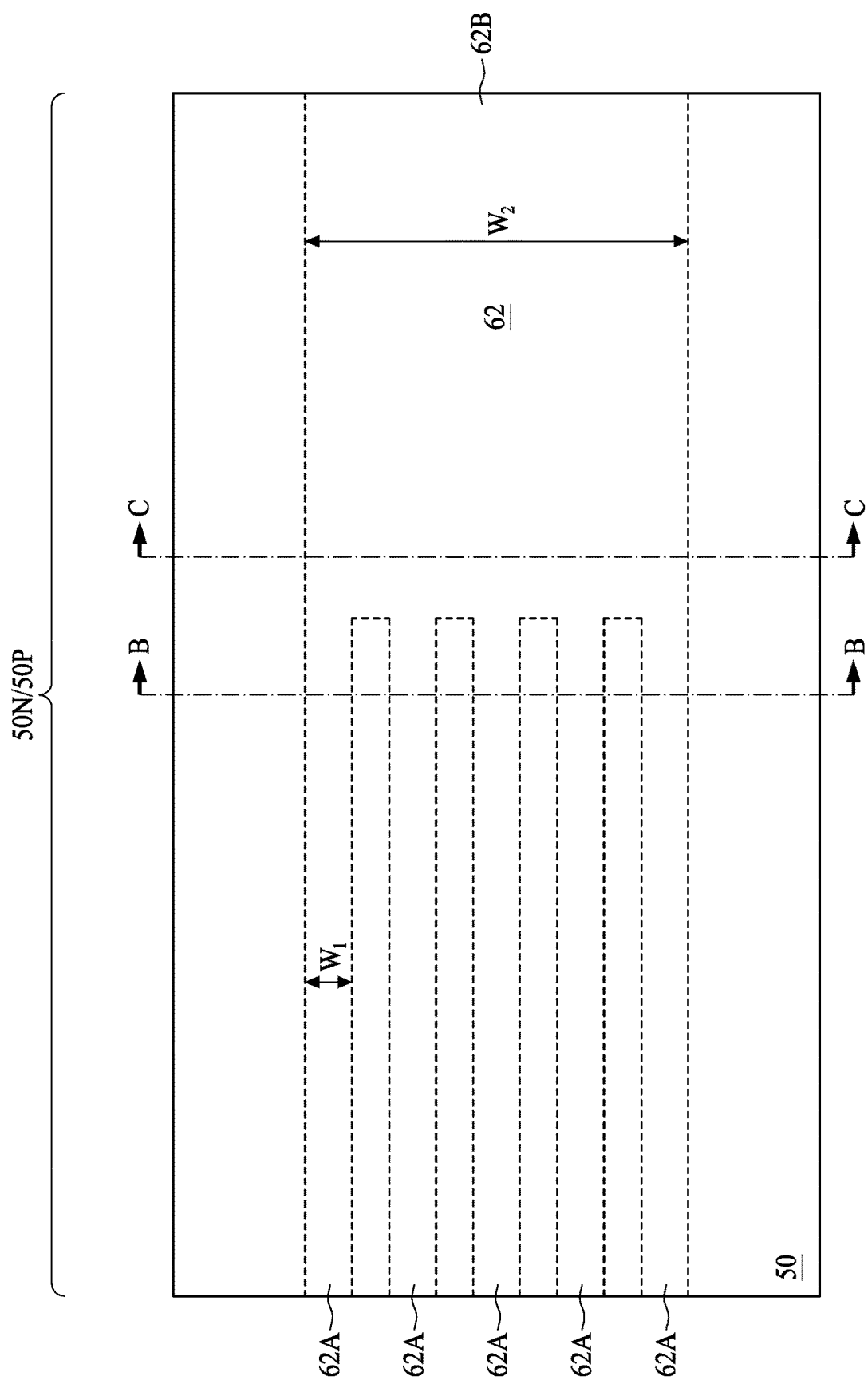
Figure 5C:
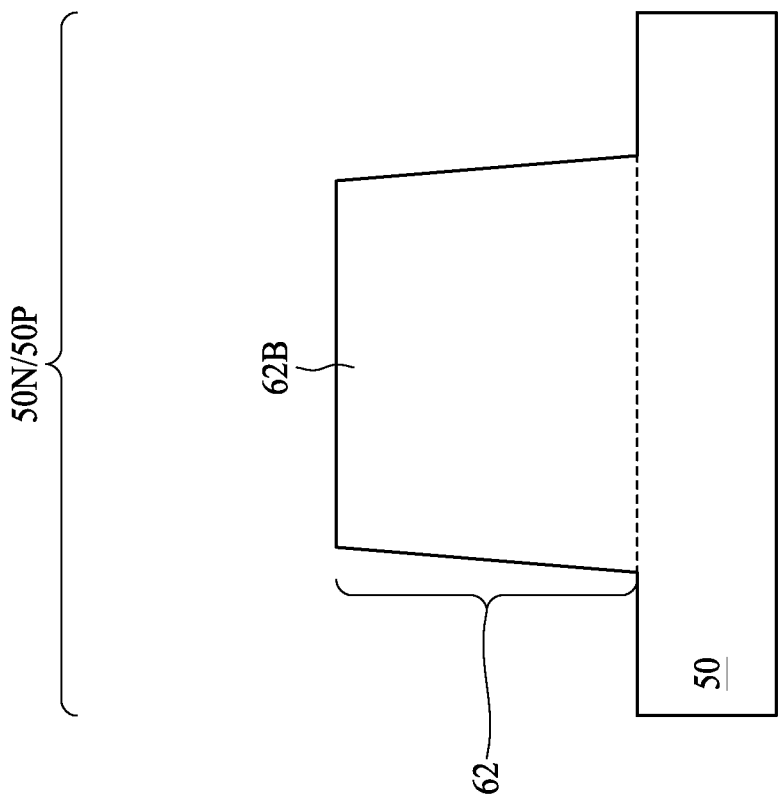
Figure 5B:
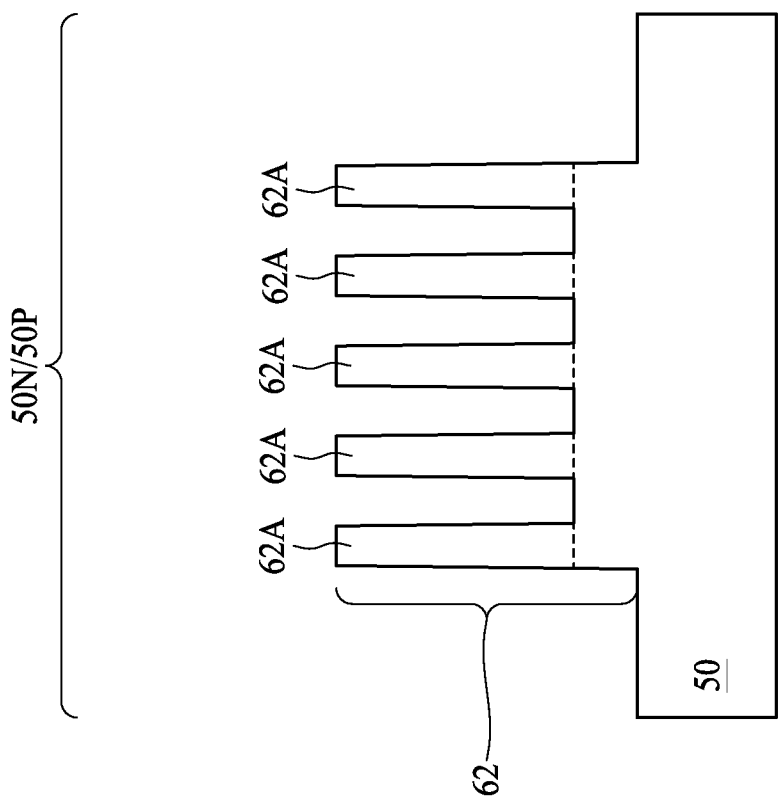

In FIGS. 5A-5C, the masks 52, 56 are used as a combined etching mask to etch trenches in the substrate 50, thereby patterning the substrate 50 to form the fin structures 62. The etching may be any acceptable etch process, such as a reactive ion etch (RIE), neutral beam etch (NBE), the like, or a combination thereof. The etch may be anisotropic. The trenches patterned in the substrate 50 may have different depths. For example, as a result of pattern loading effects, the trenches between the fins 62A may be shallower than the trenches around the fins 62B (e.g., the trenches between adjacent fin structures 62). In the illustrated embodiment, the masks 52, 56 are consumed in the etching process or are removed after the etching process but before subsequent processing. In another embodiment, the masks 52, 56 remain on the fin structures 62.

The width $W_1$ of the fins 62A is defined by the size of the features of the first mask 52, and the width $W_2$ of the fins 62B is defined by the size of the features of the second mask 56. The width $W_2$ is larger than the width $W_1$. For example, the width $W_1$ can be in the range of about 27 nm to about 35 nm, and the width $W_2$ can be in the range of about 75 nm to about 115 nm. The fins 62A, 62B may be tapered such that their widths $W_1$, $W_2$ decrease in a direction extending away from the top surface of the substrate 50. In such embodiments, the widths $W_1$, $W_2$ of the fins 62A, 62B refers to the widths of the narrowest portions of the fins 62A, 62B (sometimes referred to as the critical dimensions of the fins 62A, 62B).

The width $W_2$ of the fins 62B is determined by the quantity and the width $W_1$ of the fins 62A during a design process for the FinFETs, with more fins 62A or a greater width $W_1$ of the fins 62A resulting in a greater width $W_2$ of the fins 62B. In the illustrated embodiment, the fin structures 62 include five fins 62A. In another embodiment, the fin structures 62 can include any quantity of fins 62A in the range of about four fins 62A to about eighty fins 62A. The width $W_2$ is greater than the product of the width $W_1$ and the quantity of the fins 62A.

The total length of the fin structures 62 is determined by the width $W_2$ of the fins 62B. Specifically, fin structures 62 with fins 62B of a greater width $W_2$ have a greater length. For example, the fin structures 62 can have a length in the range of about 154 nm to about 100,000 nm.

The process previously described is just one example of how the fin structures 62 may be patterned. In some embodiments, the fin structures 62 are patterned using next-generation lithography techniques such as extreme ultraviolet (EUV) lithography, deep ultraviolet (DUV) lithography, X-ray lithography, soft X-ray (SX) lithography, ion beam projection lithography, electron-beam projection lithography, or the like. The use of next-generation lithography techniques may allow the fin structures 62 to be patterned by a single-patterning photolithography process, obviating the use of multiple-patterning photolithography processes.

Figure 6A:
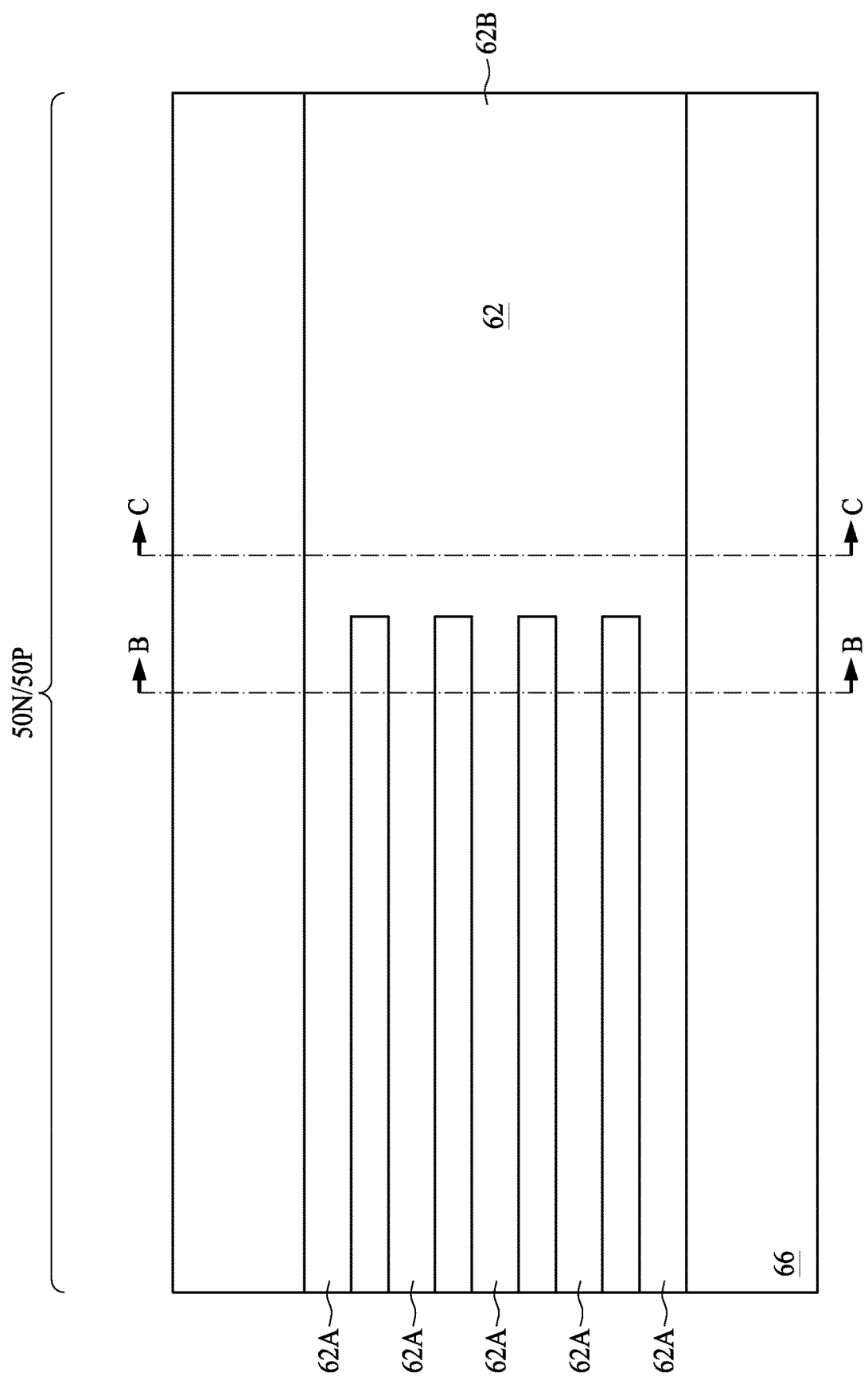
Figure 6C:
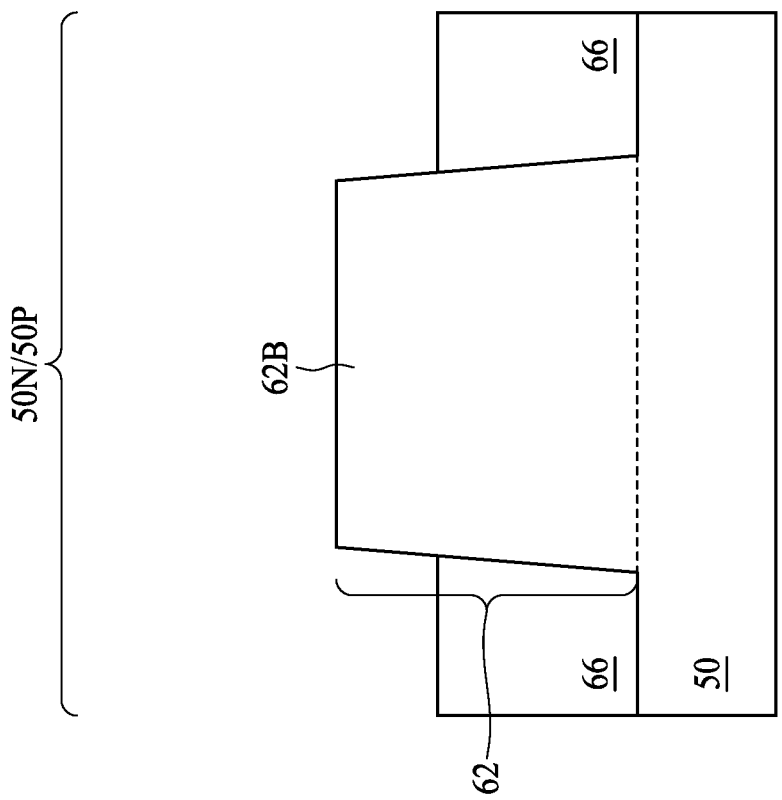
Figure 6B:
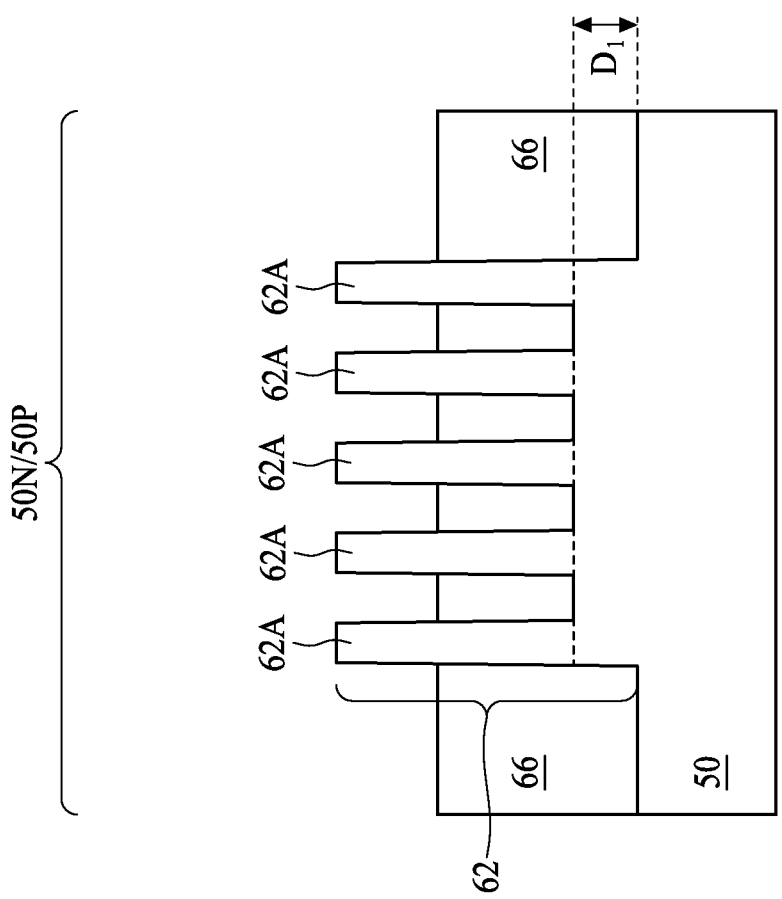

In FIGS. 6A-6C, STI regions 66 are formed over the substrate 50 and between adjacent fins 62A, 62B. The STI regions 66 are disposed around lower portions of the fin structures 62 such that upper portions of the fin structures 62 (e.g., the fins 62A, 62B) protrude from between adjacent STI regions 66. In other words, the upper portions of the fin structures 62 extend above the top surfaces of the STI regions 66. The STI regions 66 separate the features of adjacent devices.

The STI regions 66 may be formed by any suitable method. For example, an insulation material can be formed over the substrate 50 and between adjacent fins 62A, 62B. The insulation material may be an oxide, such as silicon oxide, a nitride, such as silicon nitride, the like, or a combination thereof, and may be formed by a CVD process, such as high density plasma CVD (HDP-CVD), flowable CVD (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the fin structures 62. Although the STI regions 66 are each illustrated as a single layer, some embodiments may utilize multiple layers. For example, in some embodiments, a liner (not separately illustrated) may first be formed along a surface of the substrate 50 and the fin structures 62. Thereafter, a fill material, such as those described above may be formed over the liner.

A removal process is then applied to the insulation material to remove excess insulation material over the fin structures 62. In some embodiments, a planarization process such as a chemical mechanical polish (CMP), an etch-back process, combinations thereof, or the like may be utilized. The planarization process exposes the fin structures 62 such that top surfaces of the fin structures 62 and the insulation material are coplanar (within process variations) after the planarization process is complete. In embodiments in which masks remains on the fin structures 62, the planarization process may expose the masks or remove the masks such that top surfaces of the masks or the fin structures 62, respectively, and the insulation material are coplanar (within process variations) after the planarization process is complete. The insulation material is then recessed to form the STI regions 66. The insulation material is recessed such that upper portions of the fin structures 62 protrude from between adjacent portions of the insulation material. In this embodiment, the insulation material is recessed such that upper portions of the fins 62A and the fins 62B protrude from between adjacent portions of the insulation material. In another embodiment (subsequently described in greater detail), the insulation material is selected recessed (e.g., by masking portions of the insulation material during recessing) such that upper portions of the fins 62A protrude from between adjacent portions of the insulation material, but the fins 62B do not protrude from between adjacent portions of the insulation material. Further, the top surfaces of the STI regions 66 may have a flat surface as illustrated, a convex surface, a concave surface (such as dishing), or a combination thereof. The top surfaces of the STI regions 66 may be formed flat, convex, and/or concave by an appropriate etch. The insulation material may be recessed using an acceptable etching process, such as one that is selective to the material of the insulation material (e.g., etches the material of the insulation material at a faster rate than the material of the fin structures 62). For example, an oxide removal using, for example, dilute hydrofluoric (dHF) acid may be used.

As previously noted, the trenches between the fins 62A may be shallower than the trenches between the fins 62B/fin structures 62 because of pattern loading effects. As a result, the bottom surfaces of the STI regions 66 between the fins 62A are disposed above the bottom surfaces of the STI regions 66 between the fins 62B, such that the STI regions 66 between the fins 62B are deeper than the STI regions 66 between the fins 62A by a depth $D_1$. The depth $D_1$ can be in the range of about 25 nm to about 40 nm. Forming the STI regions 66 to depths in such a range allows the adjacent fin structures 62 to be sufficiently isolated from one another. Forming the STI regions 66 to depths outside such a range may not allow the adjacent fin structures 62 to be sufficiently isolated from one another.

The process previously described is just one example of how the fin structures 62 and the STI regions 66 may be formed. In some embodiments, the fin structures 62 may be formed using a mask and an epitaxial growth process. For example, a dielectric layer can be formed over a top surface of the substrate 50, and trenches can be patterned in the dielectric layer to expose the underlying substrate 50. Epitaxial structures can be epitaxially grown in the trenches, and the dielectric layer can be recessed, such that the epitaxial structures protrude from the dielectric layer to form the fin structures 62, and the recessed dielectric layer forms the STI regions 66. The epitaxial structures may be heteroepitaxial structures, homoepitaxial structures, or the like. In some embodiments where epitaxial structures are epitaxially grown, the epitaxially grown materials may be in situ doped during growth, which may obviate prior and/or subsequent implantations, although in situ and implantation doping may be used together.

Still further, it may be advantageous to epitaxially grow a material in n-type region 50N (e.g., a NMOS region) different from the material in p-type region 50P (e.g., a PMOS region). In various embodiments, upper portions of the fin structures 62 may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not separately illustrated in FIGS. 2A-15D) may be formed in the fins 62A, 62B and/or the substrate 50. In this embodiment, the wells have a conductivity type opposite from a conductivity type of source/drain regions that will be subsequently formed in each of the n-type region 50N and the p-type region 50P. In some embodiments, a p-type well may be formed in the n-type region 50N, and a n-type well may be formed in the p-type region 50P. In some embodiments, p-type well or a n-type well are formed in both the n-type region 50N and the p-type region 50P.

In the embodiments with different well types, the different implant steps for the n-type region 50N and the p-type region 50P may be achieved using a mask (not separately illustrated) such as a photoresist. For example, a photoresist may be formed over the fin structures 62 and the STI regions 66 in the n-type region 50N. The photoresist is patterned to expose the p-type region 50P. The photoresist can be formed by using a spin-on technique and can be patterned using acceptable photolithography techniques. Once the photoresist is patterned, a n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of about $10^{13}$ $cm^{-3}$ to about $10^{14}$ $cm^{-3}$. After the implant, the photoresist may be removed, such as by an acceptable ashing process.

Following or prior to the implanting of the p-type region 50P, a mask (not separately illustrated) such as a photoresist is formed over the fin structures 62 and the STI regions 66 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of about $10^{13}$ cm$^{-3}$ to about $10^{14}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7A:
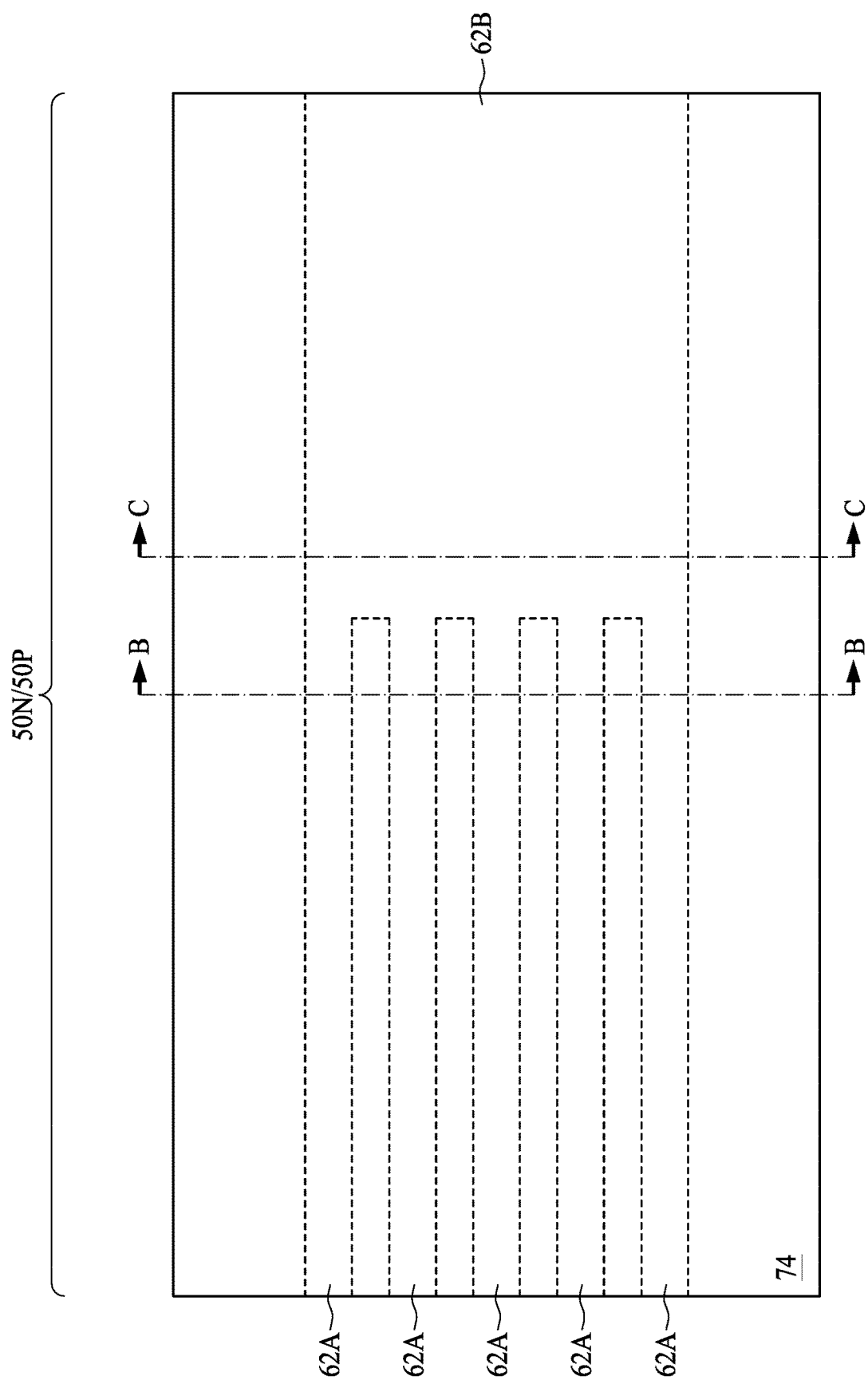
Figure 7B:
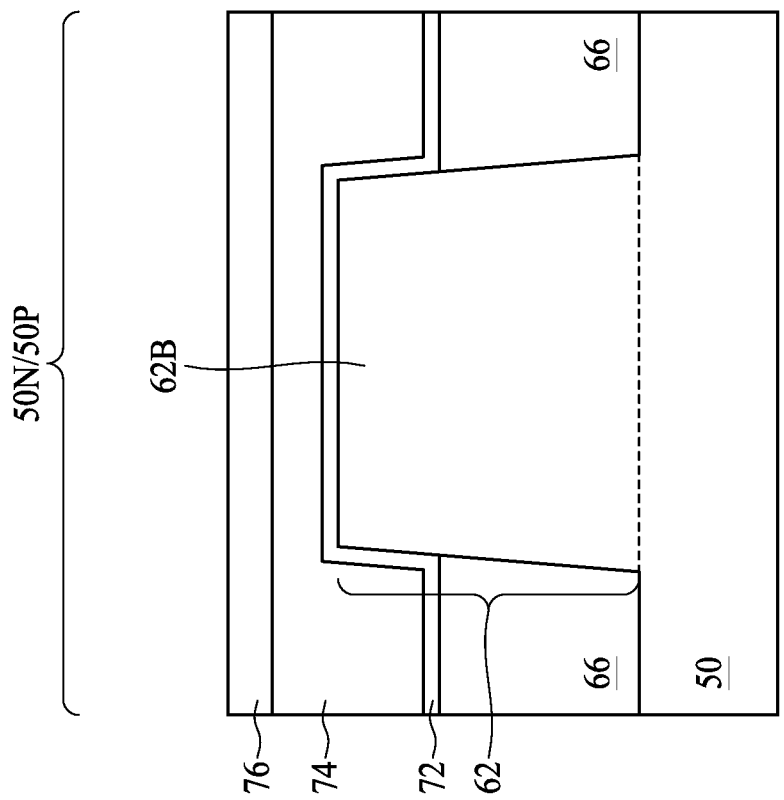
Figure 7C:
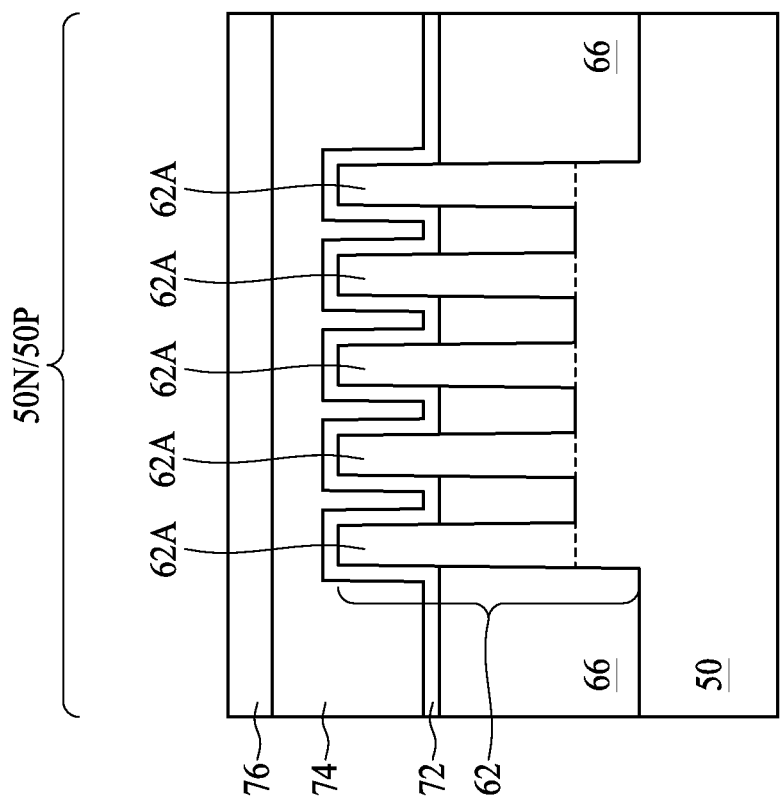
Figure 8A:
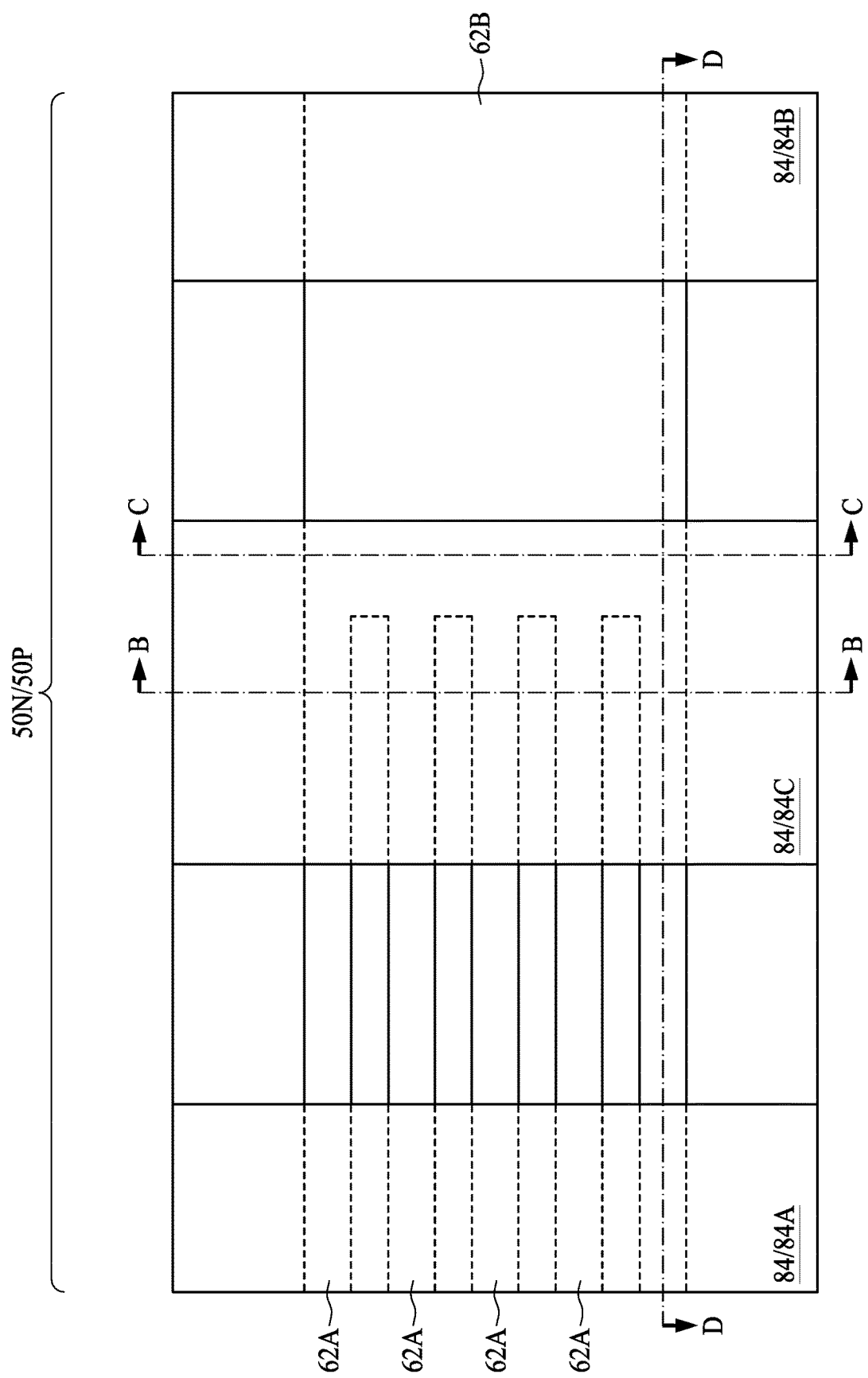
Figure 8C:
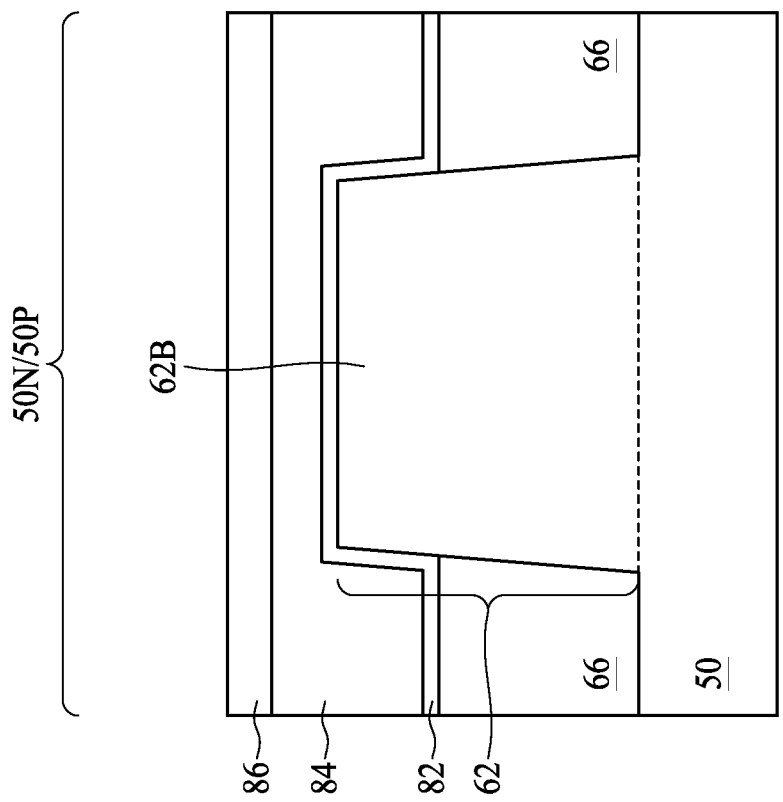
Figure 8B:
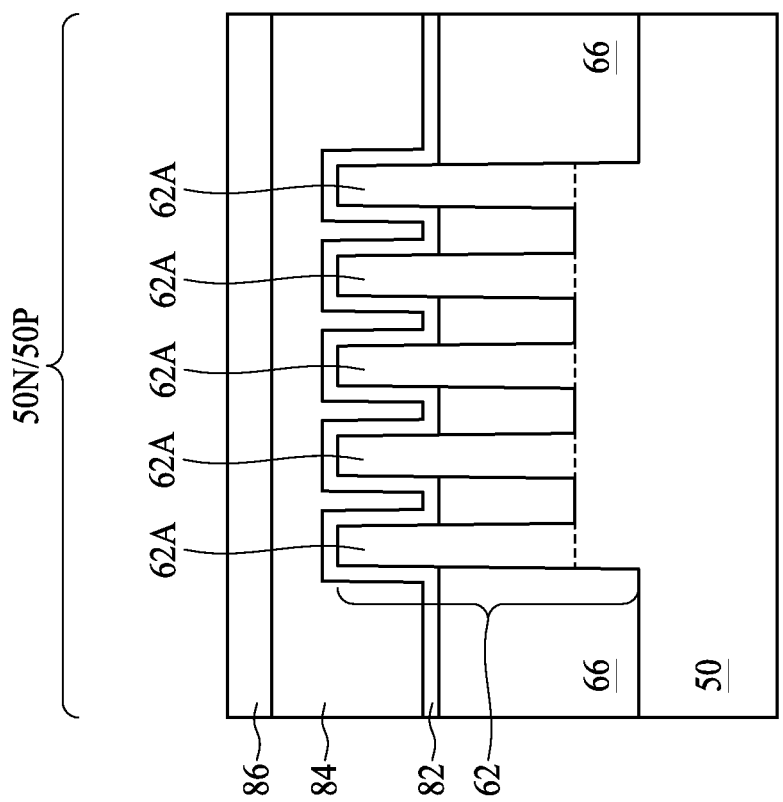
Figure 8D:
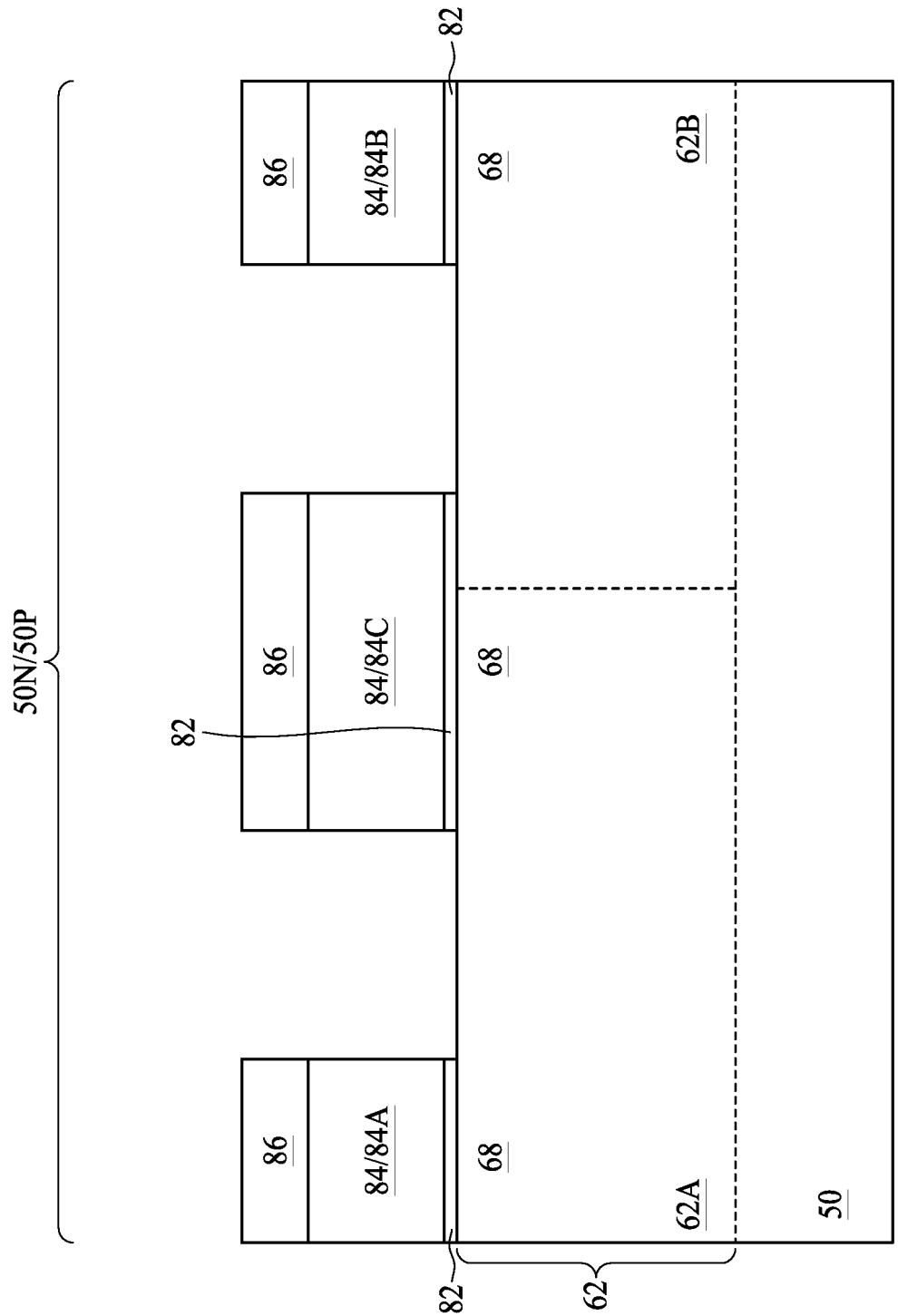

In FIGS. 7A-7C, a dummy dielectric layer 72 is formed on the fins 62A, 62B. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be formed of a conductive or non-conductive material, such as amorphous silicon, polycrystalline-silicon (polysilicon), poly-crystalline silicon-germanium (poly-SiGe), metallic nitrides, metallic silicides, metallic oxides, metals, or the like, which may be deposited by physical vapor deposition (PVD), CVD, or the like. The dummy gate layer 74 may be made of material(s) that have a high etching selectivity from the etching of insulation materials, e.g., the STI regions 66 and/or the dummy dielectric layer 72. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the STI regions 66, such that the dummy dielectric layer 72 extends over the STI regions 66 and between the dummy gate layer 74 and the STI regions 66. In another embodiment, the dummy dielectric layer 72 covers only the fins 62A, 62B.

In FIGS. 8A-8D, the mask layer 76 may be patterned using acceptable photolithography and etching techniques to form masks 86. The pattern of the masks 86 then may be transferred to the dummy gate layer 74 to form dummy gates 84. In some embodiments, the pattern of the masks 86 is also transferred to the dummy dielectric layer 72 by an acceptable etching technique to form dummy dielectrics 82. The dummy gates 84 cover respective channel regions 68 of the fin structures 62. The pattern of the masks 86 may be used to physically separate each of the dummy gates 84 from adjacent dummy gates 84. The dummy gates 84 may also have a lengthwise direction substantially perpendicular to the lengthwise direction of the fins 62A, 62B. The masks 86 may be removed during the patterning of the dummy gate 84, or may be removed in subsequent processing.

Each of the dummy gates 84 may extend over one or more fin structures 62 (not separately illustrated in FIGS. 2A-15D). A first subset of the dummy gates 84A extend over the fins 62A, a second subset of the dummy gates 84B extend over the fins 62B, and a third subset of the dummy gates 84C extend over both the fins 62A and the fins 62B. Specifically, each dummy gate 84C extends over a fin structure 62, along the portion of that fin structure 62 where the fins 62A are joined to the fin 62B. As will be subsequently described in greater detail, the dummy gates 84A, 84B, 84C may be used to form devices that operate at different voltages.

In FIGS. 9A-9D, gate spacers 92 are formed on sidewalls of the dummy gates 84 and the masks 86. The gate spacers 92 may be formed by conformally depositing one or more dielectric material(s) and subsequently etching the dielectric material(s). Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like; multilayers thereof; or the like. The dielectric materials may be formed by a conformal deposition process such as CVD, PECVD, ALD, or the like. In the illustrated embodiment, the gate spacers 92 each include multiple layers, e.g., a first spacer layer 92A and a second spacer layer 92B. In some embodiments, the first spacer layers 92A and the second spacer layers 92B are formed of silicon oxycarbonitride (e.g., $SiO_xN_yC_{1-x-y}$, where x and y are in the range of 0 to 1). For example, the first spacer layers 92A can be formed of a similar or a different composition of silicon oxycarbonitride than the second spacer layers 92B. An acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 92). After etching, the gate spacers 92 can have straight sidewalls (as illustrated) or can have curved sidewalls (not illustrated). As will be subsequently described in greater detail, the dielectric material(s), when etched, may also have portions left on the sidewalls of the fins 62A, 62B (thus forming fin spacers).

Further, implants may be performed to form lightly doped source/drain (LDD) regions (not separately illustrated). In the embodiments with different device types, similar to the implants for the wells previously discussed, a mask, such as a photoresist, may be formed over the n-type region 50N, while exposing the p-type region 50P, and appropriate type (e.g., p-type) impurities may be implanted into the exposed fins 62A, 62B in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 62A, 62B in the n-type region 50N. The mask may then be removed. The n-type impurities may be any of the n-type impurities previously discussed, and the p-type impurities may be any of the p-type impurities previously discussed. The LDD regions may have a concentration of impurities in the range of about $10^{15}$ cm$^{-3}$ to about $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using a different structures and steps.

Source/drain regions 98 are then formed in the fins 62A, 62B. The source/drain regions 98 are formed in the fins 62A, 62B such that each dummy gate 84 (and corresponding channel region 68) is disposed between respective adjacent pairs of the source/drain regions 98. In some embodiments the source/drain regions 98 may extend into, and may also penetrate through, the fins 62A, 62B. In some embodiments, the gate spacers 92 are used to separate the source/drain regions 98 from the dummy gates 84 by an appropriate lateral distance so that the source/drain regions 98 do not short out with subsequently formed gates of the resulting FinFETs. A material of the source/drain regions 98 may be selected to exert stress in the respective channel regions 68, thereby improving performance. In the illustrated embodiment, the source/drain regions 98 are epitaxial regions in the fin structures 62 having faceted upper surfaces.

The source/drain regions 98 in the n-type region 50N may be formed by masking the p-type region 50P and etching source/drain regions of the fins 62A, 62B in the n-type region 50N to form recesses in the fins 62A, 62B. Then, the source/drain regions 98 in the n-type region 50N are epitaxially grown in the recesses. The source/drain regions 98 may include any acceptable material, such as appropriate for n-type FinFETs. For example, if the fins 62A, 62B are silicon, the source/drain regions 98 in the n-type region 50N may include materials exerting a tensile strain the channel regions 68, such as silicon, silicon carbide, phosphorous doped silicon carbide, silicon phosphide, or the like. As will be subsequently described in greater detail, some of the source/drain regions 98 in the n-type region 50N may have surfaces raised from respective surfaces of the fins 62A, 62B and may have facets.

The source/drain regions 98 in the p-type region 50P may be formed by masking the n-type region 50N and etching source/drain regions of the fins 62A, 62B in the p-type region 50P to form recesses in the fins 62A, 62B. Then, the source/drain regions 98 in the p-type region 50P are epitaxially grown in the recesses. The source/drain regions 98 may include any acceptable material, such as appropriate for p-type FinFETs. For example, if the fins 62A, 62B are silicon, the source/drain regions 98 in the p-type region 50P may include materials exerting a compressive strain the channel regions 68, such as silicon-germanium, boron doped silicon-germanium, germanium, germanium tin, or the like. As will be subsequently described in greater detail, some of the source/drain regions 98 in the p-type region 50P may have surfaces raised from respective surfaces of the fins 62A, 62B and may have facets.

The source/drain regions 98 and/or the fins 62A, 62B may be implanted with dopants to form source/drain regions, similar to the process previously discussed for forming the LDD regions, followed by an anneal. The source/drain regions may have an impurity concentration in the range of about $10^{19}$ cm$^{-3}$ and about $10^{21}$ cm$^{-3}$. The n-type and/or p-type impurities for the source/drain regions may be any of the impurities previously discussed. In some embodiments, the source/drain regions 98 may be in situ doped during growth.

As noted above, the source/drain regions 98 are formed in the fins 62A, 62B such that each dummy gate 84 (and corresponding channel region 68) is disposed between respective adjacent pairs of the source/drain regions 98. A first subset of the source/drain regions 98A are formed in each of the fins 62A of a fin structure 62, as illustrated by FIG. 9E. A second subset of the source/drain regions 98B are formed in the fin 62B of a fin structure 62, as illustrated by FIG. 9F. Thus, each of the dummy gates 84A are between adjacent source/drain regions 98A, each of the dummy gates 84B are between adjacent source/drain regions 98B, and each of the dummy gates 84C are between a source/drain region 98A and a source/drain region 98B.

The source/drain regions 98 have different structures depending on which of the fins 62A, 62B they are formed in. As a result of the epitaxy processes used to form the source/drain regions 98A, upper surfaces of the source/drain regions 98A have facets which expand laterally outward beyond sidewalls of the fins 62A. In the illustrated embodiment, these facets cause adjacent source/drain regions 98A to merge as illustrated by FIG. 9E. The fin structures 62 are spaced apart from each other so that the source/drain regions 98B remain separated after the epitaxy process is completed as illustrated by FIG. 9F. In another embodiment (not separately illustrated), the adjacent source/drain regions 98A also remain separated after the epitaxy process is completed. The spacer etch used to form the gate spacers 92 may be adjusted to also form fin spacers 94 on sidewalls of the fins 62A, 62B. In the illustrated embodiments, the fin spacers 94 cover a portion of the sidewalls of the fins 62A, 62B that extend above the STI regions 66, thereby blocking the epitaxial growth. In another embodiment, the spacer etch used to form the gate spacers 92 is adjusted to not form the fin spacers 94, so as to allow the source/drain regions 98 to extend to the surface of the STI regions 66.

When the adjacent source/drain regions 98A are merged, the source/drain regions 98A may have non-planar top surfaces, while the source/drain regions 98B have planar top surfaces. Specifically, the source/drain regions 98A may have "wavy" top surfaces. In another embodiment, the source/drain regions 98A have planar top surfaces that are free of "wavy" top surfaces.

Figure 9A:
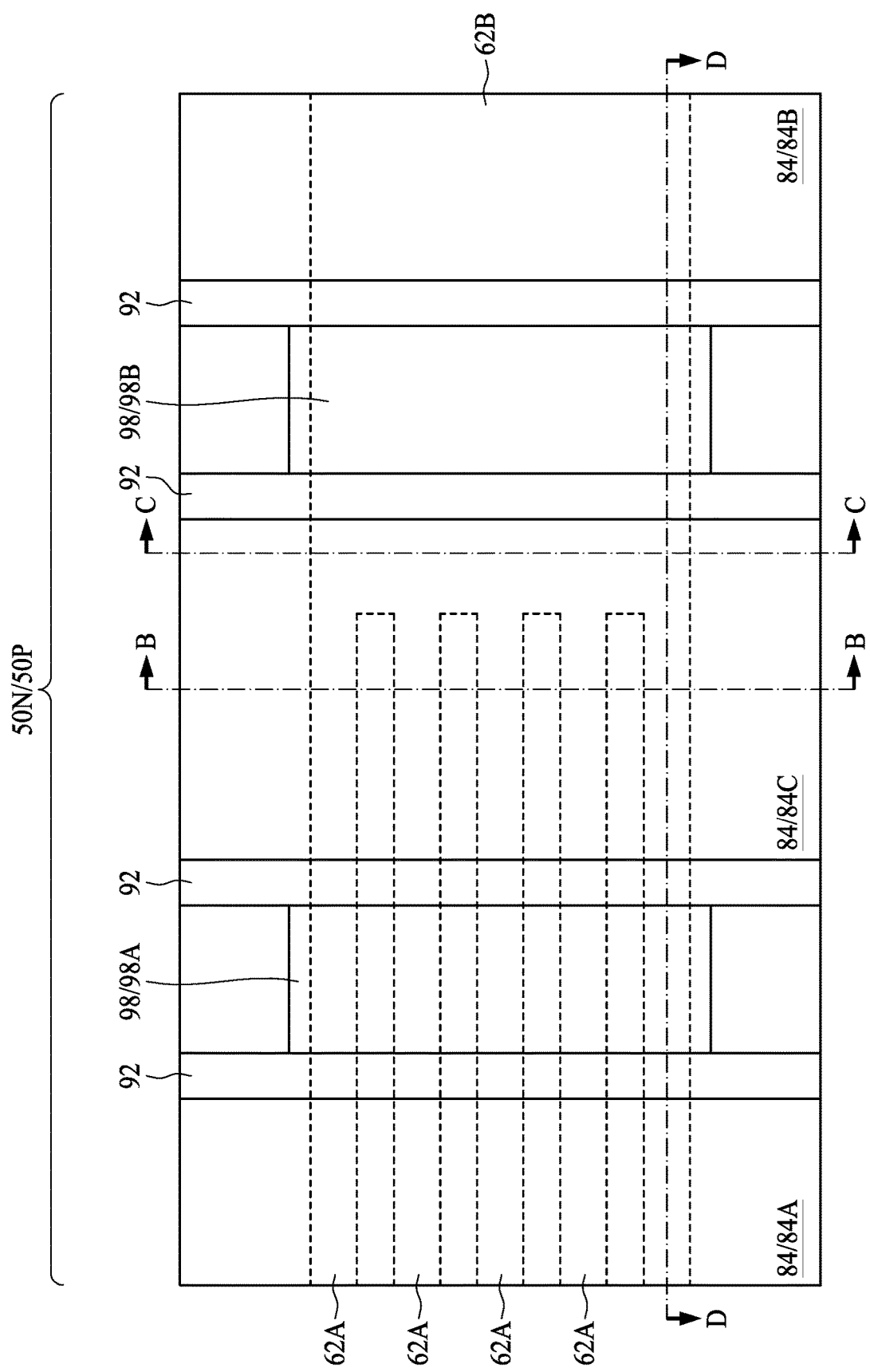
Figure 9C:
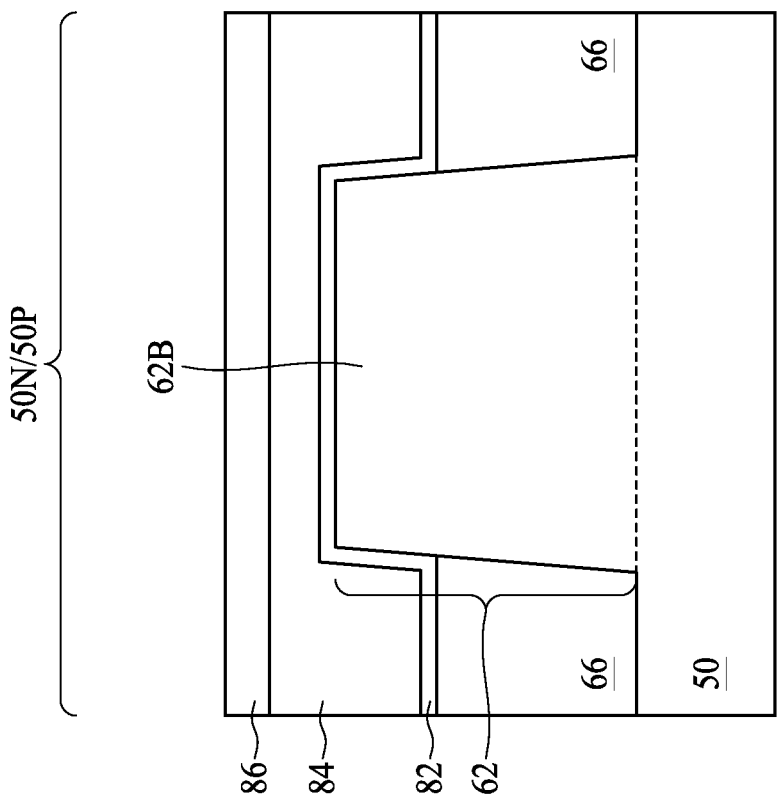
Figure 9B:
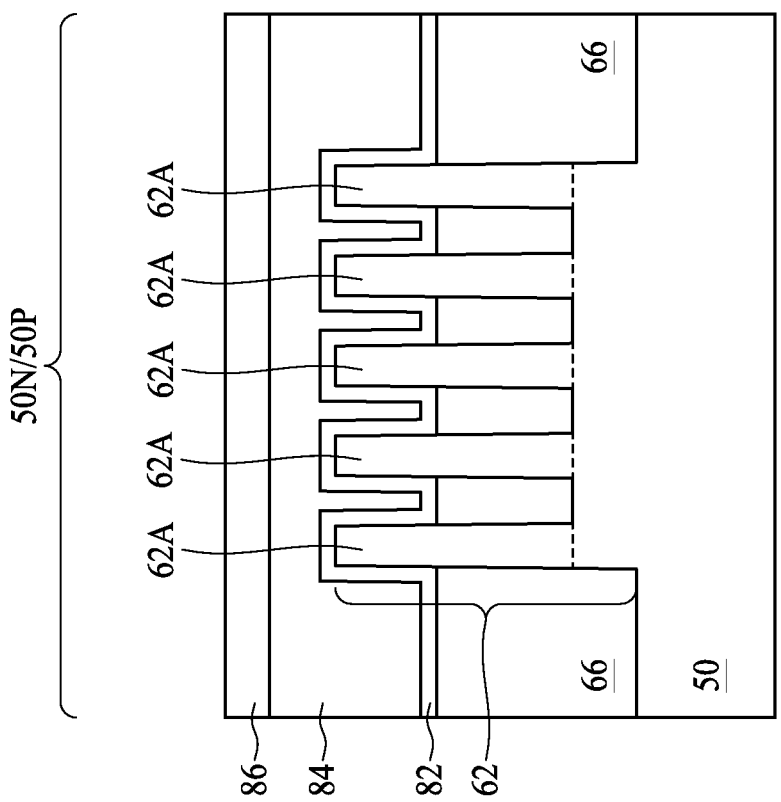
Figure 9D:
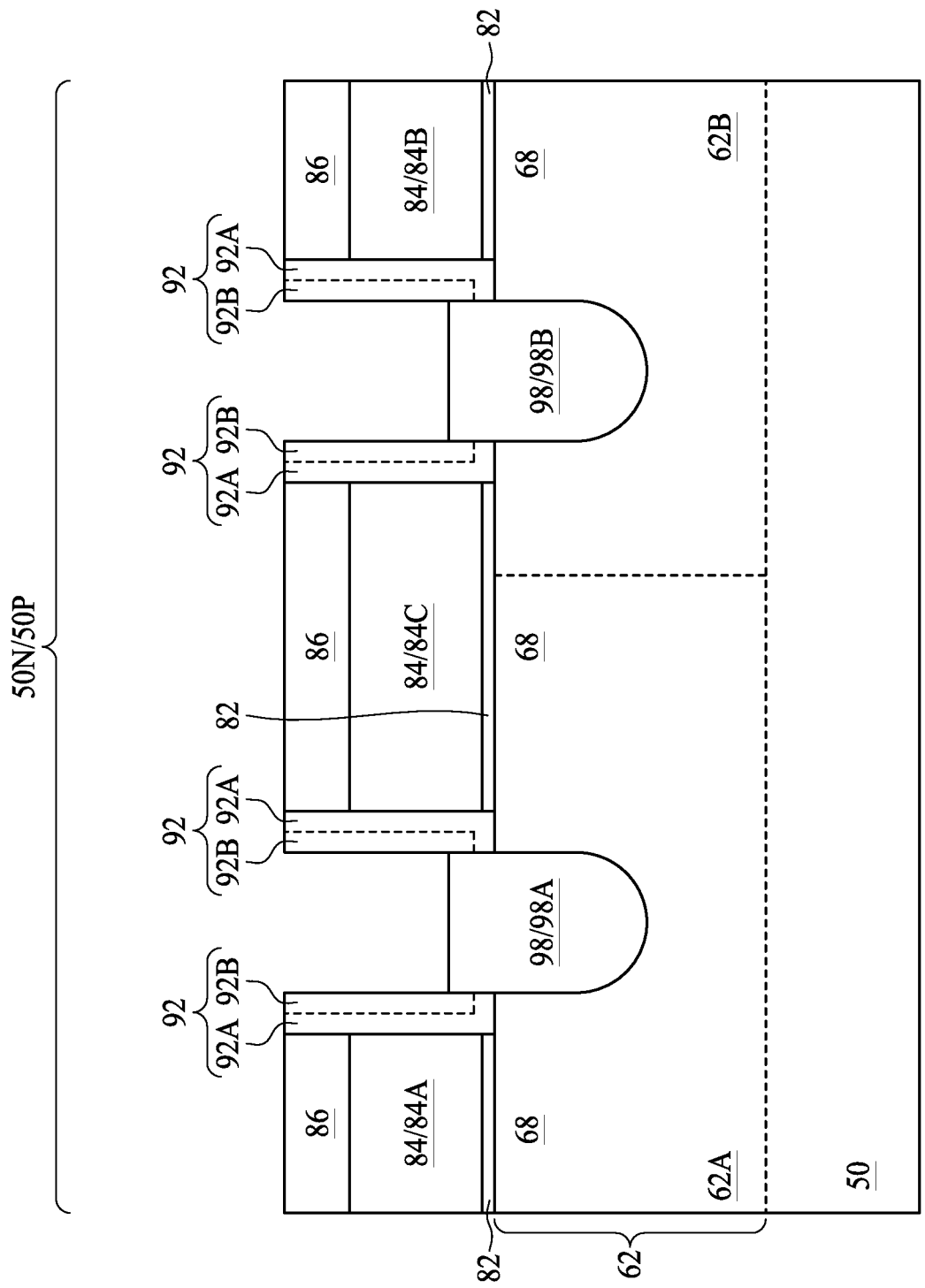
Figure 9F:
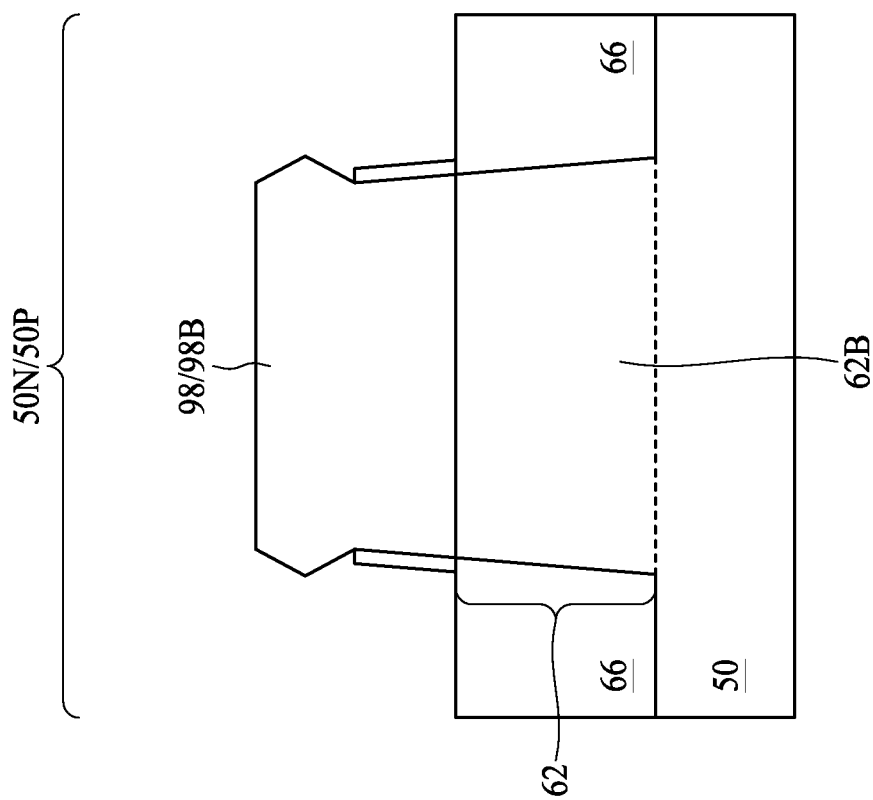
Figure 9E:
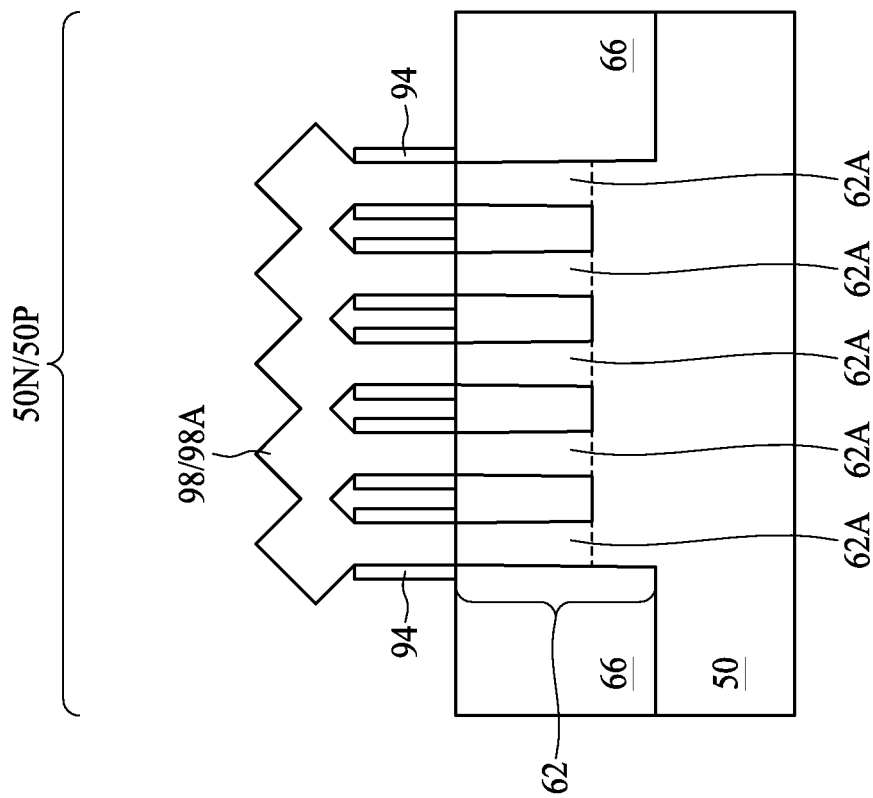
Figure 9G:
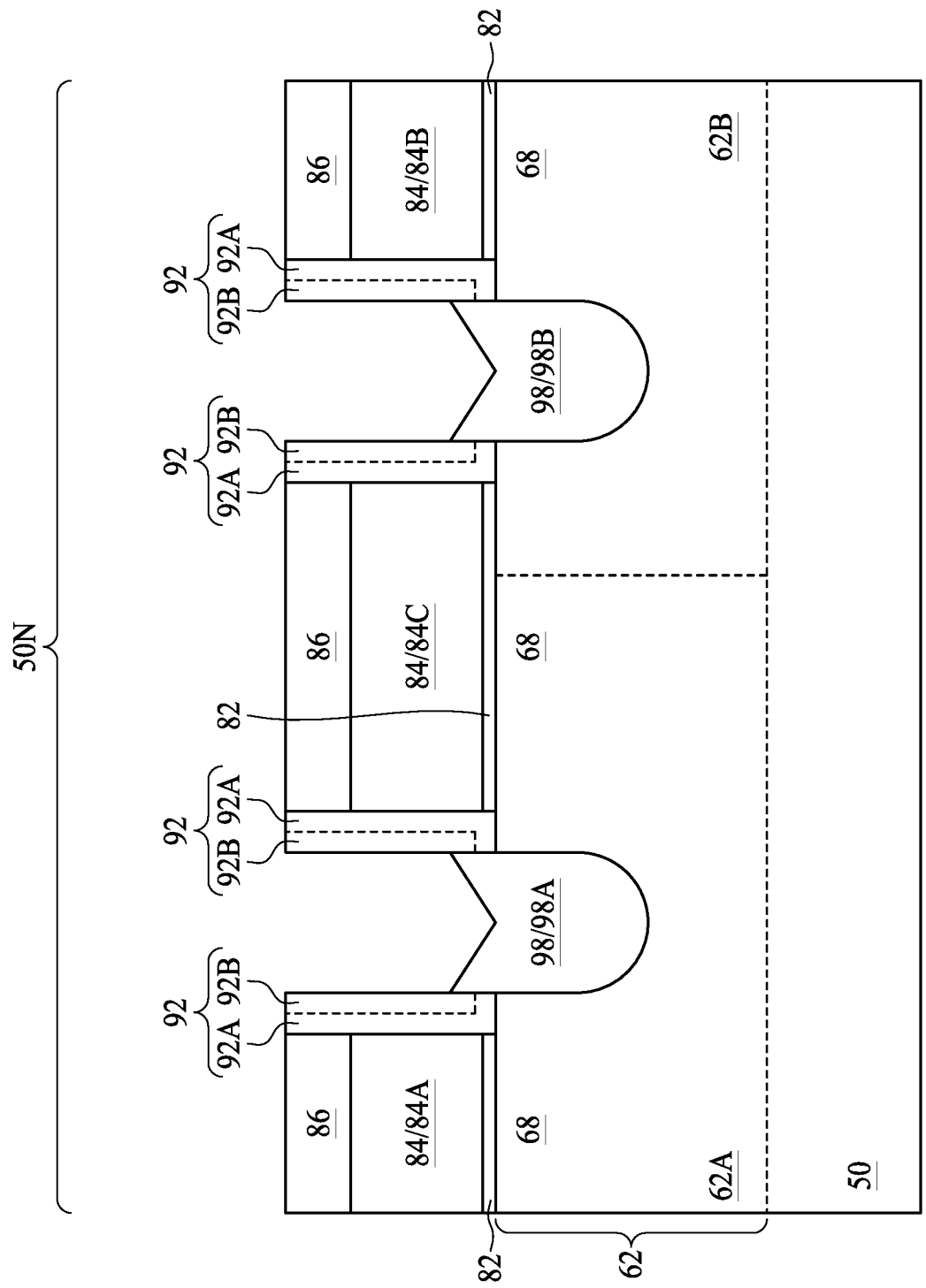
Figure 9H:
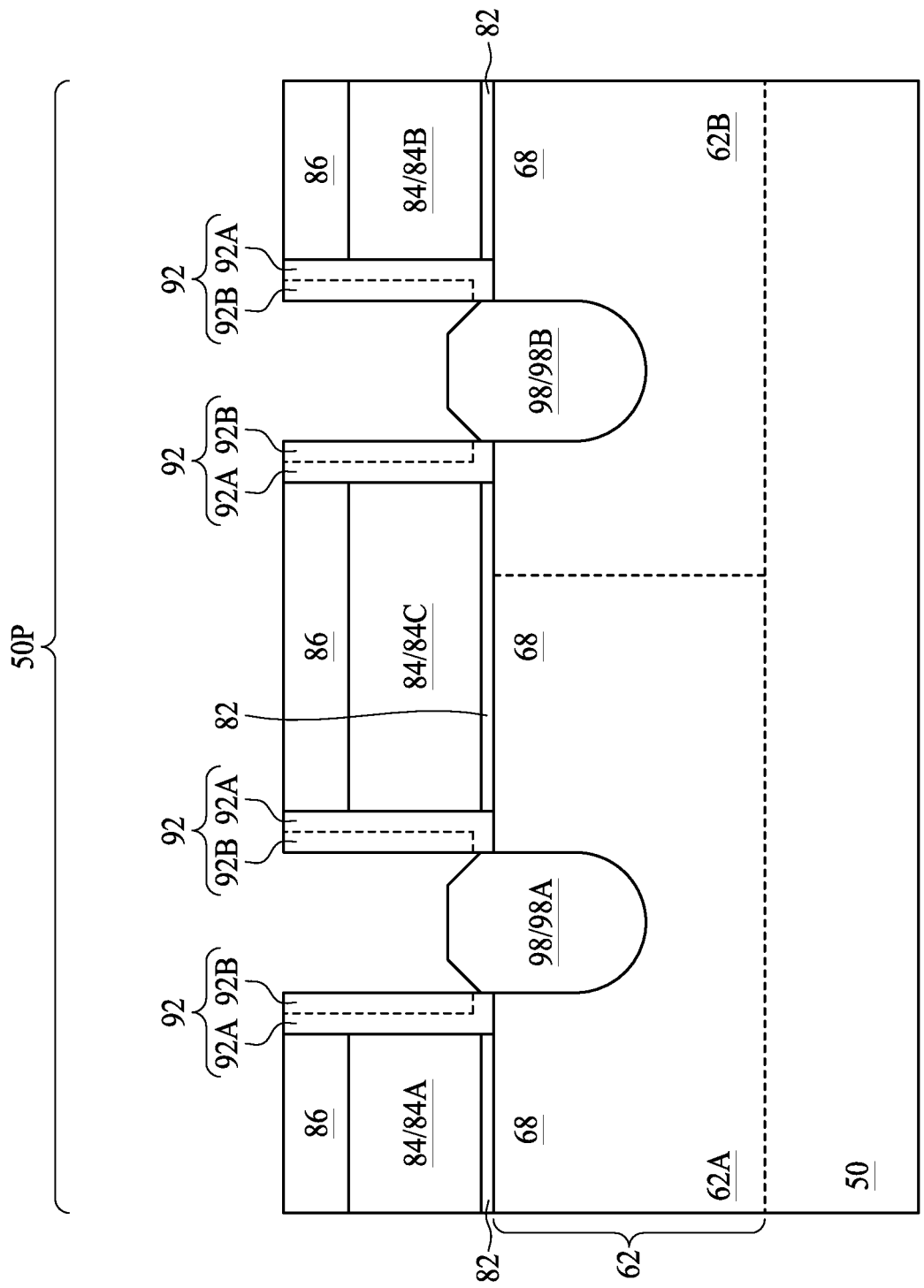
Figure 10A:
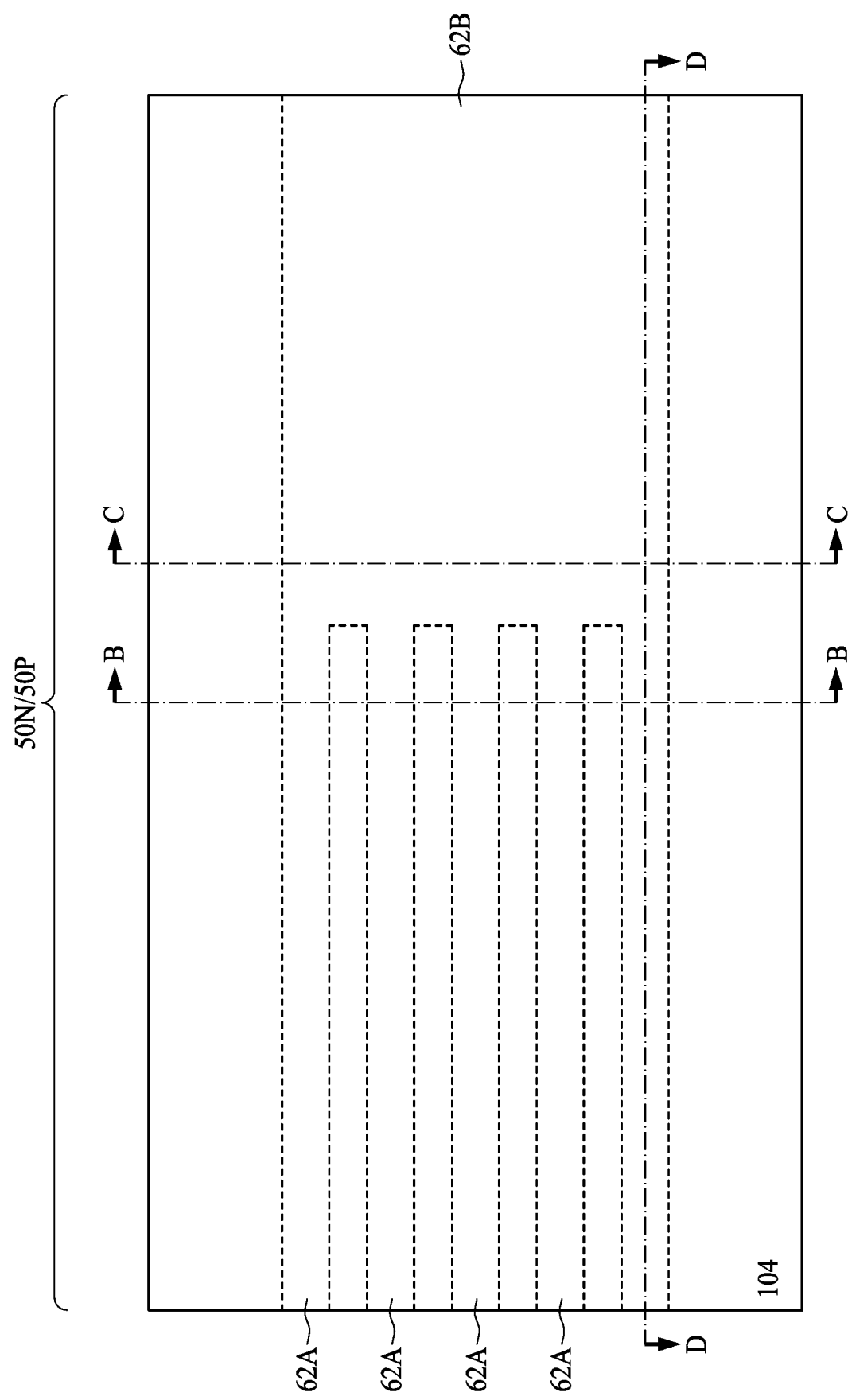
Figure 10C:
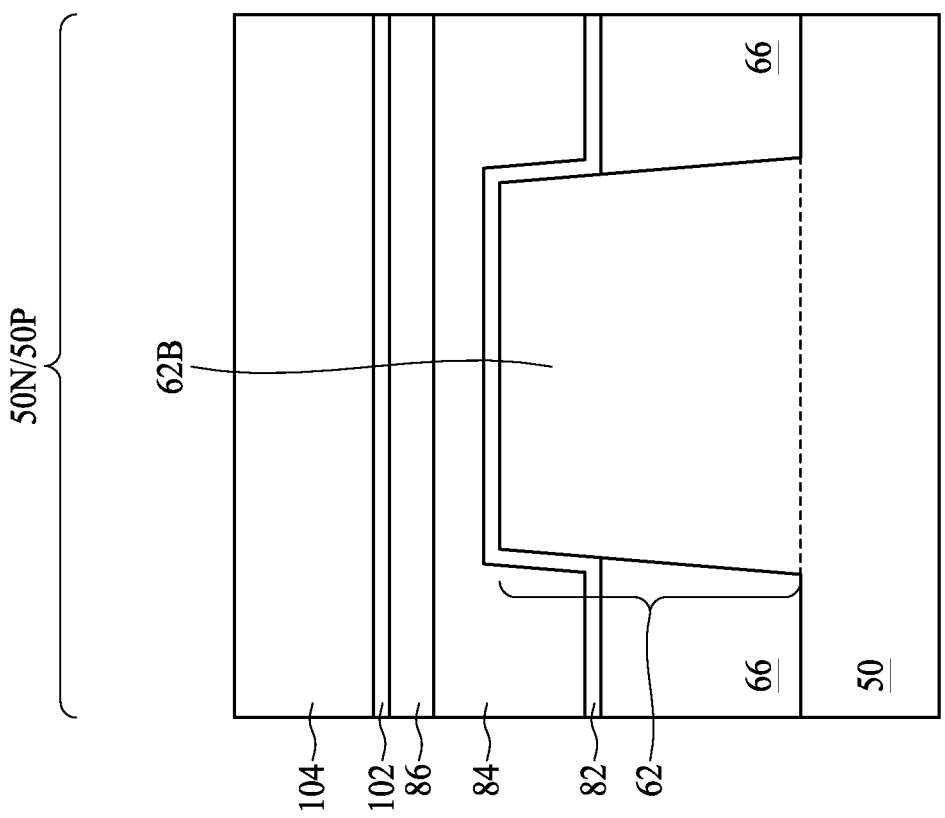
Figure 10B:
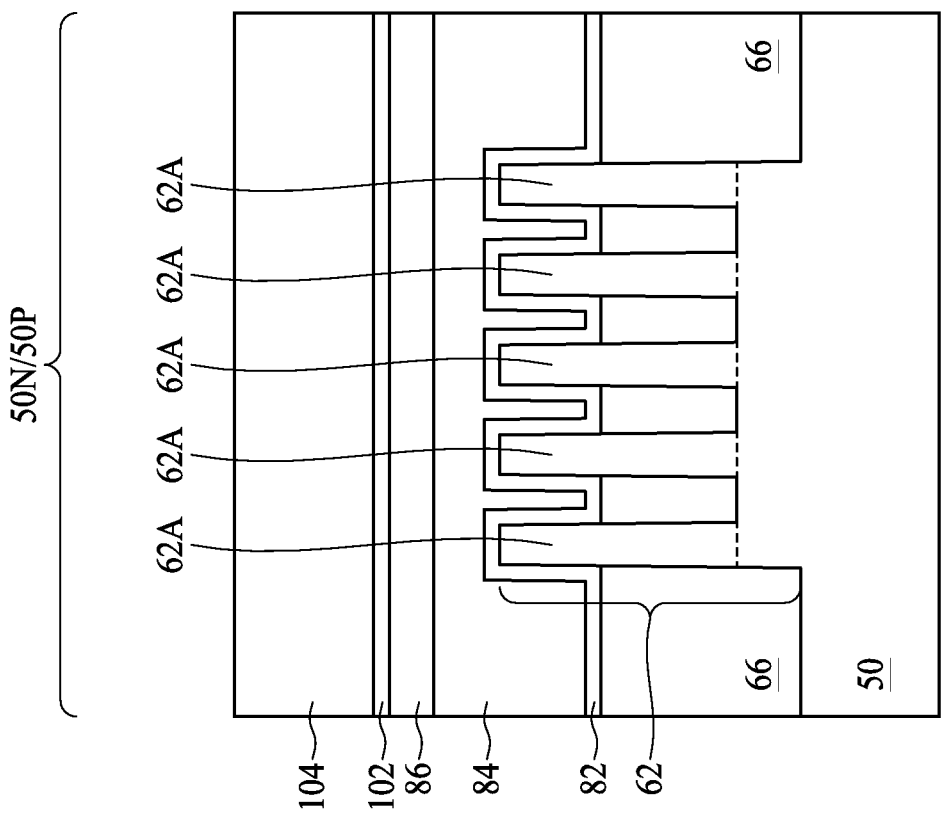
Figure 10D:
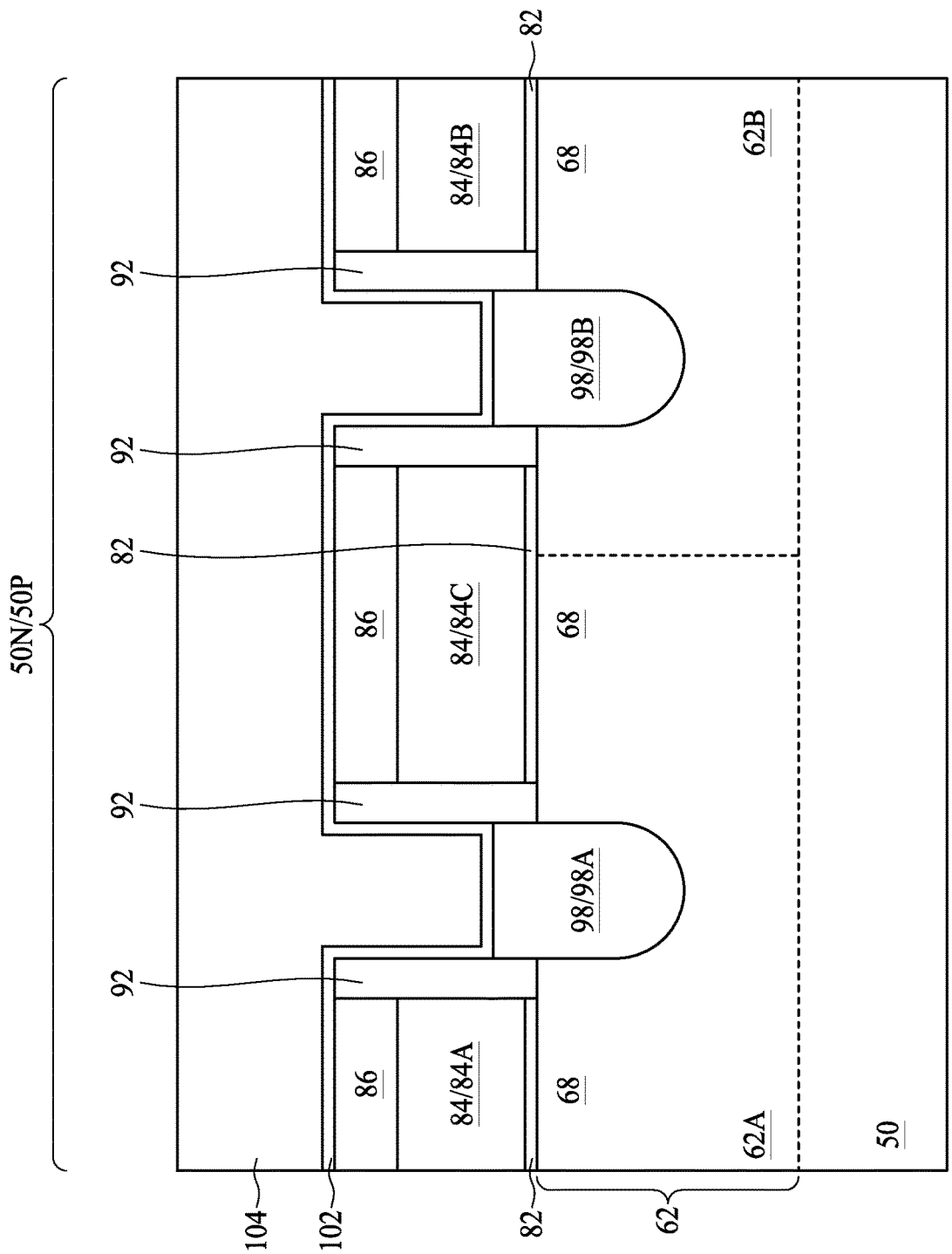
Figure 11A:
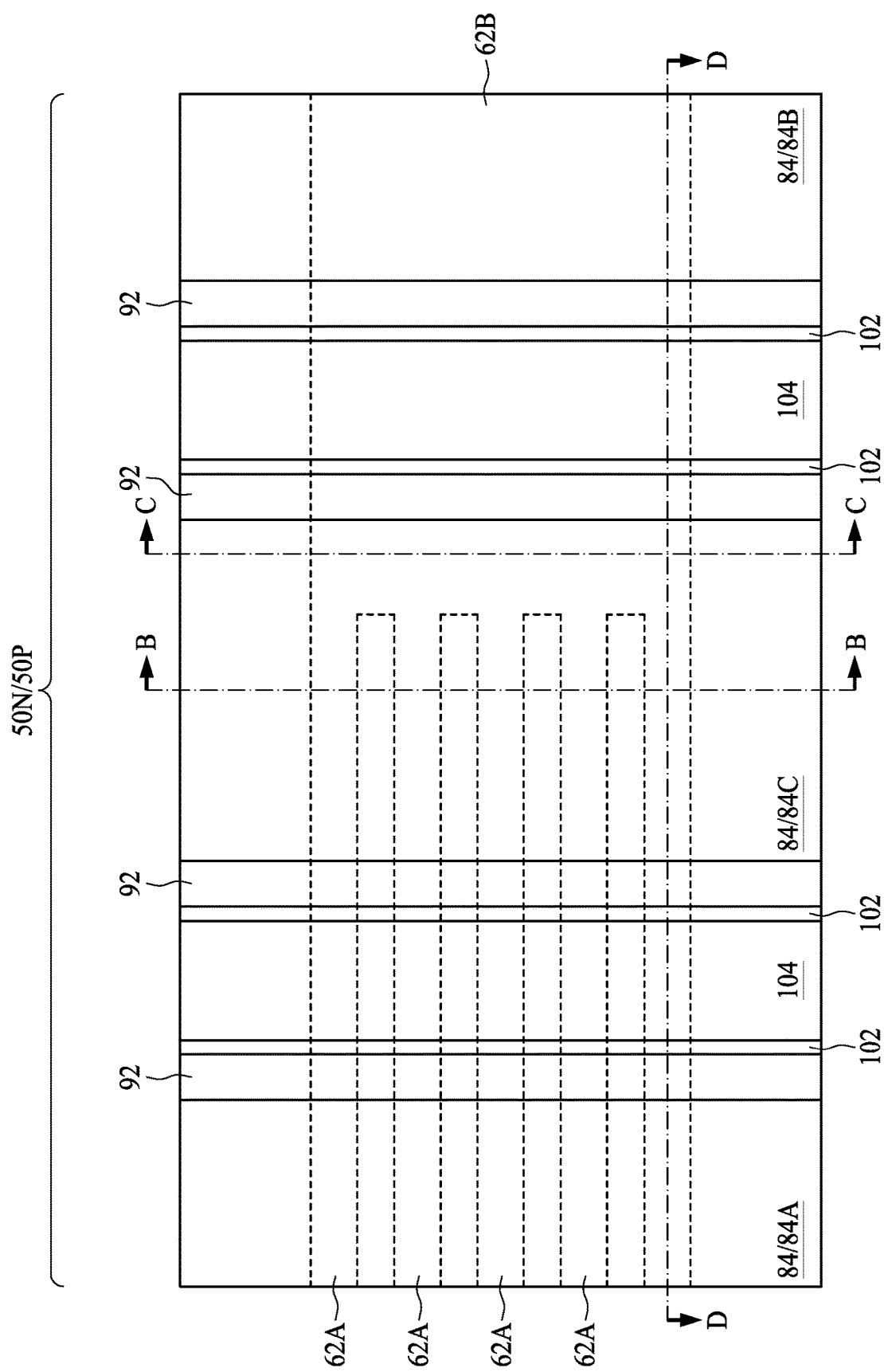
Figure 11C:
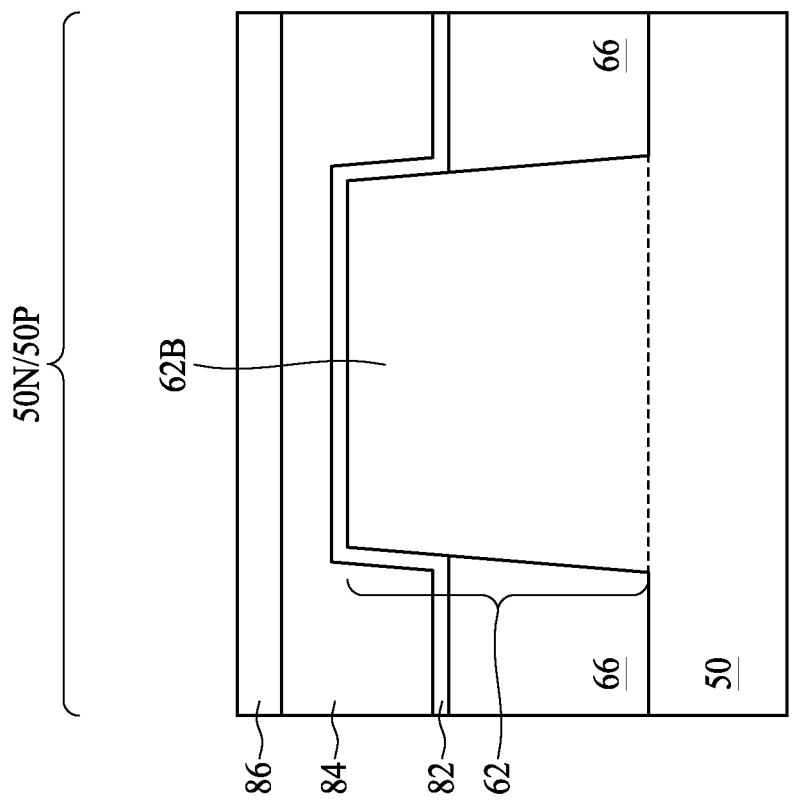
Figure 11B:
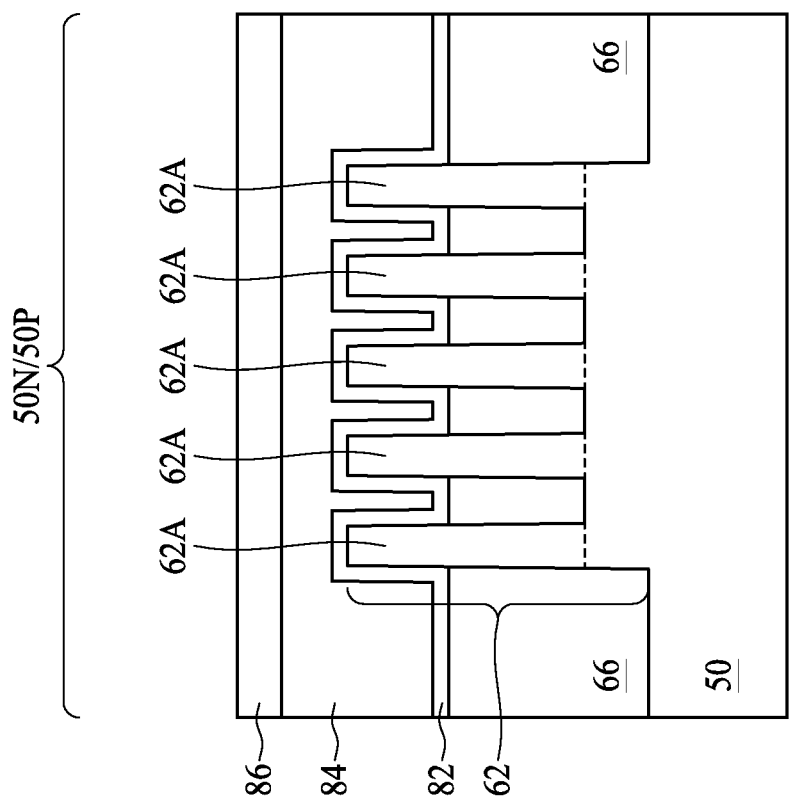
Figure 11D:
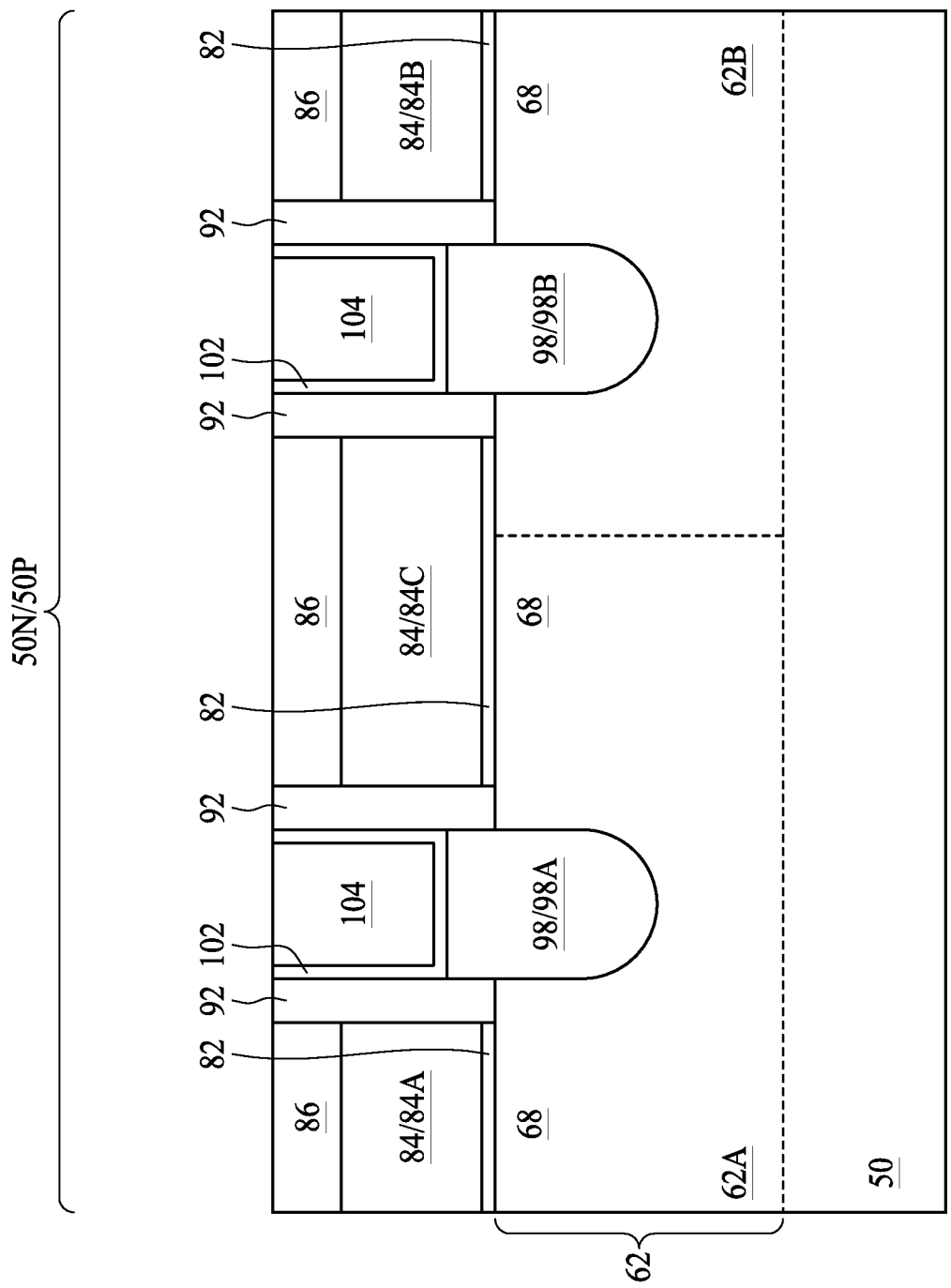
Figure 12A:
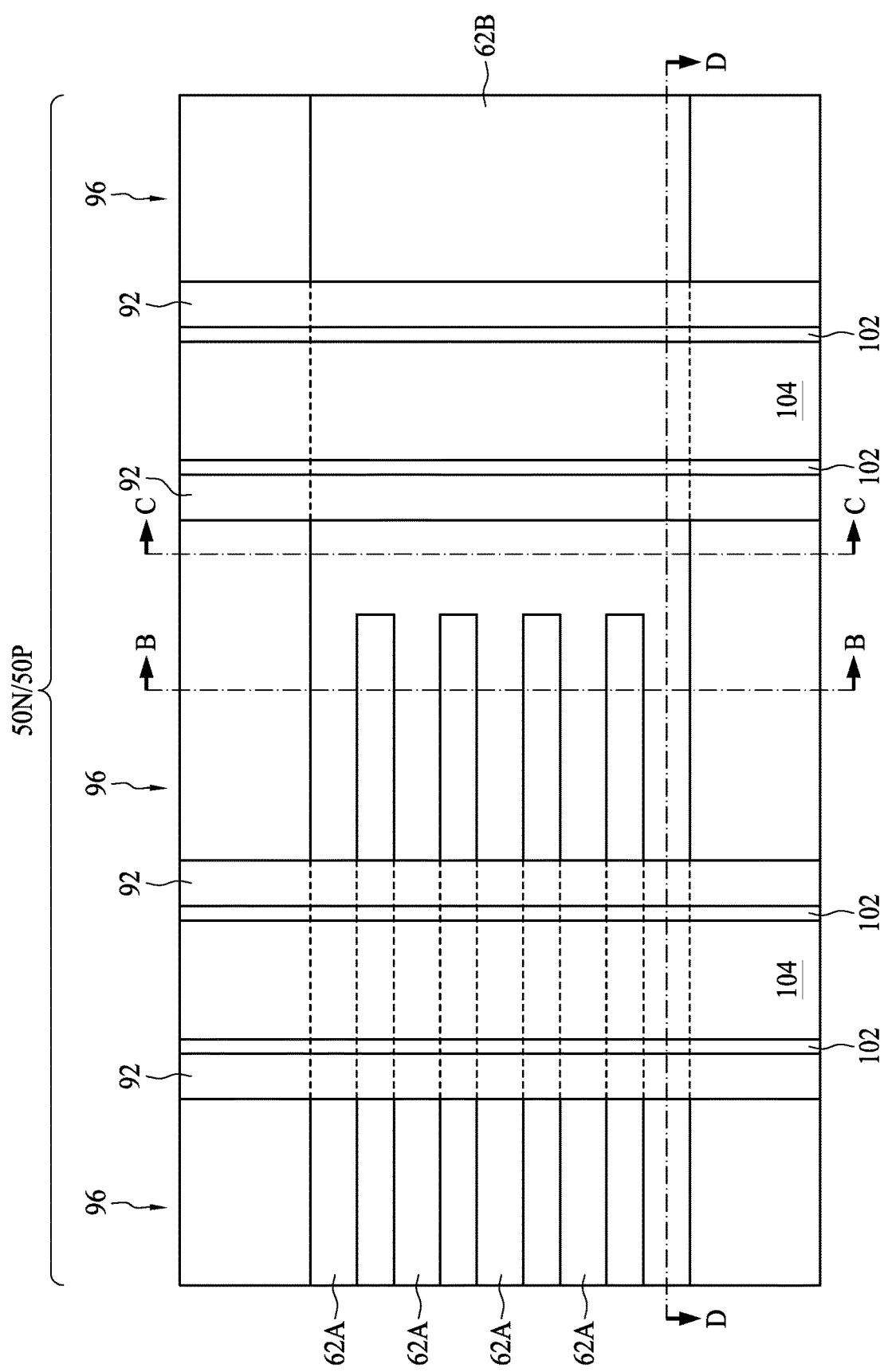
Figure 12C:
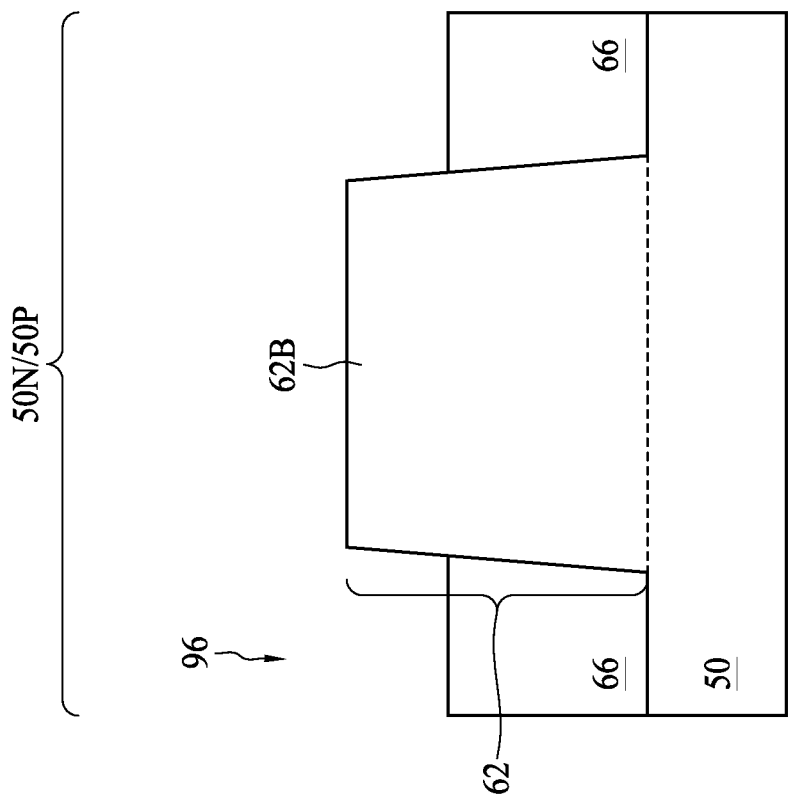
Figure 12B:
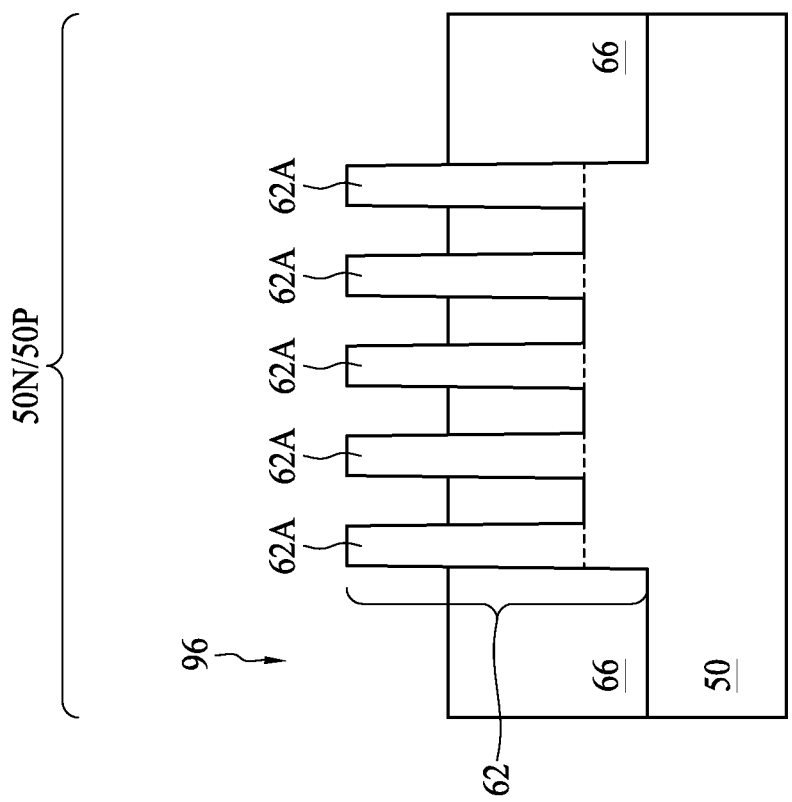
Figure 12D:
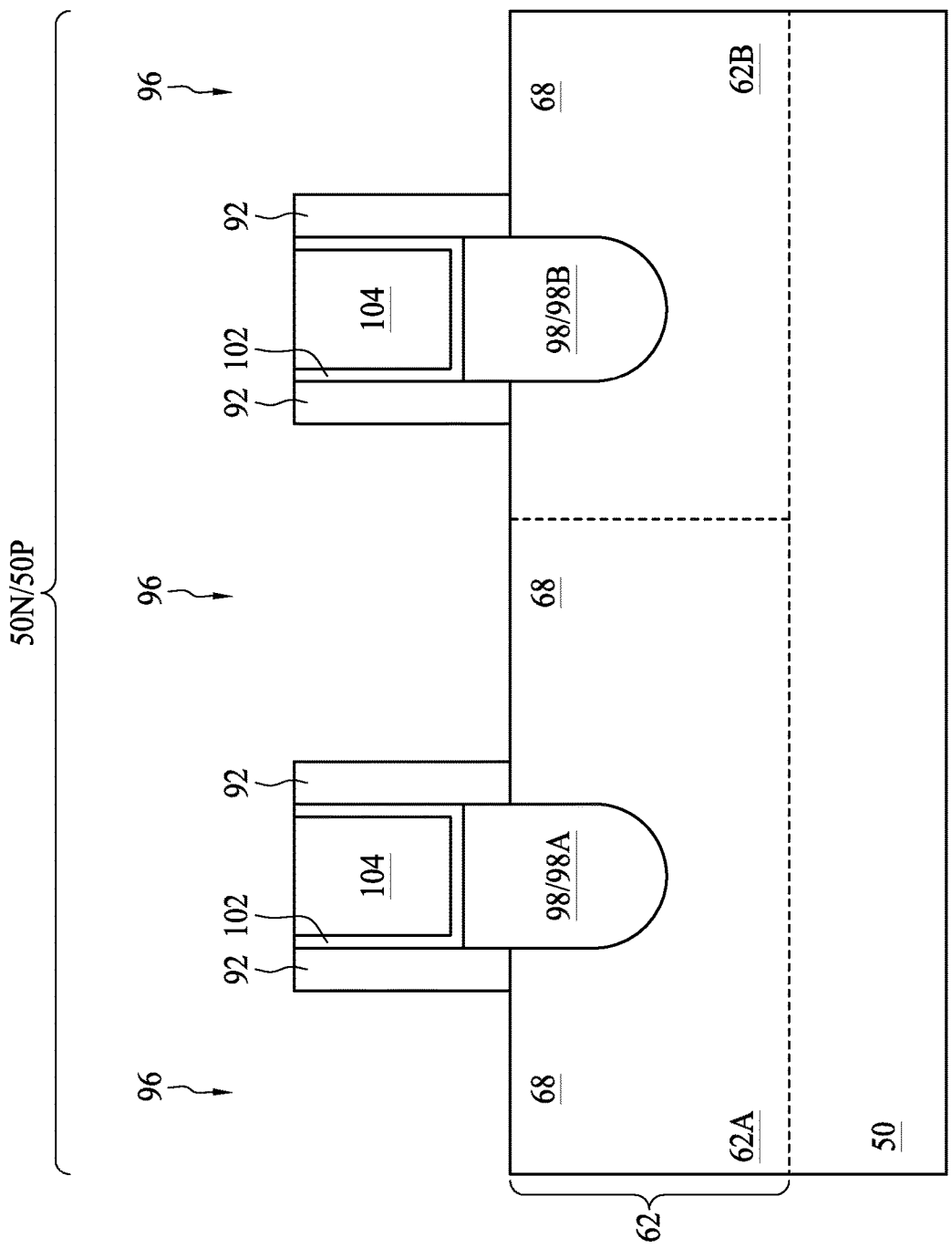
Figure 13A:
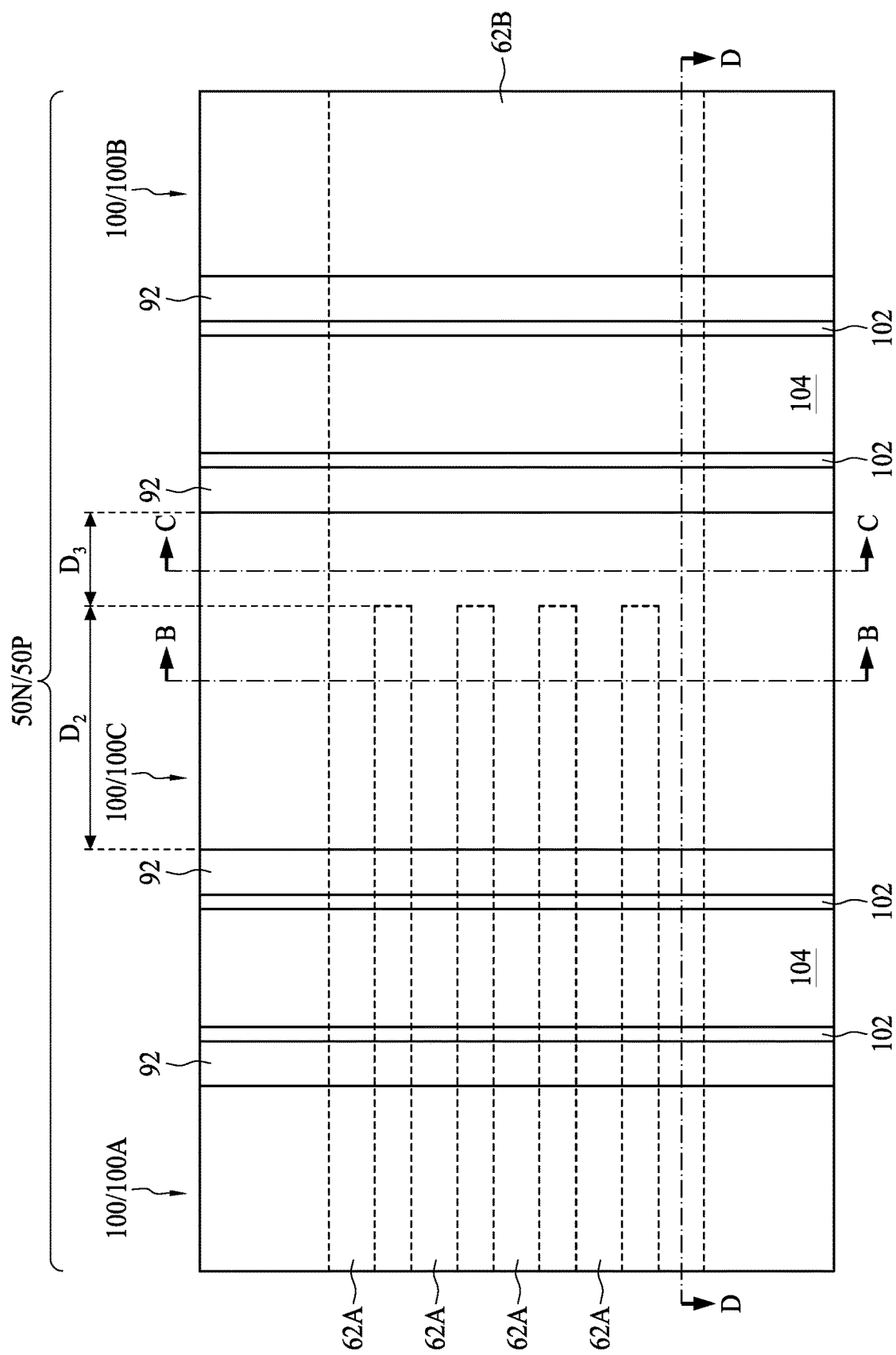
Figure 13C:
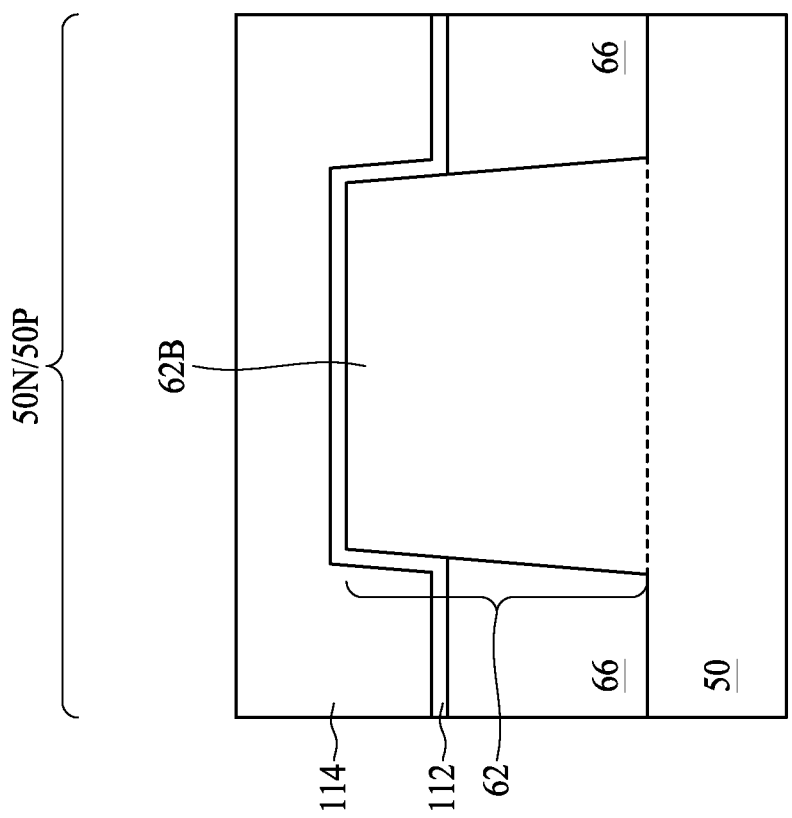
Figure 13B:
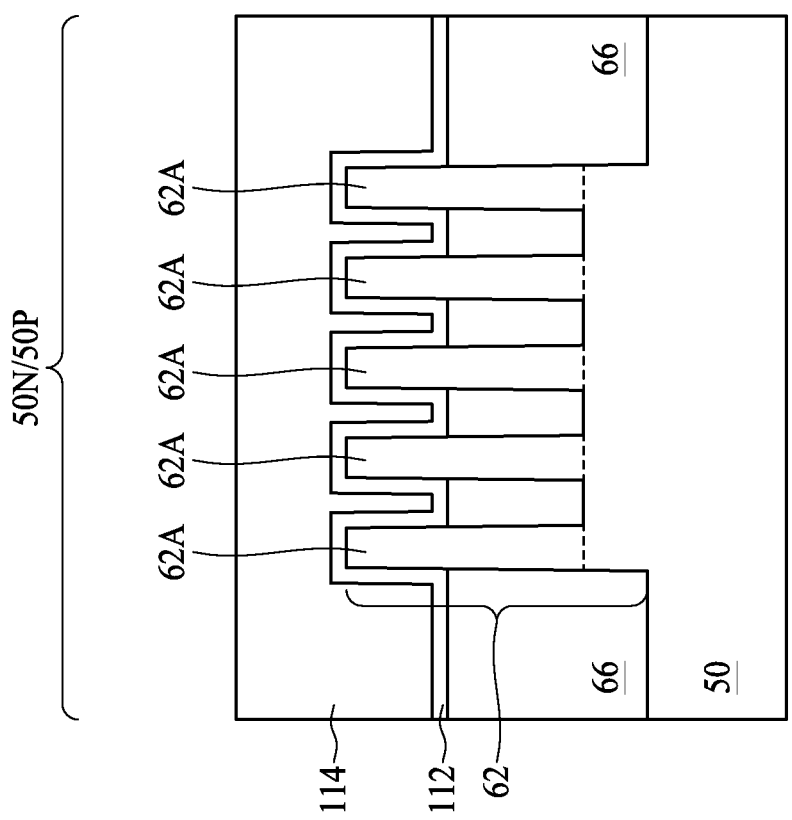
Figure 13D:
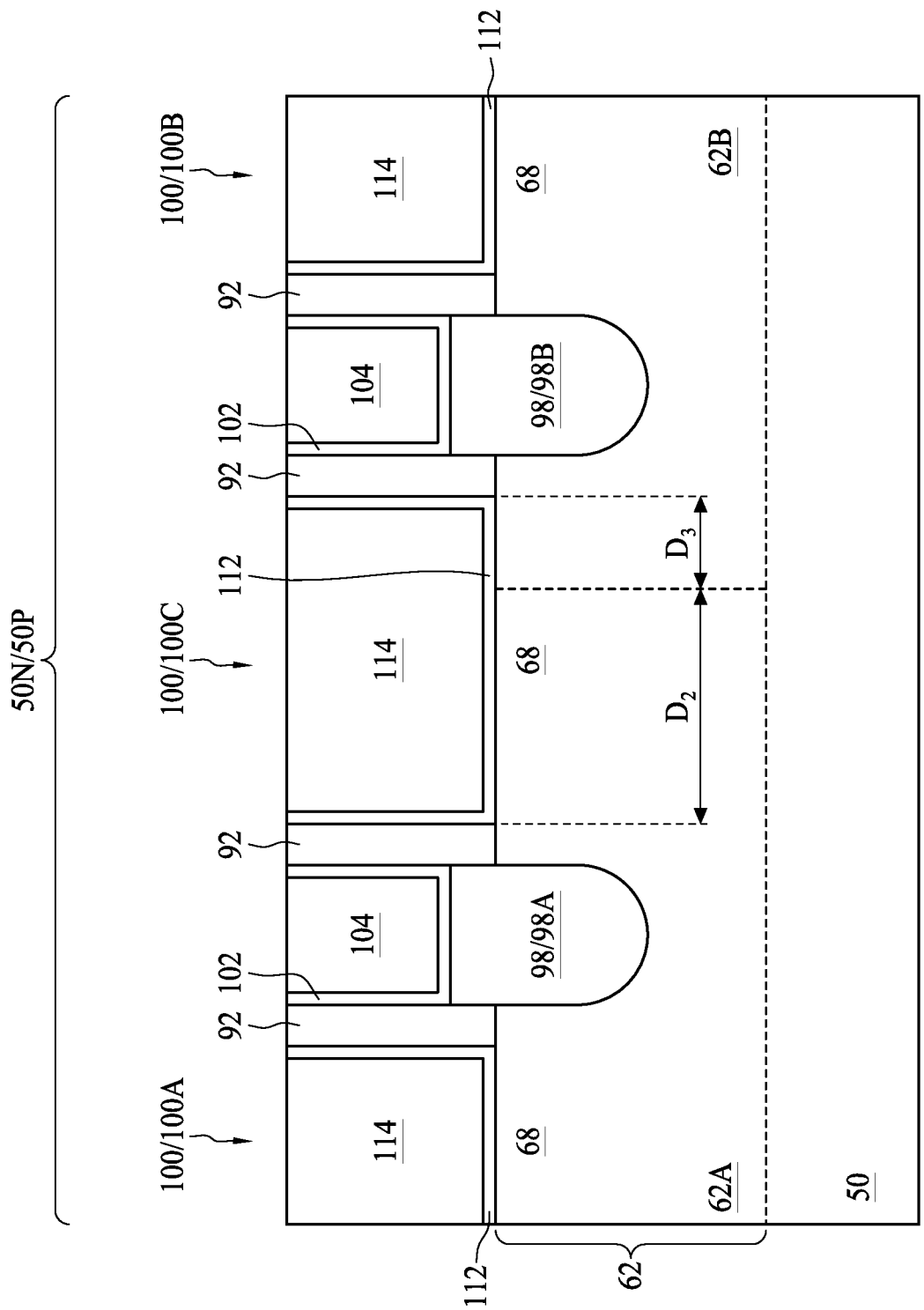
Figure 14A:
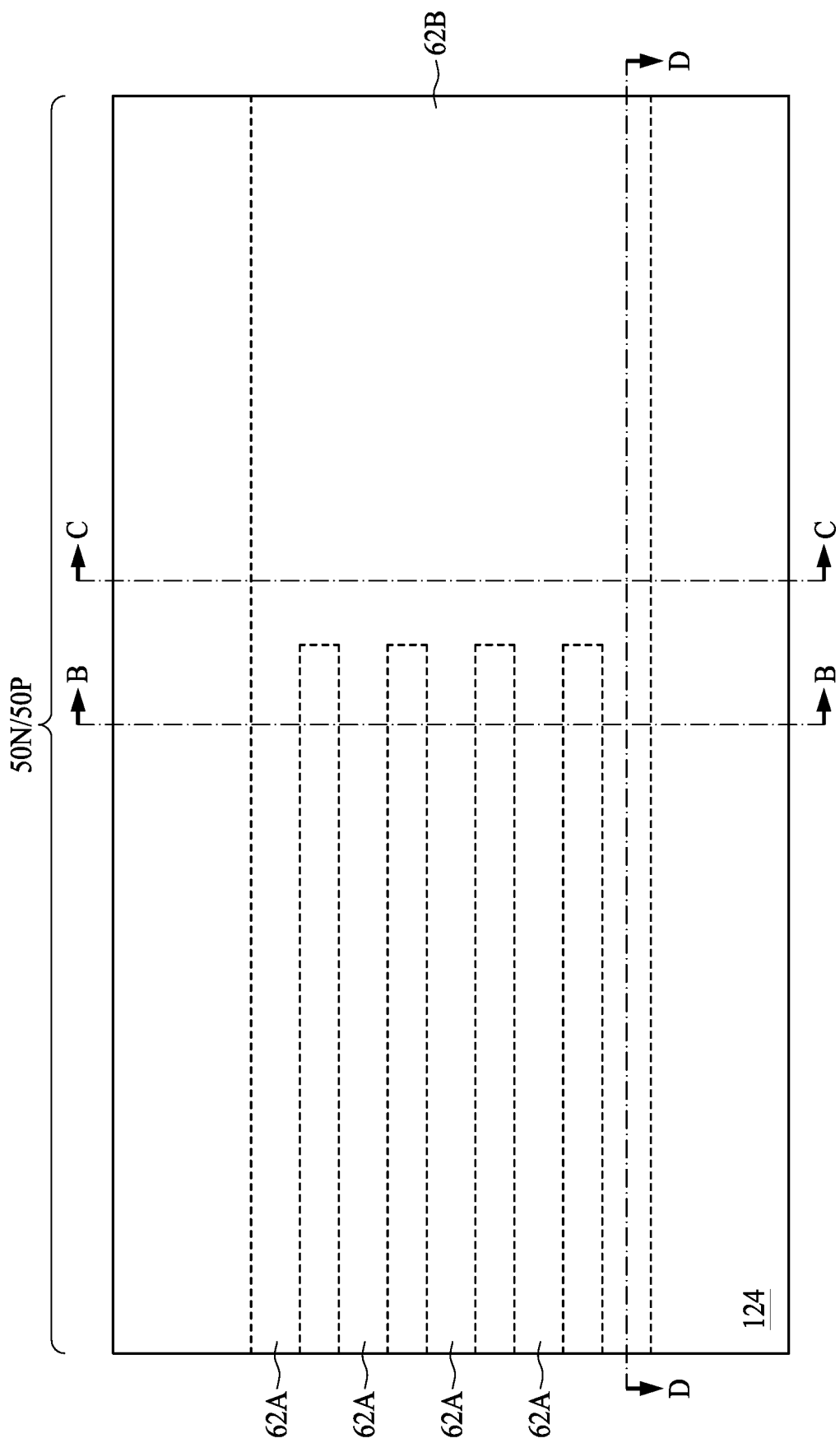
Figure 14C:
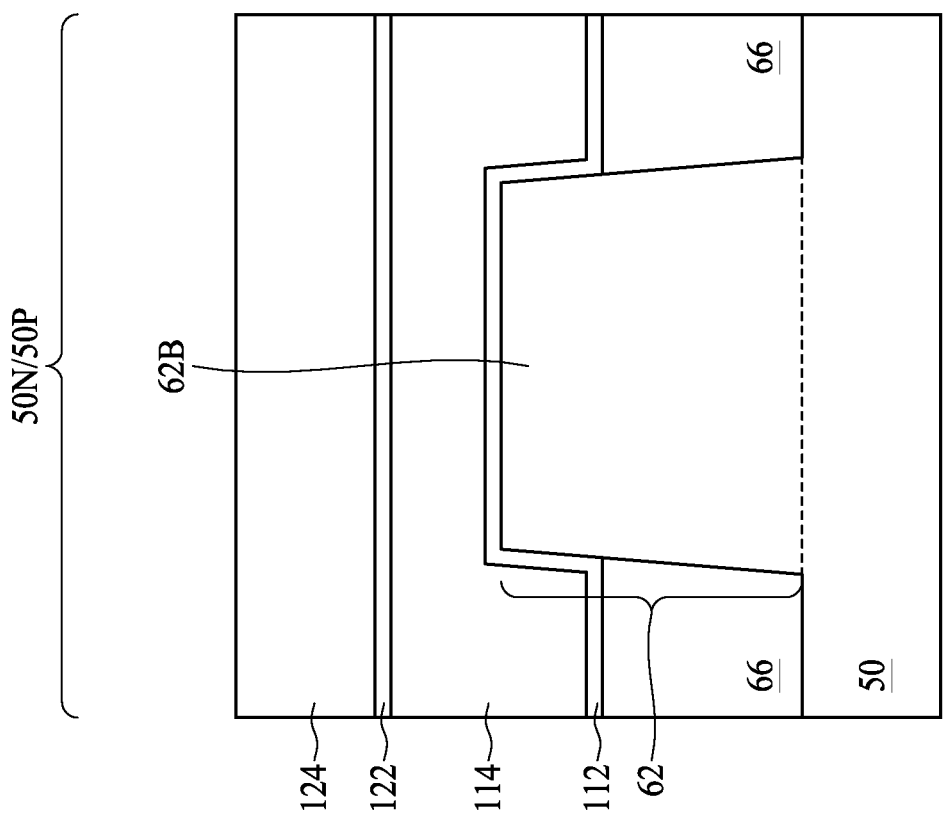
Figure 14B:
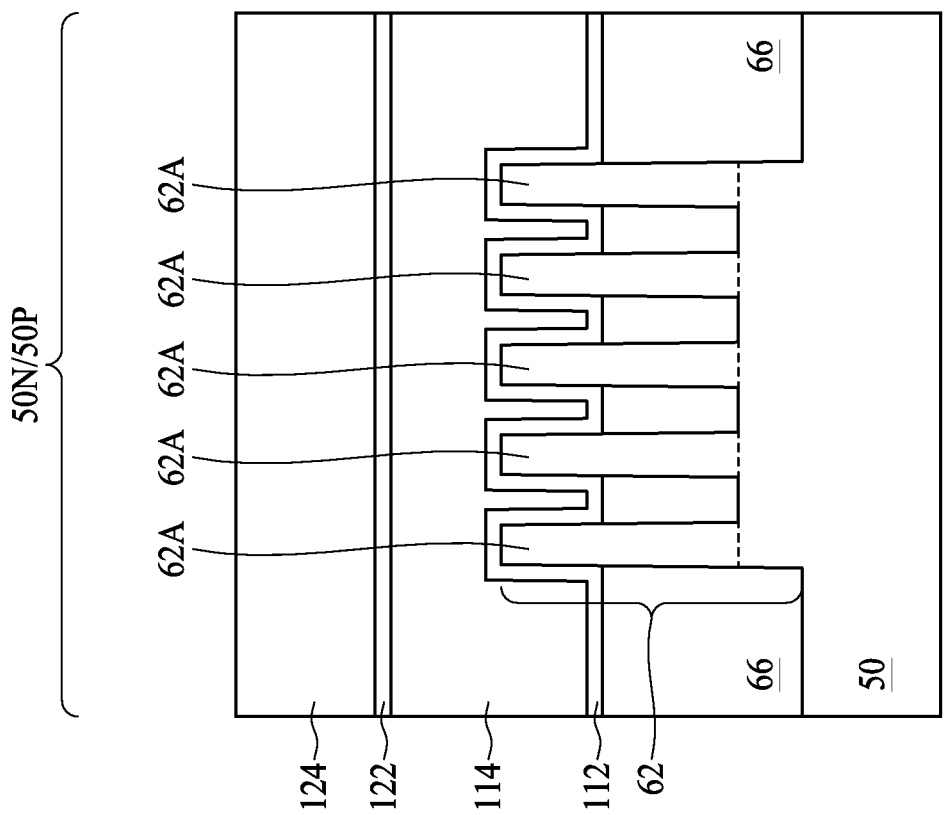
Figure 14D:
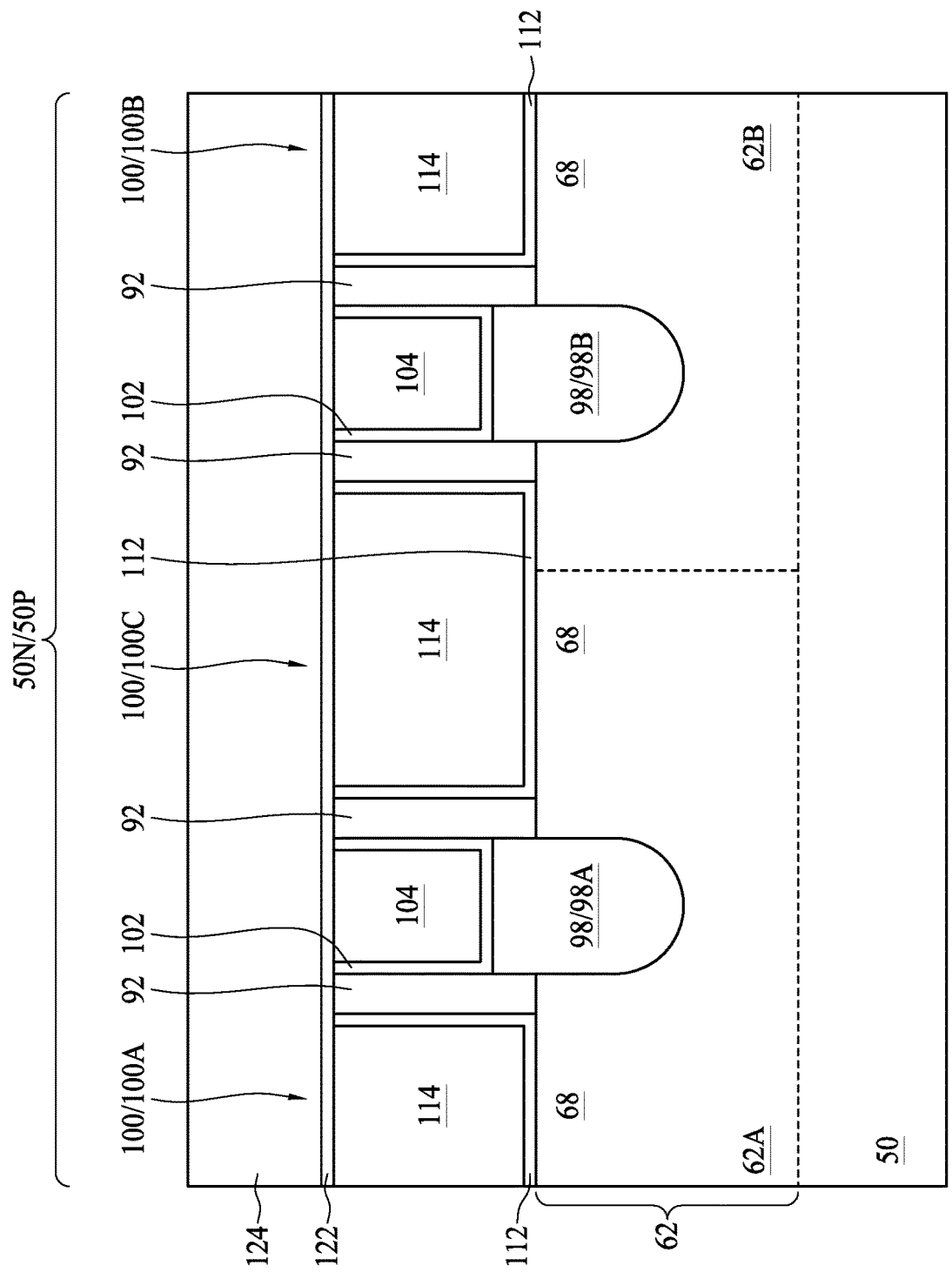
Figure 15A:
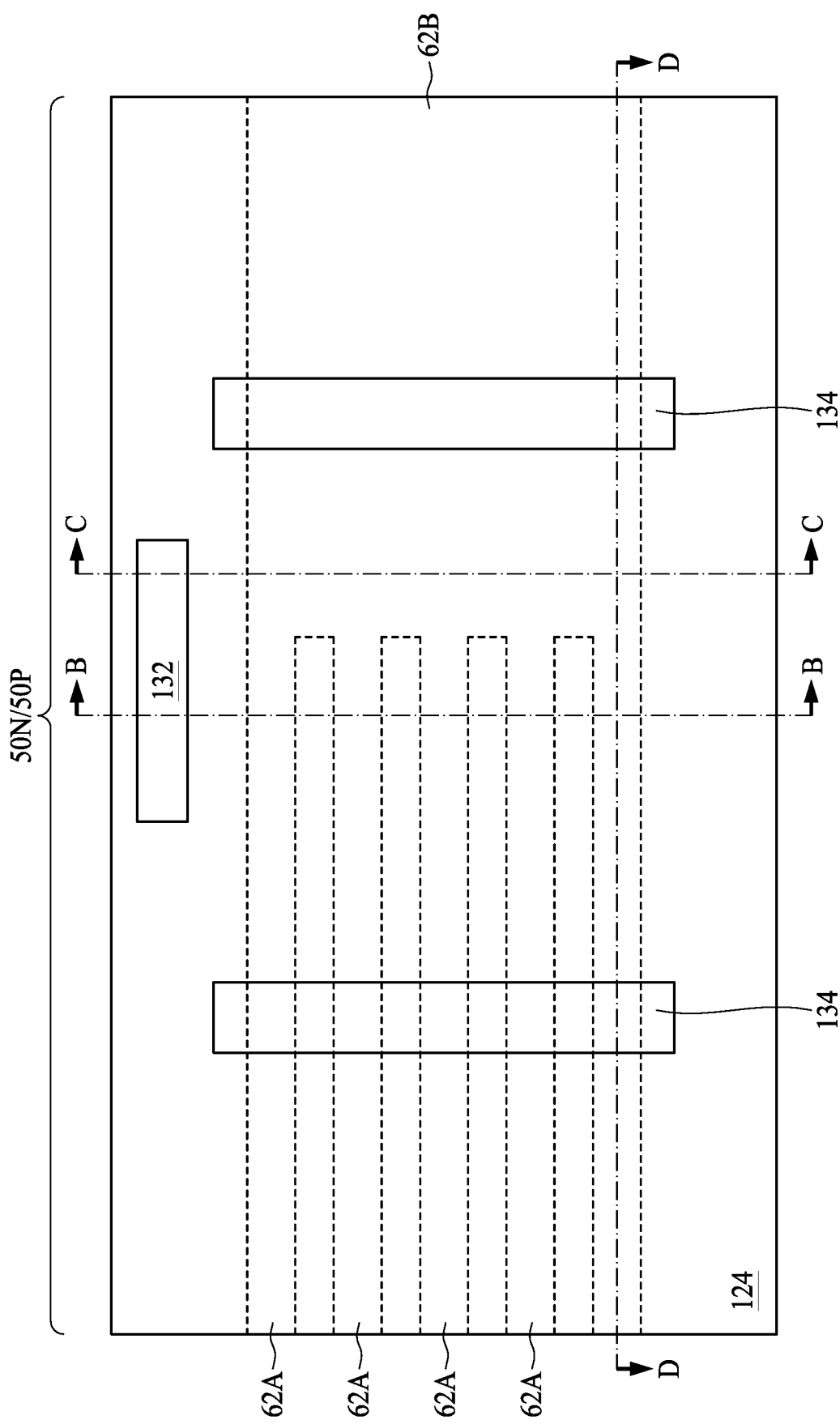
Figure 15C:
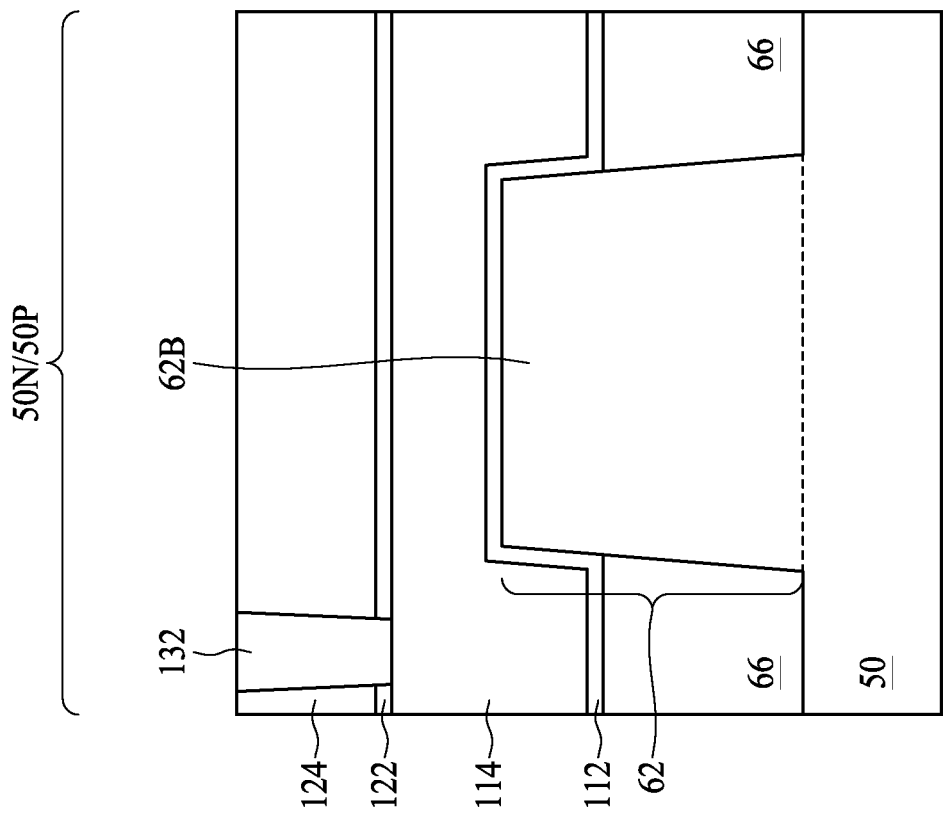
Figure 15B:
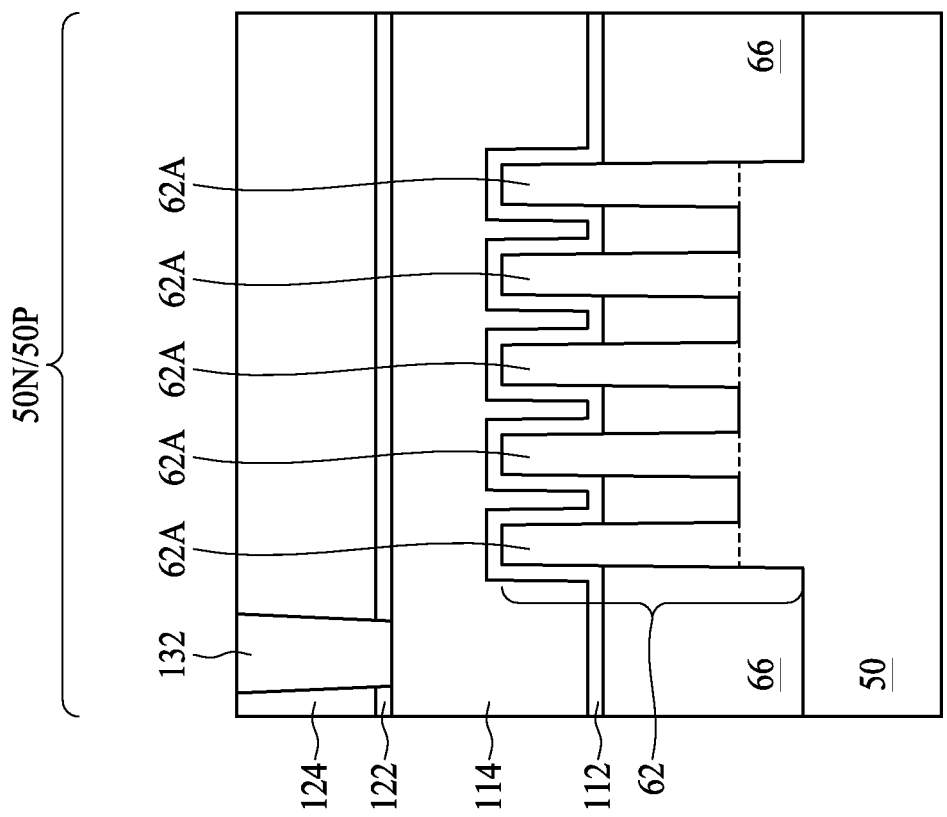
Figure 15D:
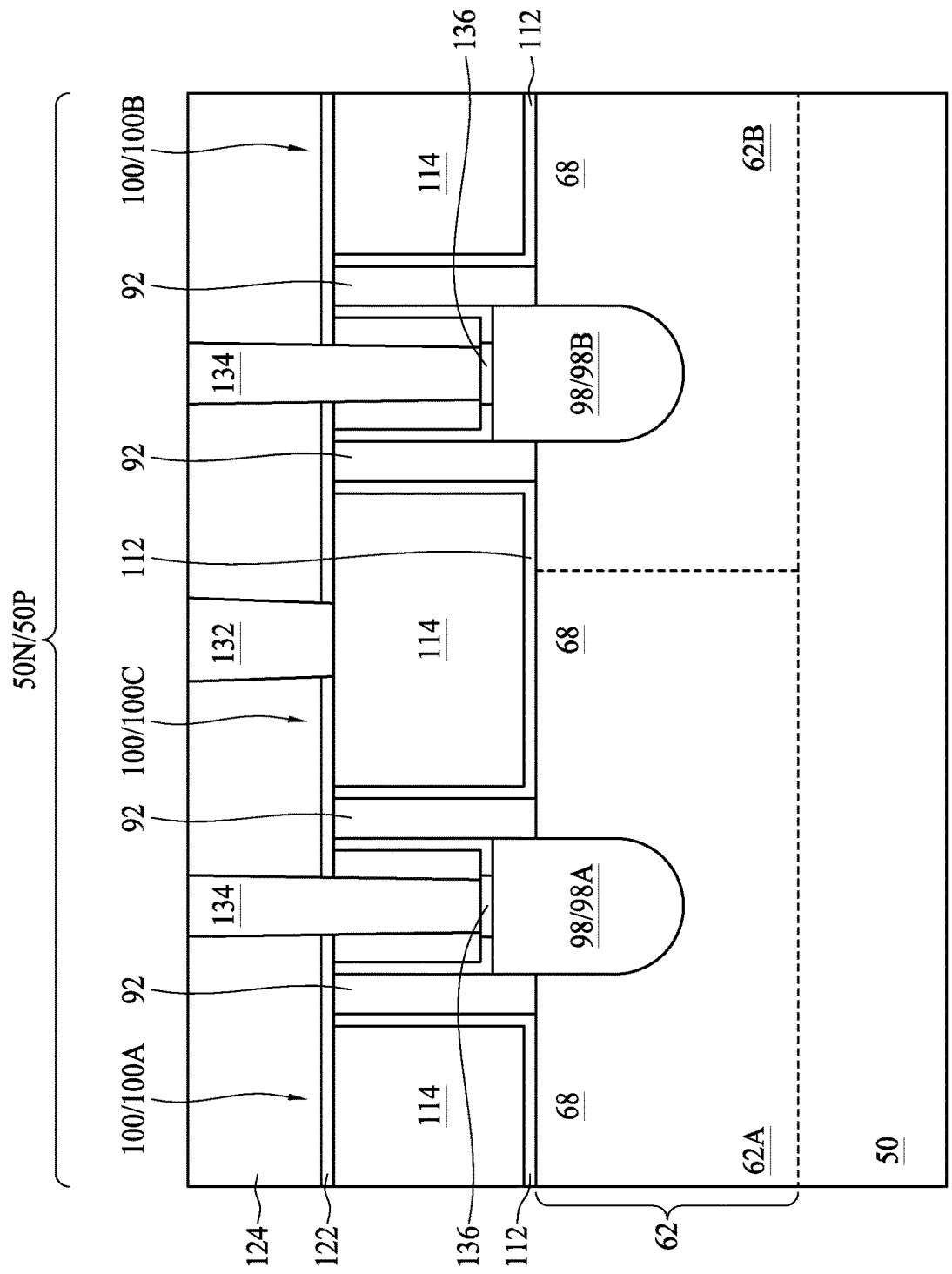

Although the source/drain regions 98 have flat top surfaces in the cross-section of FIG. 9D, the source/drain regions 98 can have different shapes in that cross-section. In some embodiments, the source/drain regions 98 have concave top surfaces as illustrated by FIG. 9G. In some embodiments, the source/drain regions 98 have convex top surfaces as illustrated by FIG. 9H. For example, the source/drain regions 98 can have concave top surfaces in the n-type region 50N and can have convex top surfaces in the p-type region 50P. Subsequent steps are shown for the embodiment of FIG. 9D.

In FIGS. 10A-10D, a first ILD 104 is deposited over the source/drain regions 98, the gate spacers 92, and the masks 86 (if present) or the dummy gates 84. The first ILD 104 may be formed of a dielectric material, and may be deposited by any suitable method, such as CVD, plasma-enhanced CVD (PECVD), or FCVD. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used In some embodiments, a CESL 102 is formed between the first ILD 104 and the source/drain regions 98, the gate spacers 92, and the masks 86 (if present) or the dummy gates 84. The CESL 102 may include a dielectric material, such as, silicon nitride, silicon oxide, silicon oxynitride, or the like, having a high etching selectivity from the etching of the first ILD 104.

In FIGS. 11A-11D, a planarization process, such as a CMP, may be performed to level the top surface of the first ILD 104 with the top surfaces of the masks 86 (if present) or the dummy gates 84. The planarization process may also remove the masks 86 on the dummy gates 84, and portions of the gate spacers 92 along sidewalls of the masks 86. After the planarization process, the top surfaces of the masks 86 (if present) or the dummy gates 84, the gate spacers 92, the CESL 102, and the first ILD 104 are coplanar (within process variations). Accordingly, the top surfaces of the masks 86 (if present) or the dummy gates 84, the gate spacers 92, and the CESL 102 are exposed through the first ILD 104. In the illustrated embodiment, the masks 86 remain, and the planarization process levels the top surface of the first ILD 104 with the top surfaces of the masks 86.

In FIGS. 12A-12D, the masks 86 (if present) and the dummy gates 84 are removed in one or more etching step(s), so that recesses 96 are formed. Portions of the dummy dielectrics 82 in the recesses 96 may also be removed. In some embodiments, only the dummy gates 84 are removed and the dummy dielectrics 82 remain and are exposed by the recesses 96. In some embodiments, the dummy dielectrics 82 are removed from recesses 96 in a first region of a die (e.g., a core logic region) and remain recesses 96 in a second region of the die (e.g., an input/output region). In some embodiments, the dummy gates 84 are removed by an anisotropic dry etch process. For example, the etching process may include a dry etch process using reaction gas(es) that selectively etch the dummy gates 84 at a faster rate than the first ILD 104 or the gate spacers 92. Each recess 96 exposes and/or overlies a channel region 68 of a respective fin structure 62. During the removal, the dummy dielectrics 82 may be used as etch stop layers when the dummy gates 84 are etched. The dummy dielectrics 82 may then be optionally removed after the removal of the dummy gates 84.

In FIGS. 13A-13D, gate dielectrics 112 and gate electrodes 114 are formed for replacement gates. The gate dielectrics 112 and the gate electrodes 114 may be collectively referred to as "gate structures." The gate structures 100 each extend along sidewalls of a channel region 68 of the fin structures 62.

The gate dielectrics 112 include one or more layers deposited in the recesses 96, such as on the top surfaces and the sidewalls of the fins 62A, 62B and on sidewalls of the gate spacers 92. In some embodiments, the gate dielectrics 112 include one or more dielectric layers, such as an oxide, a metal oxide, a metal silicate, the like, or combinations thereof. For example, in some embodiments, the gate dielectrics 112 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectrics 112 may include a dielectric layer having a k-value greater than about 7.0. The formation methods of the gate dielectrics 112 may include molecular-beam deposition (MBD), ALD, PECVD, and the like. In embodiments where portions of the dummy dielectrics 82 remain in the recesses 96, the gate dielectrics 112 include a material of the dummy dielectrics 82 (e.g., silicon oxide).

The gate electrodes 114 are deposited over the gate dielectrics 112, respectively, and fill the remaining portions of the recesses 96. The gate electrodes 114 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 114 are illustrated, the gate electrodes 114 may include any number of liner layers, any number of work function tuning layers, and a fill material. Any combination of the layers which make up the gate electrodes 114 may be deposited on the gate dielectrics 112 and in the recesses 96. After the filling of the recesses 96, a planarization process, such as a CMP, may be performed to remove the excess portions of the materials of the gate dielectrics 112 and the gate electrodes 114, which excess portions are over the top surfaces of the first ILD 104. The top surfaces of the gate spacers 92, the CESL 102, the first ILD 104, the gate dielectrics 112, and the gate electrodes 114 are thus coplanar (within process variations). The remaining portions of the materials of the gate dielectrics 112 and the gate electrodes 114 thus form replacement gates of the resulting FinFETs.

The formation of the gate dielectrics 112 in the n-type region 50N and the p-type region 50P may occur simultaneously such that the gate dielectrics 112 in each region are formed of the same materials, and the formation of the gate electrodes 114 may occur simultaneously such that the gate electrodes 114 in each region are formed of the same materials. In some embodiments, the gate dielectrics 112 in each region may be formed by distinct processes, such that the gate dielectrics 112 may be different materials, and/or the gate electrodes 114 in each region may be formed by distinct processes, such that the gate electrodes 114 may be different materials. Various masking steps may be used to mask and expose appropriate regions when using distinct processes.

A first subset of the gate structures 100A replace the dummy gates 84A and extend over the fins 62A. Thus, a first subset of FinFETs each include a gate structure 100A and a pair of the source/drain region 98A. A second subset of the gate structures 100B replace the dummy gates 84B and extend over the fins 62B. Thus, a second subset of FinFETs each include a gate structure 100B and a pair of the source/drain region 98B. A third subset of the gate structures 100C replace the dummy gates 84C and extend over both the fins 62A and the fins 62B. Thus, a third subset of FinFETs each include a gate structure 100C, a source/drain region 98A, and a source/drain region 98B.

In FIGS. 14A-14D, a second ILD 124 is deposited over the gate spacers 92, the CESL 102, the first ILD 104, the gate dielectrics 112, and the gate electrodes 114. In some embodiments, the second ILD 124 is a flowable film formed by a flowable CVD method. In some embodiments, the second ILD 124 is formed of a dielectric material such as PSG, BSG, BPSG, USG, or the like, and may be deposited by any suitable method, such as CVD and PECVD.

In some embodiments, an etch stop layer (ESL) 122 is formed between the second ILD 124 and the gate spacers 92, the CESL 102, the first ILD 104, the gate dielectrics 112, and the gate electrodes 114. The ESL 122 may include a dielectric material, such as, silicon nitride, silicon oxide, silicon oxynitride, or the like, having a high etching selectivity from the etching of the second ILD 124.

In FIGS. 15A-15D, gate contacts 132 and source/drain contacts 134 are formed to contact, respectively, the gate electrodes 114 and the source/drain regions 98. The gate contacts 132 are physically and electrically coupled to the gate electrodes 114. The source/drain contacts 134 are physically and electrically coupled to the source/drain regions 98. In some embodiments the gate contacts 132 are laterally offset from the fin structures 62, such that the gate contacts 132 laterally overlap the STI regions 66 but not the fin structures 62.

As an example to form the gate contacts 132 and the source/drain contacts 134, openings for the gate contacts 132 are formed through the second ILD 124 and the ESL 122, and openings for the source/drain contacts 134 are formed through the second ILD 124, the ESL 122, the first ILD 104, and the CESL 102. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 124. The remaining liner and conductive material form the gate contacts 132 and the source/drain contacts 134 in the openings. The gate contacts 132 and the source/drain contacts 134 may be formed in distinct processes, or may be formed in the same process.

Optionally, metal-semiconductor alloy regions 136 are formed at the interface between the source/drain regions 98 and the source/drain contacts 134. The metal-semiconductor alloy regions 136 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 136 can be formed before the material(s) of the source/drain contacts 134 by depositing a metal in the openings for the source/drain contacts 134 and then performing a thermal anneal process. The metal can be any metal capable of reacting with the semiconductor materials (e.g., silicon, silicon-germanium, germanium, etc.) of the source/drain regions 98 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 134, such as from surfaces of the metal-semiconductor alloy regions 136. The material(s) of the source/drain contacts 134 can then be formed on the metal-semiconductor alloy regions 136.

Figure 16:
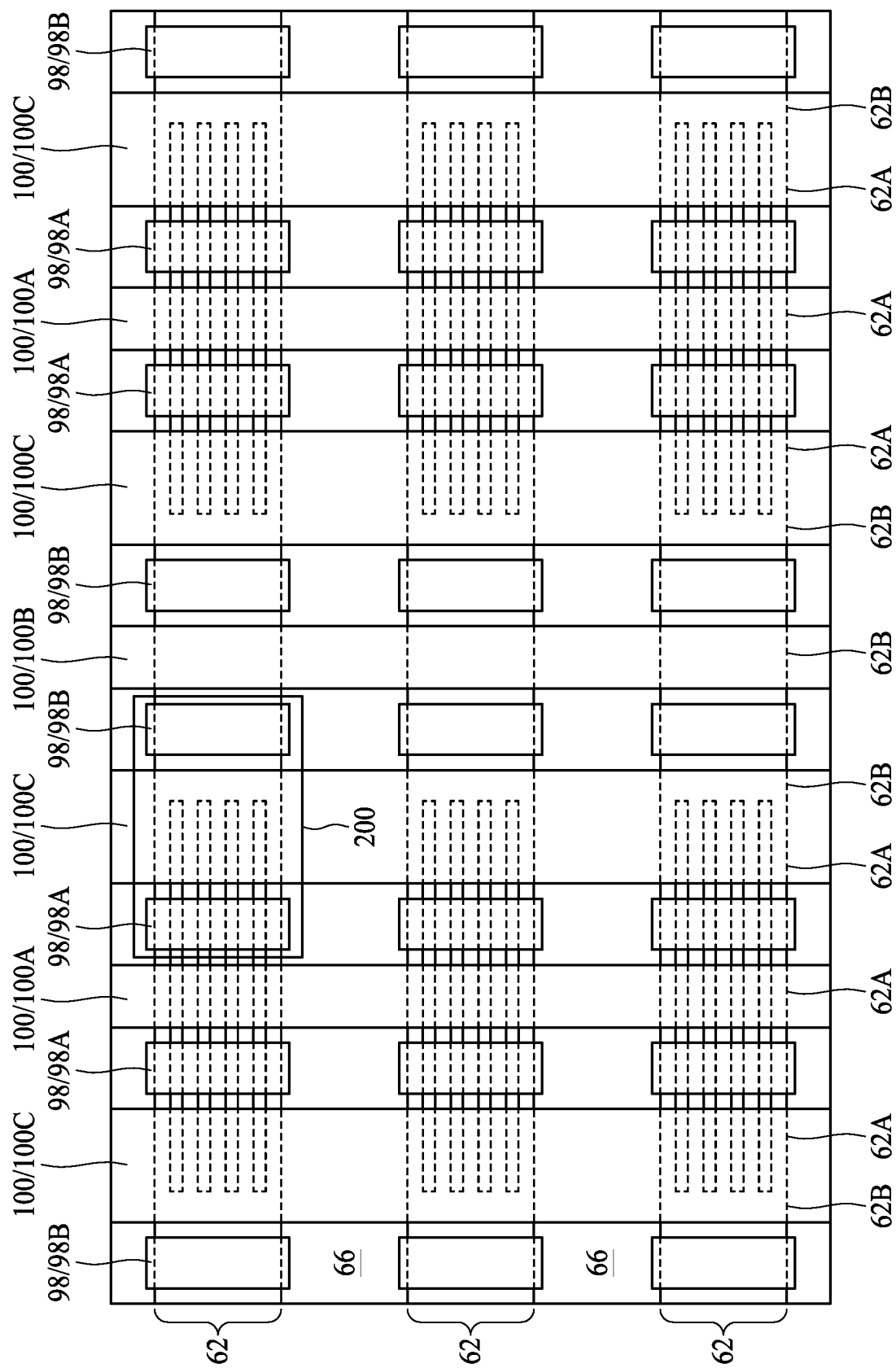
FIG. 16 is a view of FinFETs, in accordance with some embodiments.

FIG. 16 is a view of FinFETs, in accordance with some embodiments. Some features of the FinFETs are omitted for illustration clarity. FIG. 16 is a top-down view of the devices of FIGS. 15A-15D, more clearly showing how multiple fin structures 62 can be formed, and how the fin structures 62 can have multiple fins 62B. Specifically, the fin structures 62 can alternate between the fins 62A and the fins 62B along the lengths of the fin structures 62. The FinFETs 200 are symmetric along the lengths of the fin structures 62. The gate structures 100A extend over the fins 62A of multiple fin structures 62. The gate structures 100B extend over the fins 62B of multiple fin structures 62. The gate structures 100C extend over the fins 62A, 62B of multiple fin structures 62.

The gate structures 100A, 100B, 100C are used for FinFETs that operate at different voltages. The gate structures 100A are used for FinFETs that operate in a low voltage range (e.g., from about 0.8 volts to about 3 volts), such as FinFETs for core logic devices, because the channel regions 68 in the fins 62A have better gate control capability. The gate structures 100B are used for FinFETs that operate in a high voltage range (e.g., from about 3 volts to about 12 volts), such as FinFETs for input/output devices, because the channel regions 68 in the fins 62B can be driven to a greater voltage. The gate structures 100C are used for FinFETs that operate in a medium voltage range (e.g., from about 2.5 volts to about 8 volts), such as FinFETs for input/output devices that still need good gate control capability.

In some embodiments, the FinFETs are interconnected (e.g., by metallization layers in an overlying interconnect structure) so that the source/drain regions 98A function as source regions and the source/drain regions 98B function as drain regions. In some types of devices, such as devices operating in a medium voltage range or a high voltage range, the drain terminals are operated at a greater voltage than the source terminals, which can cause hot carrier injection (HCI) at the drain regions to be worse than at the source regions, degrading the performance of such devices. Because the source/drain regions 98B and the portions of the channel regions 68 in the fins 62B are larger, they can withstand greater voltages than their smaller counterparts (e.g., the source/drain regions 98A and the portions of the channel regions 68 in the fins 62A), thereby reducing hot carrier injection at the drain regions. The on/off current (e.g., $I_{ON}/I_{OFF}$) of the devices may thus be improved.

The length of the channel regions 68 under the gate structures 100 can be in the range of about 86 nm to about 1000 nm, with a greater channel length being used for devices that have greater operating voltages. In some embodiments, the length of the channel regions 68 under the gate structures 100C is greater than the length of the channel regions 68 under the gate structures 100B, and the length of the channel regions 68 under the gate structures 100B is greater than the length of the channel regions 68 under the gate structures 100A.

Referring back to FIGS. 13A and 13D, the channel regions 68 under the gate structures 100C have portions in the fins 62A and portions in the fins 62B. The gate structures 100C overlap the portions of the channel regions 68 in the fins 62A by a distance $D_2$ and overlap the portions of the channel regions 68 in the fins 62B by a distance $D_3$. The distances $D_2$, $D_3$ are determined by the operating voltages of the FinFETs, with a lesser distance $D_2$ and a greater distance $D_3$ being used for devices that have greater operating voltages. The distance $D_2$ can be from about 85% to about 99% of the length of the channel regions 68 under the gate structures 100C, and the distance $D_3$ can be from about 1% to about 15% of the length of the channel regions 68 under the gate structures 100C. In an example where the gate structures 100C are part of FinFETs that have an operating voltage in the range of about 3 volts to about 5 volts, the length of the channel regions 68 under the gate structures 100C can be in the range of about 240 nm to about 500 nm, the distance $D_2$ can be in the range of about 200 nm to about 495 nm, and the distance $D_3$ can be in the range of about 5 nm to about 75 nm. In another example where the gate structures 100C are part of FinFETs that have an operating voltage in the range of about 5 volts to about 8 volts, the length of the channel regions 68 under the gate structures 100C can be in the range of about 500 nm to about 1000 nm, the distance $D_2$ can be in the range of about 425 nm to about 990 nm, and the distance $D_3$ can be in the range of about 10 nm to about 150 nm. In yet another example where the gate structures 100C are part of FinFETs that have an operating voltage in the range of about 8 volts to about 12 volts, the length of the channel regions 68 under the gate structures 100C can be greater than about 750 nm, the distance $D_2$ can be greater than about 625 nm, and the distance $D_3$ can be greater than about 100 nm.

Figure 17A:
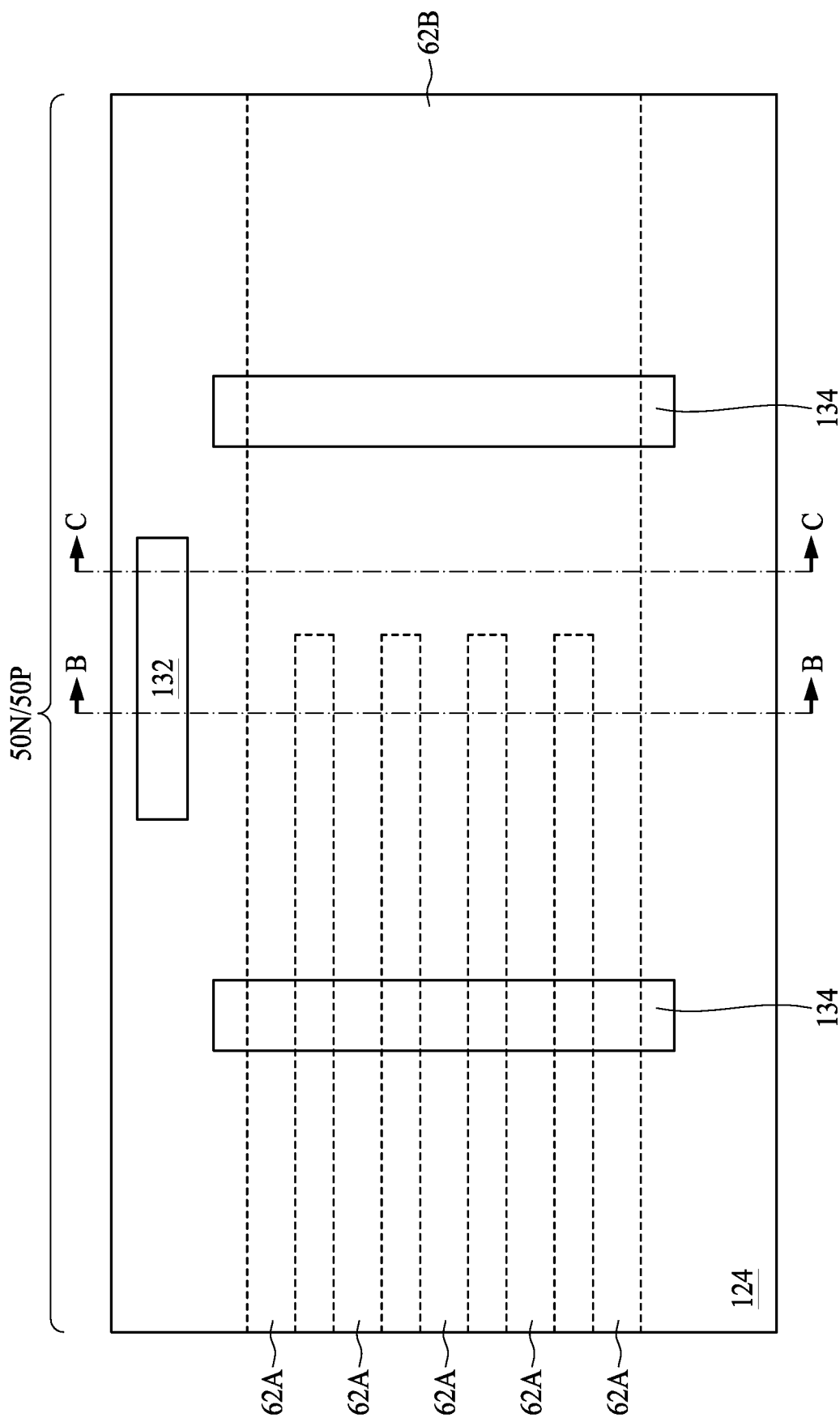
FIGS. 17A-17C are views of FETs, in accordance with some embodiments.
Figure 17B:
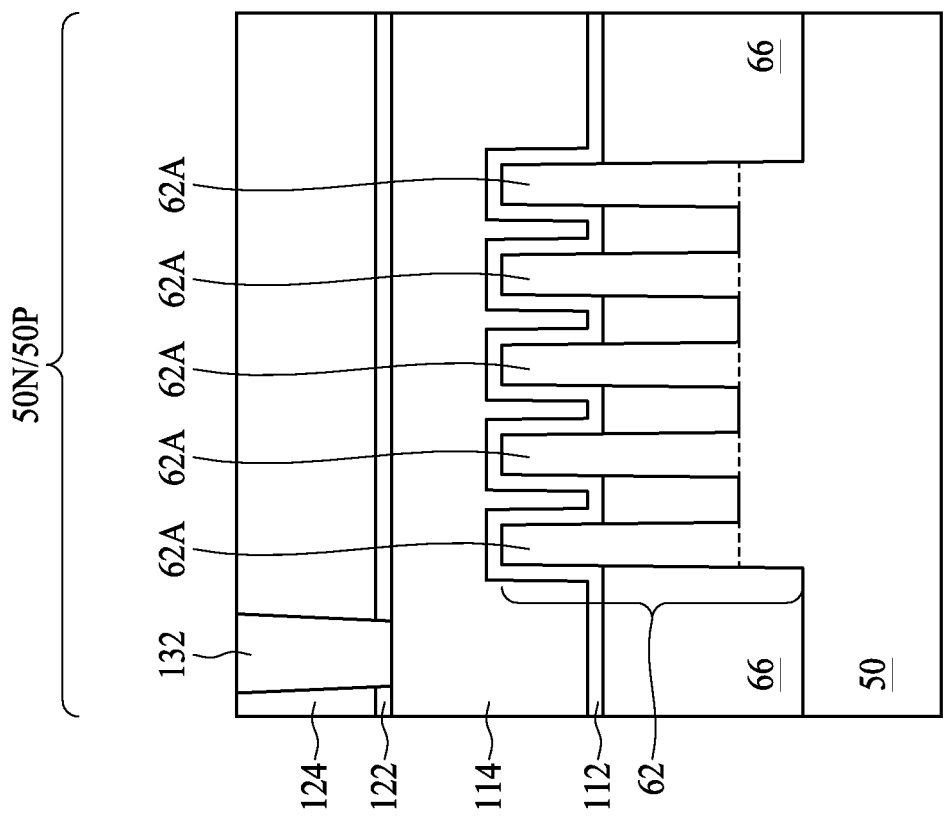
Figure 17C:
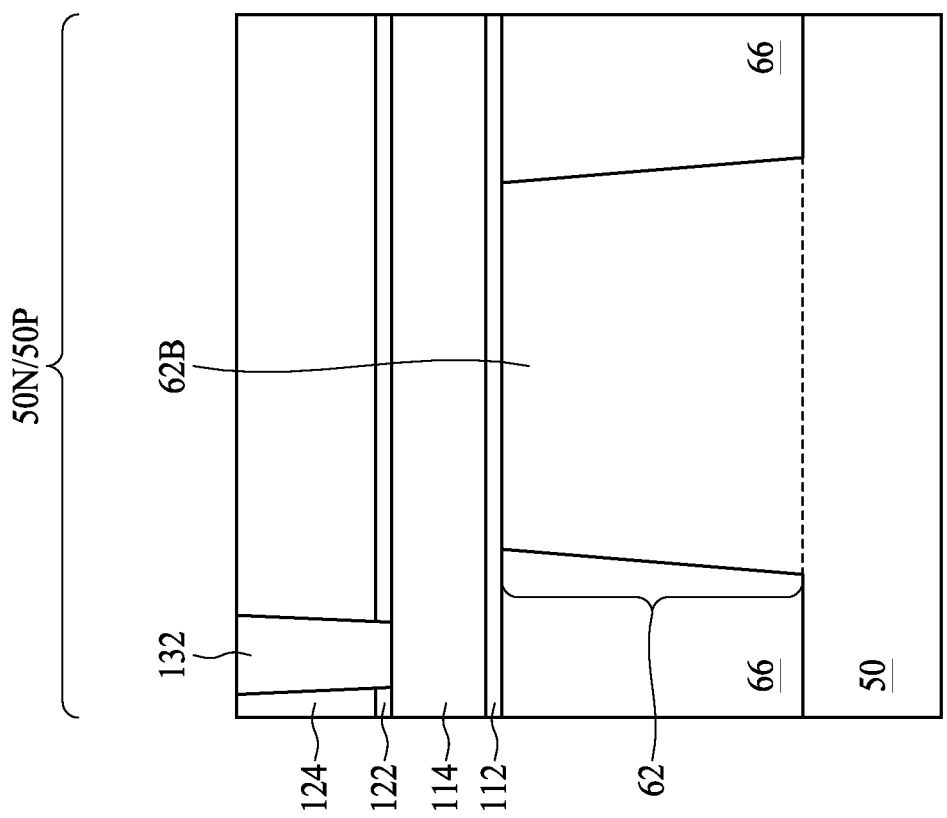

FIGS. 17A-17C are views of FETs, in accordance with some embodiments. This embodiment is similar to the embodiment of FIGS. 15A-15C, except the insulation material of the STI regions 66 is only recessed around the fins 62A, but not the fins 62B. Thus, the fins 62A protrude from between adjacent STI regions 66, but the top surfaces of the fins 62B are coplanar with the top surfaces of the STI regions 66. Accordingly, a first subset of the devices (e.g., the devices that include the gate structures 100A) are FinFETs where the gate structures 100 extend along sidewalls of the fins 62A, 62B, a second subset of the devices (e.g., the devices that include the gate structures 100B) are planar FETs where the gate structures 100 do not extend along sidewalls of the fins 62A, 62B, and a third subset of the devices (e.g., the devices that include the gate structures 100C) are hybrid devices that include both FinFET aspects and planar FET aspects.

Figure 18A:
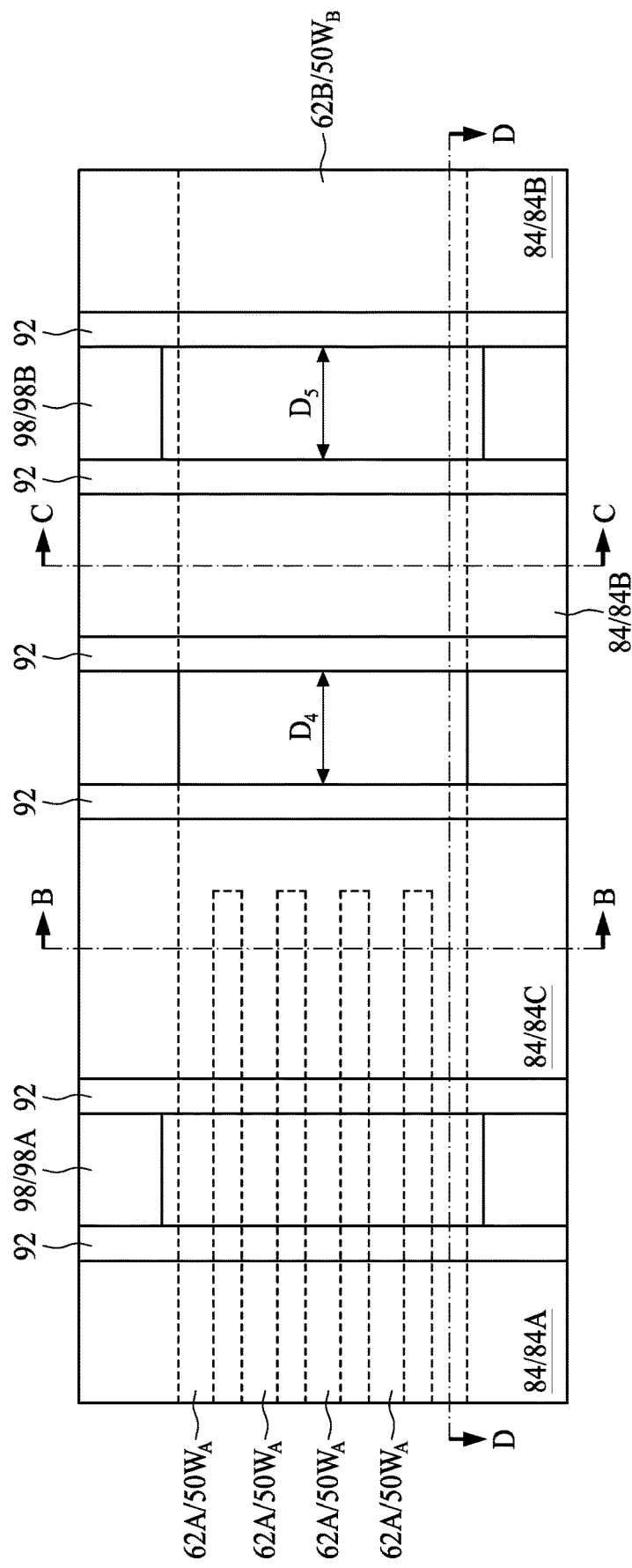
FIGS. 18A-20D are views of intermediate stages in the manufacturing of FinFETs, in accordance with some embodiments.
Figure 18C:
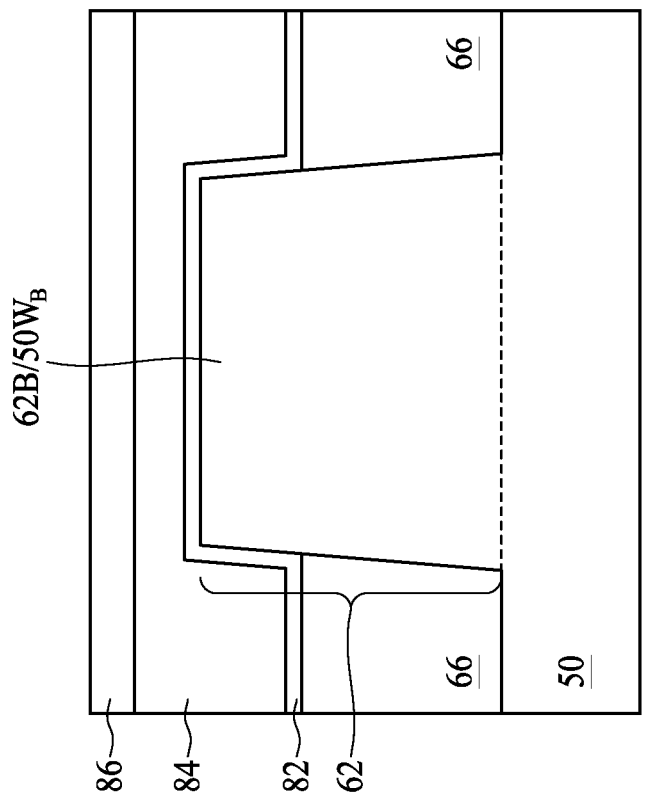
Figure 18B:
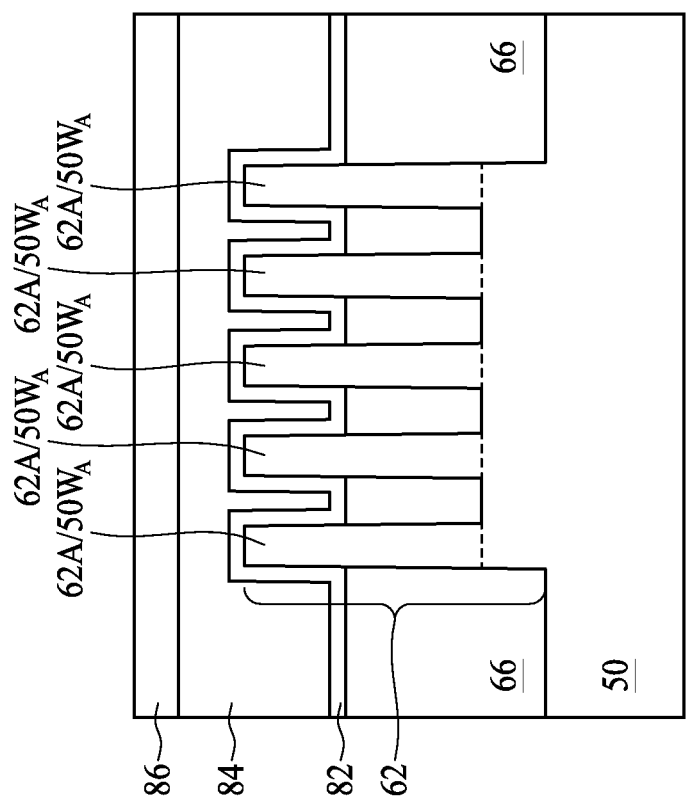
Figure 18D:
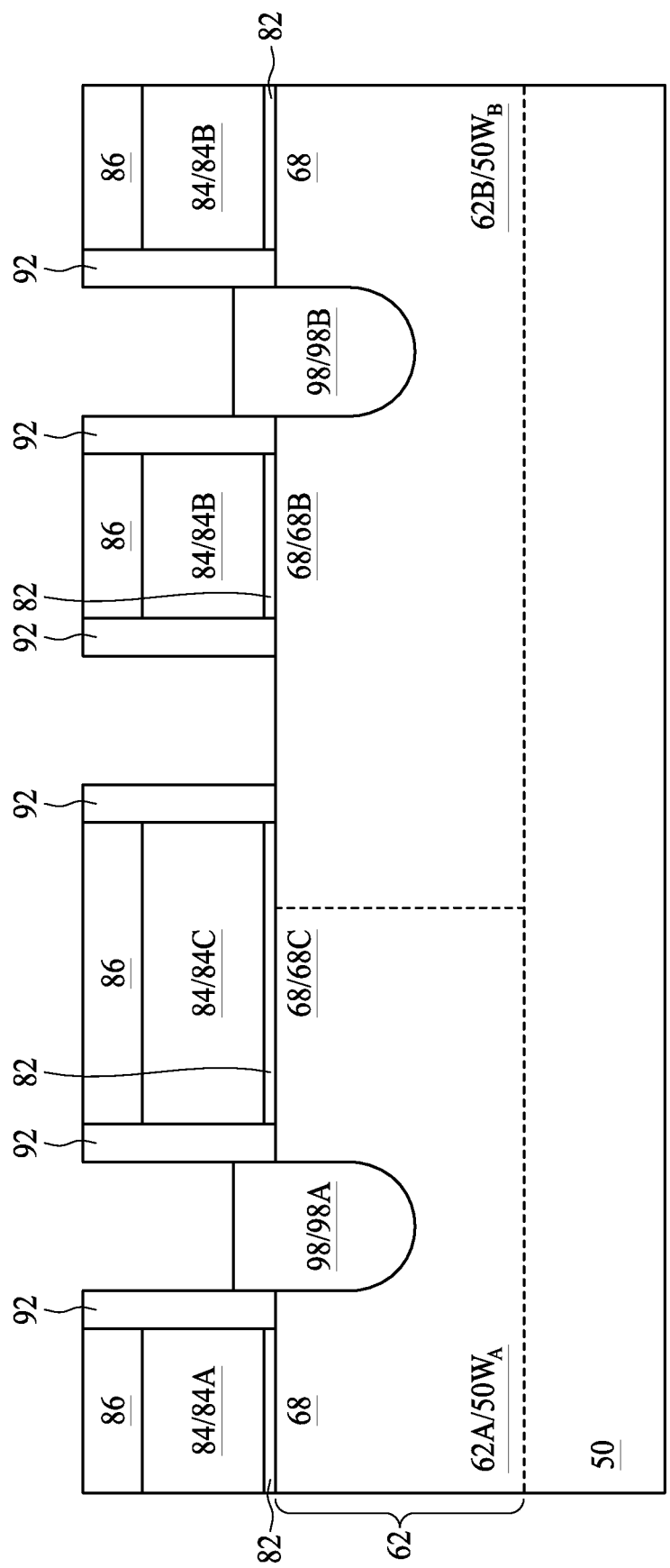
Figure 19A:
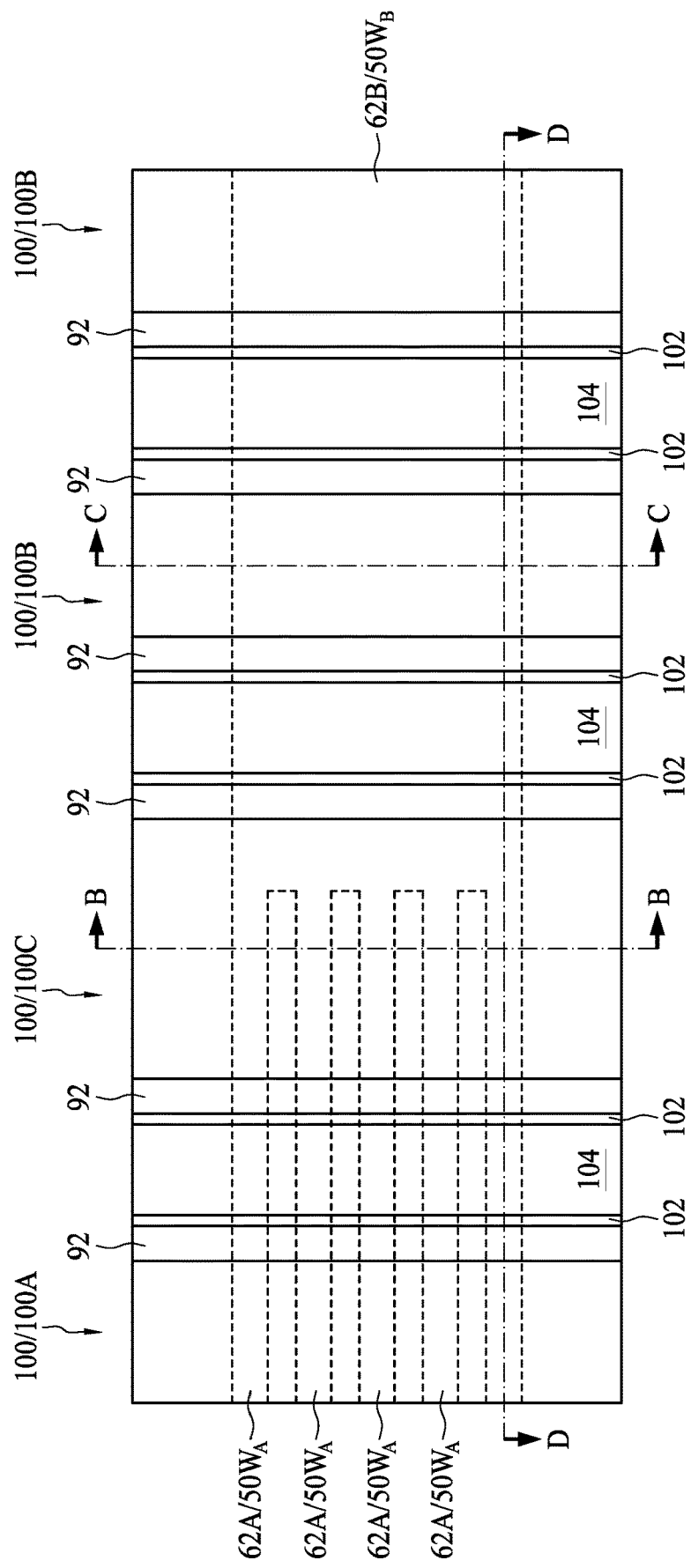
Figure 19C:
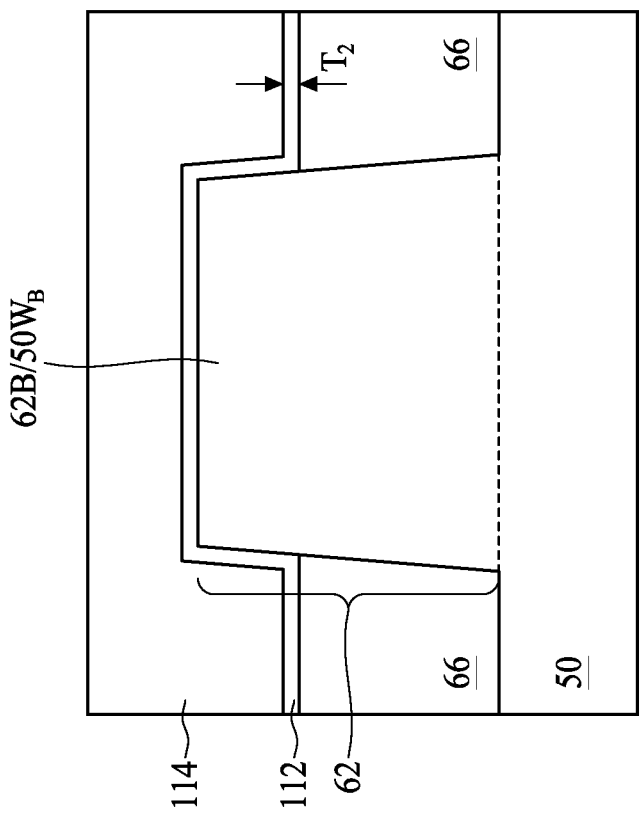
Figure 19B:
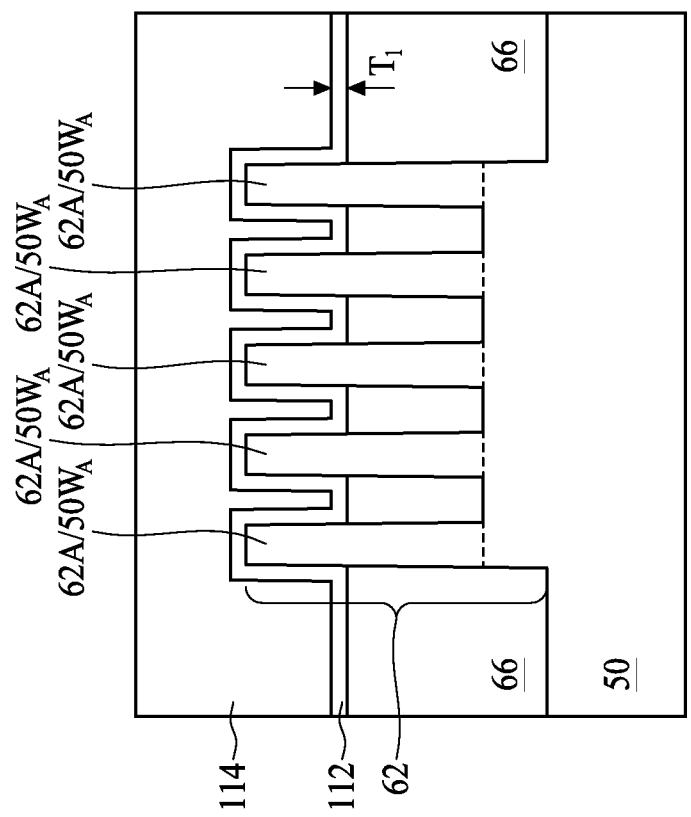
Figure 19D:
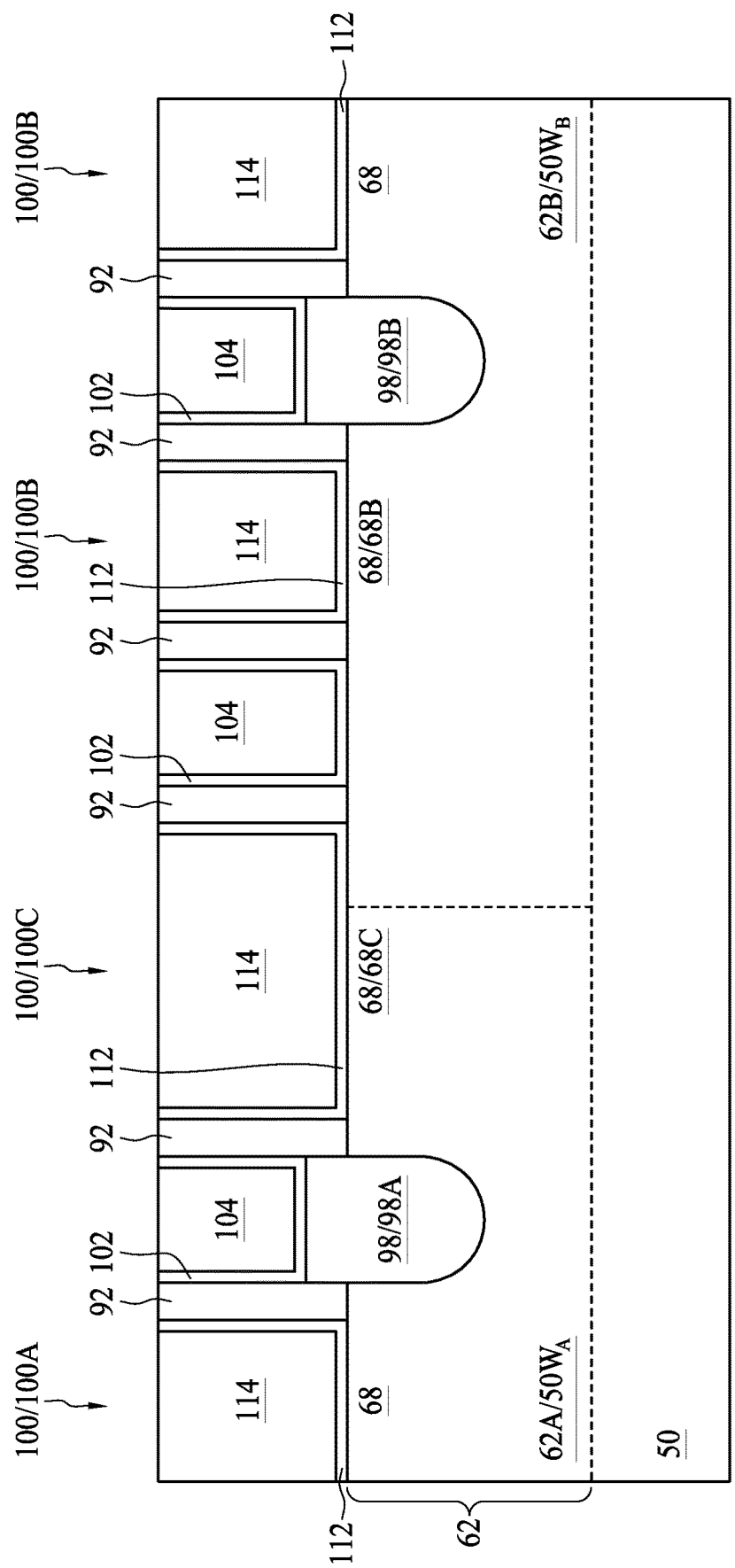
Figure 20A:
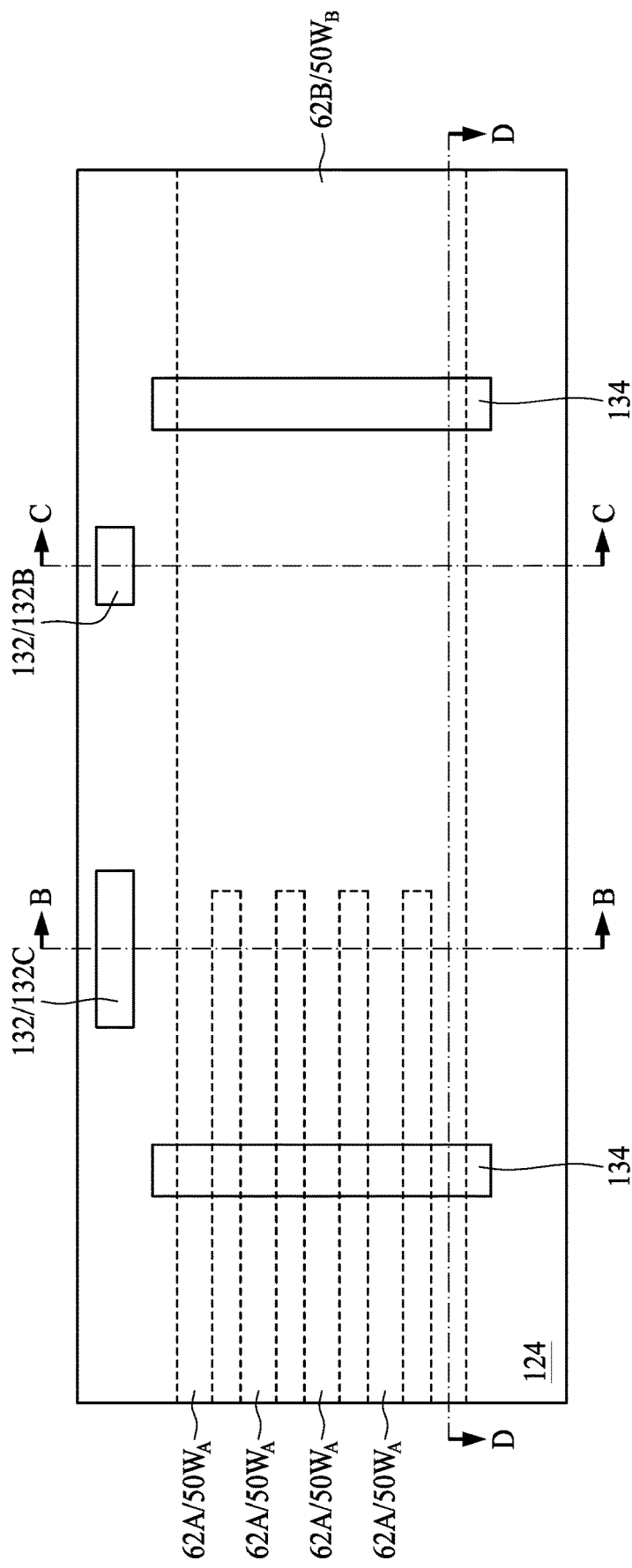
Figure 20C:
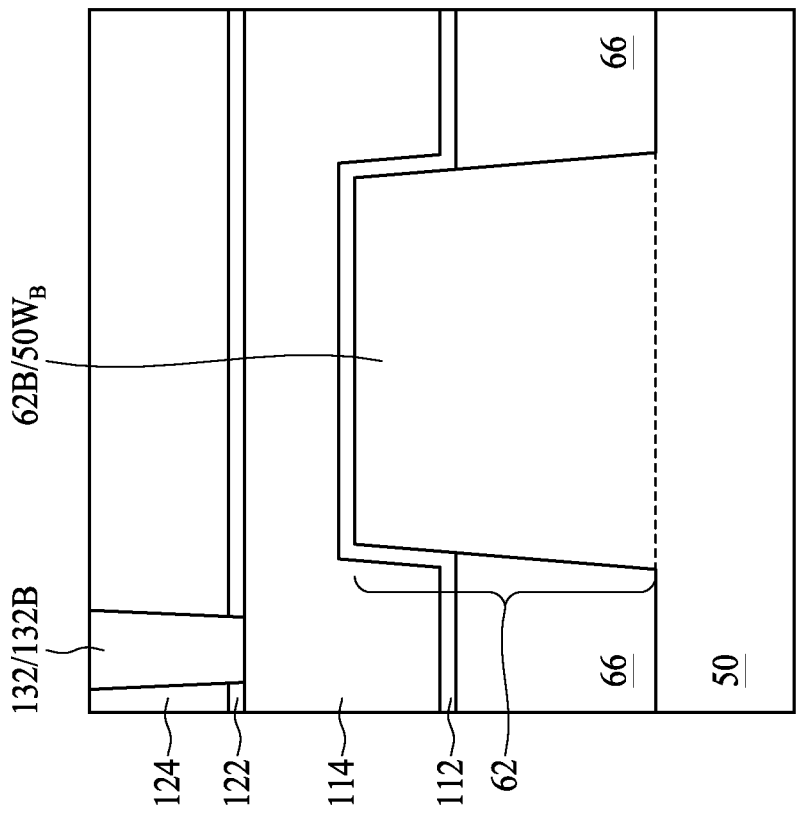
Figure 20B:
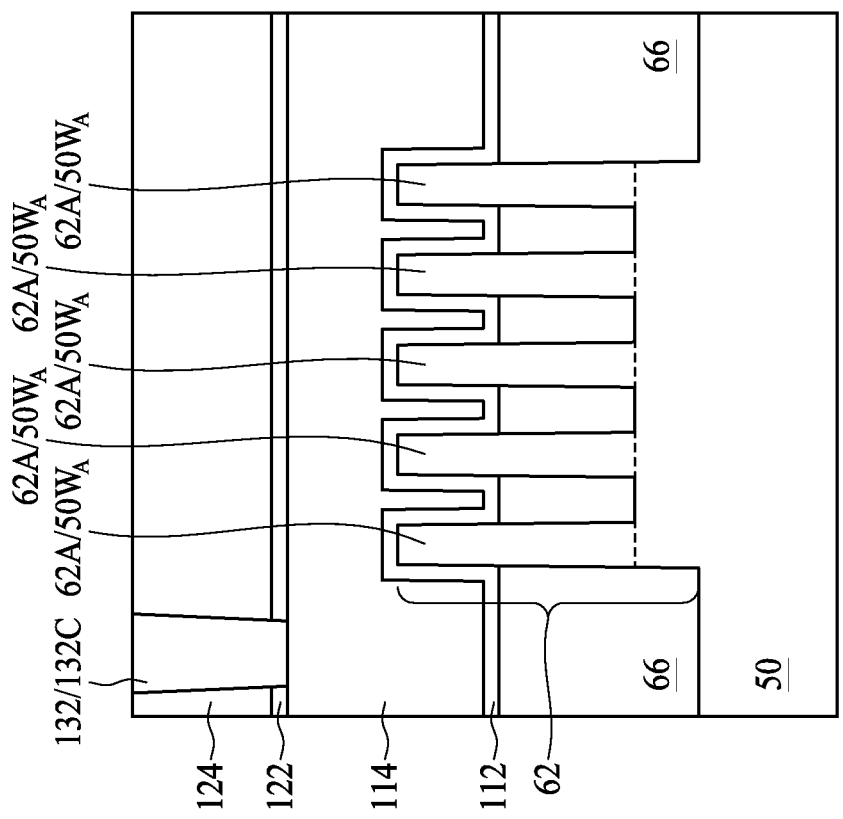
Figure 20D:
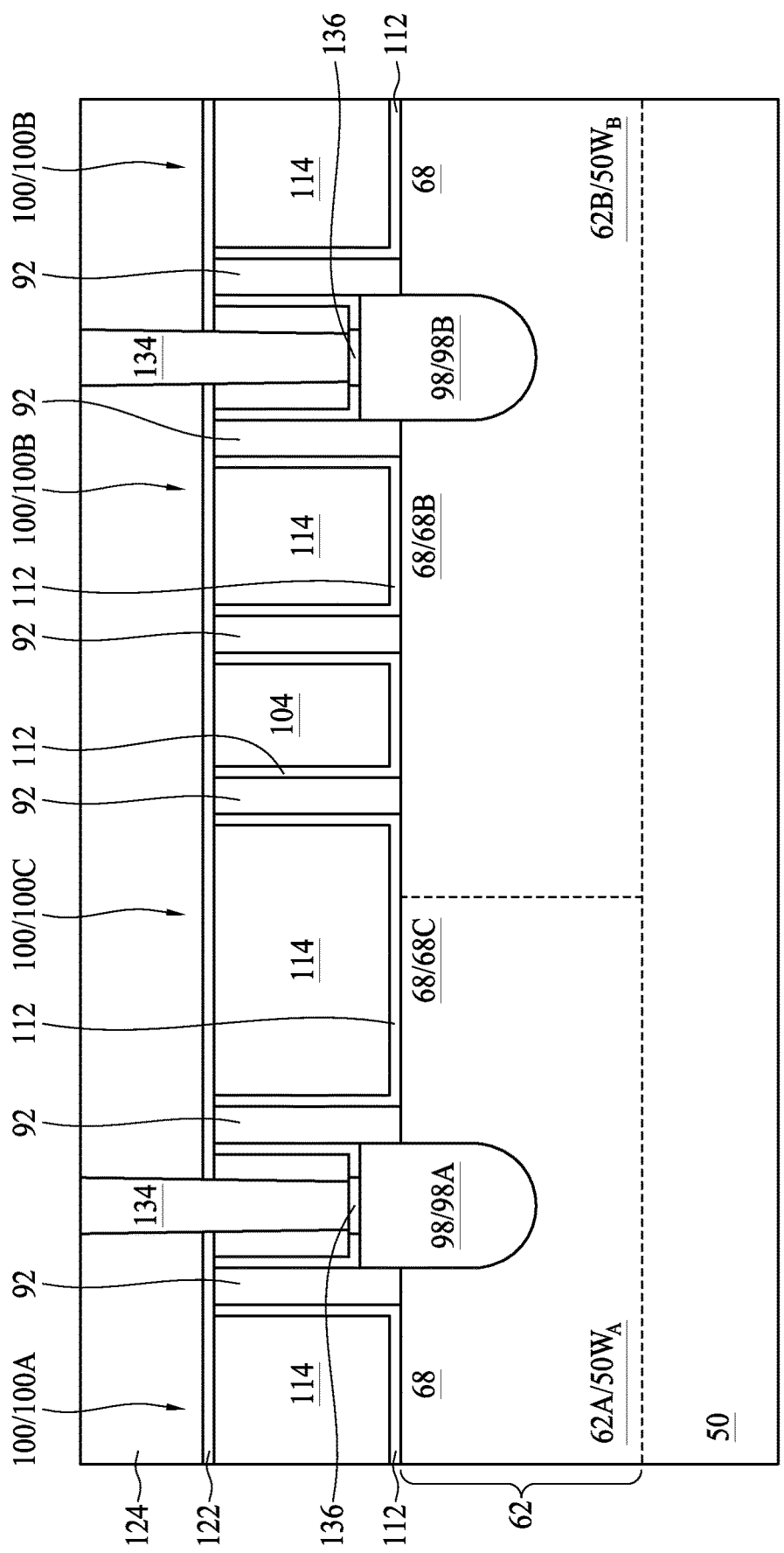

FIGS. 18A-20D are views of intermediate stages in the manufacturing of FinFETs, in accordance with some embodiments. FIGS. 18A, 19A, and 20A are top-down views. FIGS. 18B, 19B, and 20B are cross-sectional views illustrated along reference cross-section B-B in the corresponding "A" figure, which is similar to reference cross-section B/C-B/C in FIG. 1. FIGS. 18C, 19C, and 20C are cross-sectional views illustrated along reference cross-section C-C in the corresponding "A" figure, which is similar to reference cross-section B/C-B/C in FIG. 1. FIGS. 18D, 19D, and 20D are cross-sectional views illustrated along reference cross-section D-D in the corresponding "A" figure, which is similar to reference cross-section D-D in FIG. 1. In this embodiment, the FinFETs are devices for high-power applications, such as double-diffused metal-oxide semiconductor (DMOS) devices or laterally-diffused metal-oxide semiconductor (LDMOS) devices, in which each FinFET can have multiple gate structures. The FinFETs of FIGS. 18A-20D may be formed on a same substrate 50 as the FinFETs of FIGS. 2A-15D, or may be formed on a different substrate 50.

FIGS. 18A-18D show the FinFETs at a similar intermediate stage of manufacturing as FIGS. 9A-9D, e.g., after the dummy gates 84 and the source/drain regions 98 are formed. In this embodiment, the FinFETs are not formed in separate n-type and p-type regions of the substrate 50. Rather, wells having majority carriers of different conductivity types (e.g., p-type wells and n-type wells) can be formed in a same fin structure 62. Specifically, wells $50W_A$ with majority carriers of a first conductivity type are formed in the fins 62A, and wells $50W_B$ with majority carriers of an opposing second conductivity type are formed in the fins 62B. Such wells can be formed with masking and implanting steps, in a similar manner as the wells previously described.

Further, source/drain regions are not formed between all of the dummy gates 84. Specifically, source/drain regions are not formed between the dummy gates 84C and the dummy gates 84B. Thus, each pair of a source/drain region 98A and a source/drain region 98B is separated by a dummy gate 84C and a dummy gate 84B. The gate spacers 92 in the regions where source/drain regions are omitted are separated by a distance $D_4$, and the gate spacers 92 in the regions where source/drain regions are formed are separated by a distance $D_5$, with the distance $D_5$ being different from the distance $D_4$. The distance $D_4$ and the distance $D_5$ can each be in the range of about 118 nm to about 200 nm.

As noted above, the source/drain regions 98 can be epitaxially grown structures that are in situ doped during growth, or can be regions of the fins 62A, 62B that are implanted with dopants to form the source/drain regions 98. In some embodiments, the source/drain regions 98 are non-epitaxial structures, e.g., regions of the fins 62A, 62B that are implanted with dopants, which may have a lower concentration of carriers, making them more suitable for high-power applications. In such embodiments, the source/drain regions 98 are doped regions of the fin structures 62 having planar upper surfaces.

FIGS. 19A-19D show the FinFETs at a similar intermediate stage of manufacturing as FIGS. 13A-13D, e.g., after the dummy gates 84 are replaced with the gate structures 100. In this embodiment, a subset of FinFETs each include multiple gate structures 100 (e.g., a gate structure 100C and a gate structure 100B), a source/drain region 98A, and a source/drain region 98B. Inclusion of the gate structures 100B with the FinFETs can improve the gate control capability of the FinFETs, making them more suitable for high-power applications. No source/drain regions are formed between the gate structure 100C and the gate structure 100B of such FinFETs. Multiple gate structures 100 can be used for FinFETs that operate in a very high voltage range (e.g., greater than about 12 volts).

The gate dielectrics 112 of the gate structures 100C and the gate structures 100B can be formed to thicknesses that are determined based on the desired operating voltage and gate control capability of the FinFETs. In some embodiments, the gate dielectrics 112 of the gate structures 100C have a first thickness $T_1$ and the gate dielectrics 112 of the gate structures 100B have a second thickness $T_2$, with the second thickness $T_2$ being different from the first thickness $T_1$. The first thickness $T_1$ and the second thickness $T_2$ can each be in the range of about 38 Å to about 70 Å.

The channel regions 68 can have first portions 68B beneath the gate structures 100B and have second portions 68C beneath the gate structures 100C. The first portions 68B of the channel regions 68 and the second portions 68C of the channel regions 68 can have different lengths. Specifically, the second portions 68C of the channel regions 68 can be longer than the first portions 68B of the channel regions 68. For example, the second portions 68C of the channel regions 68 can have a length in the range of about 500 nm to about 6000 nm, and the first portions 68B of the channel regions 68 can have a length in the range of about 86 nm to about 1000 nm. When the FinFETs of FIGS. 18A-20D are formed on a same substrate 50 as the FinFETs of FIGS. 2A-15D, the gate structures 100 of the FinFETs for high-power applications have a greater width than the gate structures 100 of the FinFETs for low-power applications.

FIGS. 20A-20D show the FinFETs at a similar intermediate stage of manufacturing as FIGS. 15A-15D. In this embodiment, different gate contacts 132 are formed to the gate structures 100 of each FinFET. For example, a first subset of the gate contacts 132C are formed to the gate structures 100C, and a second subset of the gate contacts 132B are formed to the gate structures 100B. The gate structures 100 of each FinFET may thus be independently controlled.

In some embodiments, the FinFETs are LDMOS devices, in which the source/drain regions 98A (e.g., the source regions), the source/drain regions 98B (e.g., the drain regions), and the wells $50W_B$ have majority carriers of a first conductivity type, and the wells $50W_A$ have majority carriers of a second conductivity type that is different from the first conductivity type. When the FinFETs are n-type LDMOS devices, the source/drain regions 98A (e.g., the source regions), the source/drain regions 98B (e.g., the drain regions), and the wells $50W_B$ are each n-type regions, and the wells $50W_A$ are p-type regions. An n-type LDMOS device may be operated by coupling the gate contact 132C of the device to a high voltage and coupling the gate contact 132B of the device to an opposing low voltage. When the FinFETs are p-type LDMOS devices, the source/drain regions 98A (e.g., the source regions), the source/drain regions 98B (e.g., the drain regions), and the wells $50W_B$ are each p-type regions, and the wells $50W_A$ are n-type regions. A p-type LDMOS device may be operated by coupling the gate contact 132C of the device to a low voltage and coupling the gate contact 132B of the device to an opposing high voltage. As noted above, because the source/drain regions 98B (e.g., the drain regions) and the portions of the channel regions 68 in the fins 62B are larger, they can withstand greater voltages than their smaller counterparts (e.g., the source/drain regions 98A and the portions of the channel regions 68 in the fins 62A), making them more suitable for high-power applications. In some embodiments, the high and low voltages can be +/−5 volts (for a total voltage difference of 10 volts) or can even be +/−8 volts (for a total voltage difference of 16 volts).

Figure 21:
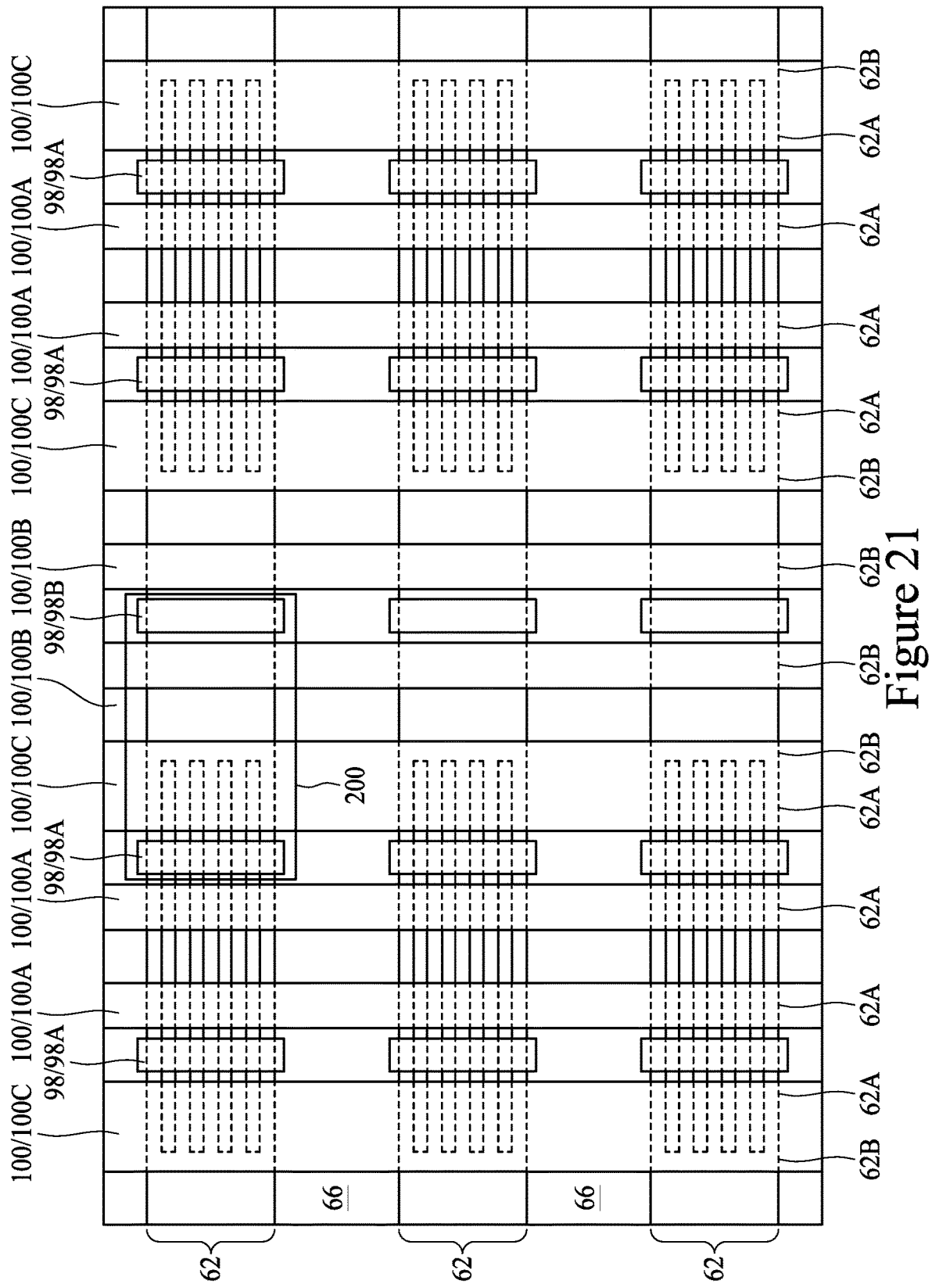
FIG. 21 is a view of FinFETs, in accordance with some embodiments.

FIG. 21 is a view of FinFETs, in accordance with some embodiments. Some features of the FinFETs are omitted for illustration clarity. FIG. 21 is a top-down view of the devices of FIGS. 20A-20D, more clearly showing how the FinFETs 200 can have multiple gate structures 100 (e.g., a gate structure 100C and a gate structure 100B). The FinFETs 200 are symmetric along the lengths of the fin structures 62. In this embodiment, the FinFETs 200 have a single gate structure 100C and a single gate structure 100B. In another embodiment, the FinFETs can have another quantity of the gate structures 100B. For example, the FinFETs can have a single gate structure 100C and multiple gate structures 100B, such as two gate structures 100B, three gate structures 100B, or the like. The quantity of gate structures 100B can be determined based on the desired operating voltage and gate control capability of the FinFETs.

Embodiments may achieve advantages. As previously noted, in some types of devices, such as devices operating in a medium voltage range or a high voltage range, the drain terminals are operated at a greater voltage than the source terminals, which can cause hot carrier injection (HCI) at the drain regions to be worse than at the source regions, degrading the performance of such devices. The FinFETs include multiple fins 62A and a fin 62B, with the fins 62A being joined to the fin 62B, and with the fin 62B being wider than the fins 62A. Because the source/drain regions 98B and the portions of the channel regions 68 in the fins 62B are larger, they can withstand greater voltages than their smaller counterparts (e.g., the source/drain regions 98A and the portions of the channel regions 68 in the fins 62A), thereby reducing hot carrier injection at the drain regions. The on/off current (e.g., $I_{ON}/I_{OFF}$) of the devices may thus be improved. The resulting FinFETs may thus be more suitable for high-power applications, such as appliances, vehicles, and the like.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Further, the FinFET/NSFET devices may be interconnected by metallization layers in an overlying interconnect structure. The overlying interconnect structure can be formed in a back end of line (BEOL) process. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process so that the resulting die includes both logic devices and memory devices over a same semiconductor substrate.

In an embodiment, a device includes: an isolation region on a substrate; a fin structure protruding from between adjacent portions of the isolation region, the fin structure including a plurality of fins and a mesa, a channel region of the fin structure having a first portion in the fins and having a second portion in the mesa, the fins and the mesa being a continuous semiconductor material, the mesa having a greater width than the fins; and a first gate structure on the fin structure, the first gate structure extending along the first portion of the channel region in the fins and extending along the second portion of the channel region in the mesa. In some embodiments, the device further includes: a first well in the fins; a first source/drain region in the first well, the first source/drain region adjoining the first portion of the channel region in the fins; a second well in the mesa, the first well and the second well having majority carriers of a first conductivity type; and a second source/drain region in the second well, the second source/drain region adjoining the second portion of the channel region in the mesa, the first source/drain region and the second source/drain region having majority carriers of a second conductivity type, the second conductivity type opposite the first conductivity type. In some embodiments of the device, the channel region of the fin structure has a third portion in the mesa, the device further including: a second gate structure on the fin structure, the second gate structure extending along the third portion of the channel region in the mesa. In some embodiments, the device further includes: a first well in the fins, the first well having majority carriers of a first conductivity type; a first source/drain region in the first well, the first source/drain region adjoining the first portion of the channel region in the fins; a second well in the mesa; and a second source/drain region in the second well, the second source/drain region adjoining the third portion of the channel region in the mesa, the first source/drain region, the second source/drain region, and the second well having majority carriers of a second conductivity type, the second conductivity type opposite the first conductivity type. In some embodiments of the device, the isolation region has first portions between the fins and has second portions around the mesa, the first portions having a first depth, the second portions having a second depth, the second depth greater than the first depth. In some embodiments of the device, the difference between the first depth and the second depth is in a range of 25 nm to 40 nm. In some embodiments of the device, the first gate structure extends along sidewalls of the fins and extends along sidewalls of the mesa. In some embodiments of the device, the first gate structure extends along sidewalls of the fins and does not extend along sidewalls of the mesa.

In an embodiment, a device includes: a fin structure extending from a substrate, the fin structure including a continuous semiconductor material including a plurality of fins and a mesa, the fins joined to the mesa; and a transistor including: a source region in the fins; a drain region in the mesa; and a first gate structure between the drain region and the source region, the first gate structure extending along a region of the fin structure where the fins are joined to the mesa. In some embodiments of the device, the source region and the drain region are doped regions of the fin structure having planar upper surfaces. In some embodiments of the device, the source region and the drain region are epitaxial regions in the fin structure having faceted upper surfaces. In some embodiments of the device, the transistor is a complementary metal-oxide-semiconductor (CMOS) device. In some embodiments of the device, the transistor is a double-diffused metal-oxide semiconductor (DMOS) device or a laterally-diffused metal-oxide semiconductor (LDMOS) device.

In an embodiment, a method includes: patterning a semiconductor substrate to form a fin structure extending from the semiconductor substrate, the fin structure including fin portions and a mesa portion, the fin portions and the mesa portion each extending in a first direction in a top-down view; forming a source region and a drain region in the fin structure, the source region disposed in the fin portions of the fin structure, the drain region disposed in the mesa portion of the fin structure; and forming a first gate structure between the source region and the drain region, the first gate structure disposed on a region of the fin structure where the fin portions are joined to the mesa portion, the first gate structure extending in a second direction in the top-down view, the second direction perpendicular to the first direction. In some embodiments, the method further includes: forming a second gate structure between the first gate structure and the drain region, the second gate structure disposed on a region of the fin structure in the mesa portion, the second gate structure extending in the second direction in the top-down view. In some embodiments of the method, patterning the semiconductor substrate includes: forming a first mask on the semiconductor substrate, first features of the first mask having a first width; forming a second mask on the semiconductor substrate, second features of the second mask having a second width, the second width greater than the first width, portions of the first mask and the second mask overlapping; and etching the semiconductor substrate using the first mask and the second mask as a combined etching mask to form the fin structure. In some embodiments of the method, the first features of the first mask are spacers and the second features of the second mask are a photoresist. In some embodiments of the method, patterning the semiconductor substrate includes: patterning the semiconductor substrate using extreme ultraviolet (EUV) lithography. In some embodiments, the method further includes: forming an isolation region around the fin structure, the isolation region having first portions around the fin portions of the fin structure and having second portions around the mesa portion of the fin structure, the first portions having a first depth, the second portions having a second depth, the second depth greater than the first depth. In some embodiments of the method, the difference between the first depth and the second depth is in a range of 25 nm to 40 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   patterning a semiconductor substrate to form a fin structure extending from the semiconductor substrate, the fin structure comprising fin portions and a mesa portion, the fin portions and the mesa portion each extending in a first direction in a top-down view;
   forming an isolation region around the fin structure, the isolation region having first portions around the fin portions of the fin structure and having second portions around the mesa portion of the fin structure, the first portions having a first depth, the second portions having a second depth, the second depth greater than the first depth;
   forming a source region and a drain region in the fin structure, the source region disposed in the fin portions of the fin structure, the drain region disposed in the mesa portion of the fin structure; and
   forming a first gate structure between the source region and the drain region, the first gate structure disposed on a region of the fin structure where the fin portions are joined to the mesa portion, the first gate structure extending in a second direction in the top-down view, the second direction perpendicular to the first direction.

2. The method of claim 1 further comprising:
   forming a second gate structure between the first gate structure and the drain region, the second gate structure disposed on a region of the fin structure in the mesa portion, the second gate structure extending in the second direction in the top-down view.

3. The method of claim 1, wherein patterning the semiconductor substrate comprises:
   forming a first mask on the semiconductor substrate, first features of the first mask having a first width;
   forming a second mask on the semiconductor substrate, second features of the second mask having a second width, the second width greater than the first width, portions of the first mask and the second mask overlapping; and
   etching the semiconductor substrate using the first mask and the second mask as a combined etching mask to form the fin structure.

4. The method of claim 3, wherein the first features of the first mask are spacers and the second features of the second mask are a photoresist.

5. The method of claim 1, wherein patterning the semiconductor substrate comprises:
   patterning the semiconductor substrate using extreme ultraviolet (EUV) lithography.

6. The method of claim 1, wherein the difference between the first depth and the second depth is in a range of 25 nm to 40 nm.

7. A method comprising:
   forming a fin structure extending from a semiconductor substrate, the fin structure comprising a plurality of fins and a mesa, a channel region of the fin structure having a first portion in the fins and having a second portion in the mesa, the fins and the mesa formed of a continuous semiconductor material, the mesa having a greater width than each of the fins;
   forming an isolation region having first portions between the fins and having second portions around the mesa, the first portions of the isolation region having a first depth, the second portions of the isolation region having a second depth, the second depth greater than the first depth; and forming a gate structure on the fin structure, the gate structure extending along the first portion of the channel region in the fins and extending along the second portion of the channel region in the mesa.

8. The method of claim 7 further comprising:

forming a first well and a second well in the fins and the mesa, respectively, the first well and the second well having majority carriers of a first conductivity type, the gate structure disposed between the first well and the second well; and growing a first source/drain region and a second source/drain region in the first well and the second well, respectively, the first source/drain region and the second source/drain region having majority carriers of a second conductivity type, the second conductivity type opposite the first conductivity type.

9. The method of claim 7 further comprising:

forming a first well and a second well in the fins and the mesa, respectively, the first well having majority carriers of a first conductivity type, the second well having majority carriers of a second conductivity type, the second conductivity type opposite the first conductivity type, the gate structure disposed between the first well and the second well; and growing a first source/drain region and a second source/drain region in the first well and the second well, respectively, the first source/drain region and the second source/drain region having majority carriers of the second conductivity type.

10. The method of claim 7, wherein the difference between the first depth and the second depth is in a range of 25 nm to 40 nm.

11. The method of claim 7, wherein the fins protrude above the isolation region, the mesa protruding above the isolation region.

12. The method of claim 7, wherein the fins protrude above the isolation region, a top surface of the mesa being coplanar with a top surface of the isolation region.

13. The method of claim 7 further comprising:

growing a first epitaxial source/drain region and a second epitaxial source/drain region in the fins and the mesa, respectively, the gate structure disposed between the first epitaxial source/drain region and the second epitaxial source/drain region.

14. The method of claim 7 further comprising:

implanting dopants in the fin structure to form a first source/drain region and a second source/drain region in the fins and the mesa, respectively, the gate structure disposed between the first source/drain region and the second source/drain region.

15. The method of claim 7, wherein the gate structure overlaps the first portion of the channel region by a first distance, the gate structure overlaps the second portion of the channel region by a second distance, and the first distance is greater than the second distance.

16. The method of claim 1, wherein the first gate structure overlaps the fin portions by a first distance, the first gate structure overlaps the mesa portion by a second distance, and the first distance is greater than the second distance.

17. A method comprising:

patterning a semiconductor substrate to form a fin structure extending from the semiconductor substrate, the fin structure comprising fins and a mesa, a channel region of the fin structure having a first portion in the fins and having a second portion in the mesa;

forming a first source/drain region and a second source/drain region in the fin structure, the first source/drain region adjoining the first portion of the channel region, the second source/drain region adjoining the second portion of the channel region; and forming a gate structure on the channel region of the fin structure, the gate structure overlapping the first portion of the channel region by a first distance, the gate structure overlapping the second portion of the channel region by a second distance, the first distance greater than the second distance.

18. The method of claim 17, wherein the gate structure extends along sidewalls of the fins and extends along sidewalls of the mesa.

19. The method of claim 17, wherein the gate structure extends along sidewalls of the fins and does not extend along sidewalls of the mesa.

20. The method of claim 17 further comprising:

forming an isolation region around the fin structure, the isolation region having a first portion around the fins and having a second portion around the mesa, the second portion deeper than the first portion.

* * * * *